US008207010B2

(12) United States Patent
Yamazaki et al.

(10) Patent No.: US 8,207,010 B2
(45) Date of Patent: Jun. 26, 2012

(54) METHOD FOR MANUFACTURING PHOTOELECTRIC CONVERSION DEVICE

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/153,721

(22) Filed: May 23, 2008

(65) Prior Publication Data
US 2009/0047752 A1     Feb. 19, 2009

(30) Foreign Application Priority Data

Jun. 5, 2007   (JP) .................. 2007-149795
Jun. 15, 2007  (JP) .................. 2007-159570

(51) Int. Cl.
H01L 21/00     (2006.01)

(52) U.S. Cl. ............. 438/96; 438/48; 438/54; 438/57; 438/65; 438/69; 438/70; 343/770; 343/771; 257/233; 257/292; 257/431; 257/465; 257/466; 257/E33.004; 257/E31.058; 257/E31.063; 257/E31.132; 257/E31.133

(58) Field of Classification Search .......... 438/96, 438/48, 54, 65, 69, 70; 257/233, 292, 431–466, 257/E31.047, E31.058, E31.063, E31.115, 257/E25.032, E27.133–E27.139; 343/770, 343/771; 118/504, 719, 720, 723; 427/255.5
See application file for complete search history.

(56) References Cited

U.S. PATENT DOCUMENTS

| 4,409,134 | A |   | 10/1983 | Yamazaki |          |
|-----------|---|---|---------|----------|----------|
| 4,505,950 | A | * | 3/1985  | Yamazaki | 438/485  |
| 4,760,008 | A | * | 7/1988  | Yamazaki et al. | 430/127 |
| 4,808,258 | A | * | 2/1989  | Otsubo et al. | 438/710 |
| 4,988,642 | A | * | 1/1991  | Yamazaki | 438/61   |
| 5,453,858 | A |   | 9/1995  | Yamazaki |          |

(Continued)

FOREIGN PATENT DOCUMENTS

EP      1505174      2/2005

(Continued)

OTHER PUBLICATIONS

Wolf et al. "Silicon Processing for the VLSI Era, Lattice Press, p. 171, 2000".*

(Continued)

*Primary Examiner* — Charles Garber
*Assistant Examiner* — Yasser Abdelaziez
(74) *Attorney, Agent, or Firm* — Eric J. Robinson; Robinson Intellectual Property Law Office, P.C.

(57) ABSTRACT

It is an object to form a high-quality crystalline semiconductor layer directly over a large-sized substrate with high productivity without reducing the deposition rate and to provide a photoelectric conversion device in which the crystalline semiconductor layer is used as a photoelectric conversion layer. A photoelectric conversion layer formed of a semi-amorphous semiconductor is formed over a substrate as follows: a reaction gas is introduced into a treatment chamber where the substrate is placed; and a microwave is introduced into the treatment chamber through a slit provided for a waveguide that is disposed in approximately parallel to and opposed to the substrate, thereby generating plasma. By forming a photoelectric conversion layer using such a semi-amorphous semiconductor, a rate of deterioration in characteristics by light deterioration is decreased from one-fifth to one-tenth, and thus a photoelectric conversion device that has almost no problems for practical use can be obtained.

21 Claims, 25 Drawing Sheets

U.S. PATENT DOCUMENTS

| | | | |
|---|---|---|---|
| 5,514,879 A | 5/1996 | Yamazaki | |
| 5,614,732 A | 3/1997 | Yamazaki | |
| 5,701,167 A | 12/1997 | Yamazaki | |
| 5,849,601 A | 12/1998 | Yamazaki | |
| 5,859,445 A | 1/1999 | Yamazaki | |
| 5,932,302 A | 8/1999 | Yamazaki et al. | |
| 6,011,277 A | 1/2000 | Yamazaki | |
| 6,023,075 A | 2/2000 | Yamazaki | |
| 6,171,674 B1 | 1/2001 | Yamazaki et al. | |
| 6,183,816 B1 | 2/2001 | Yamazaki et al. | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,387,737 B1 * | 5/2002 | Yamazaki et al. | 438/149 |
| 6,468,617 B1 | 10/2002 | Yamazaki et al. | |
| 6,737,676 B2 | 5/2004 | Yamazaki | |
| 6,835,523 B1 | 12/2004 | Yamazaki et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,510,893 B2 | 3/2009 | Yamazaki et al. | |
| 2005/0022864 A1 | 2/2005 | Fujioka et al. | |
| 2005/0089648 A1 | 4/2005 | Yamazaki et al. | |
| 2006/0238132 A1 * | 10/2006 | Kitamura et al. | 315/111.21 |
| 2007/0018165 A1 | 1/2007 | Yamazaki | |
| 2007/0026151 A1 * | 2/2007 | Higginson et al. | 427/255.5 |
| 2008/0213504 A1 * | 9/2008 | Ishikawa | 427/569 |

FOREIGN PATENT DOCUMENTS

| | | | |
|---|---|---|---|
| JP | 62-062073 | | 12/1987 |
| JP | 02-166727 A | | 6/1990 |
| JP | 02-053941 | | 11/1990 |
| JP | 04-242724 | | 8/1992 |
| JP | 11-103082 A | | 4/1999 |
| JP | 2000-277439 | | 10/2000 |
| JP | 2001-210594 A | | 8/2001 |
| JP | 2004-014958 | | 1/2004 |
| JP | 2004-265995 A | | 9/2004 |
| JP | 2005-049832 | | 2/2005 |
| JP | 2005-050905 | | 2/2005 |
| JP | 2005150612 | * | 6/2005 |
| JP | 2005-183620 A | | 7/2005 |
| JP | 2006-310794 A | | 11/2006 |
| JP | 2007-005705 | | 1/2007 |
| JP | 2007-048982 | | 2/2007 |

OTHER PUBLICATIONS

Arai.T et al., "41.2: Micro Silicon Technology for Active Matrix OLED Display", SID Digest 07: SID International Symposium Digest of Technical Papers, pp. 1370-1373.

* cited by examiner

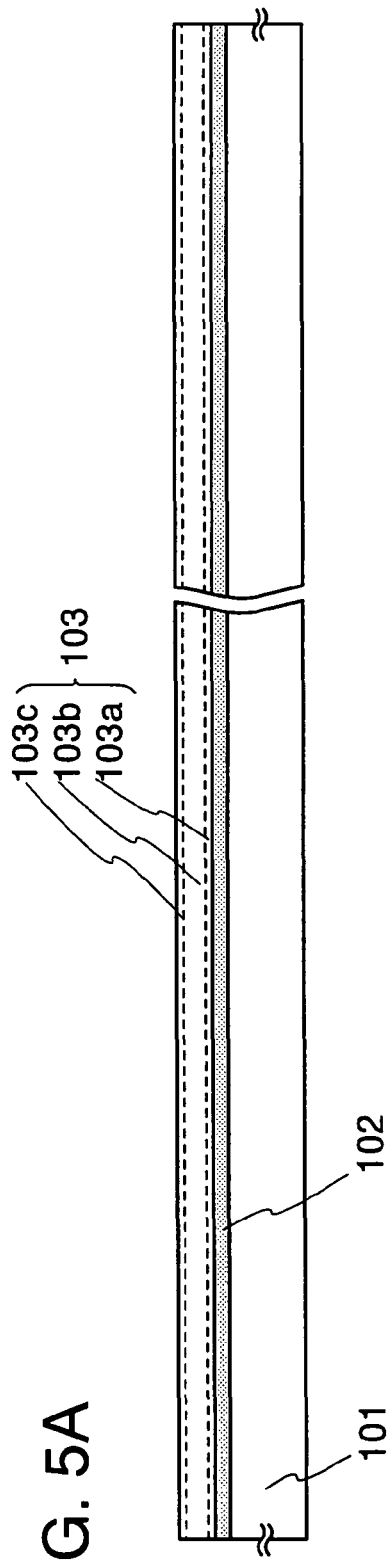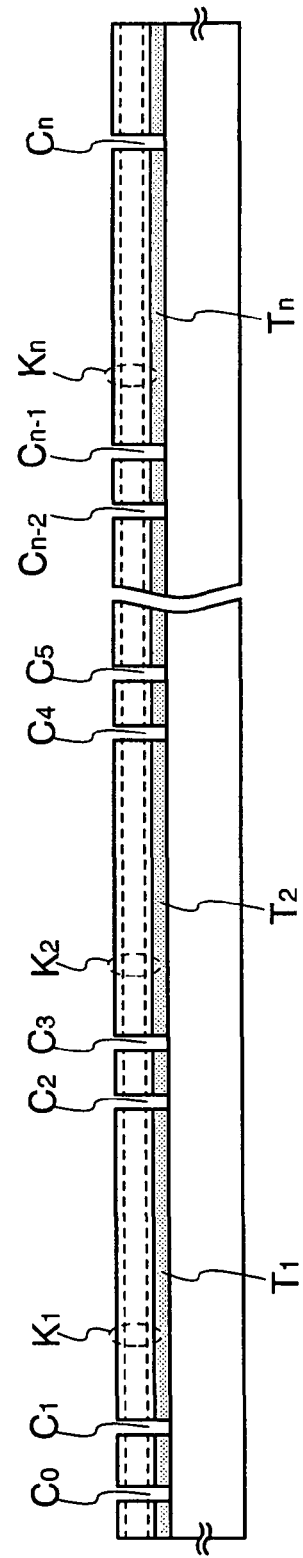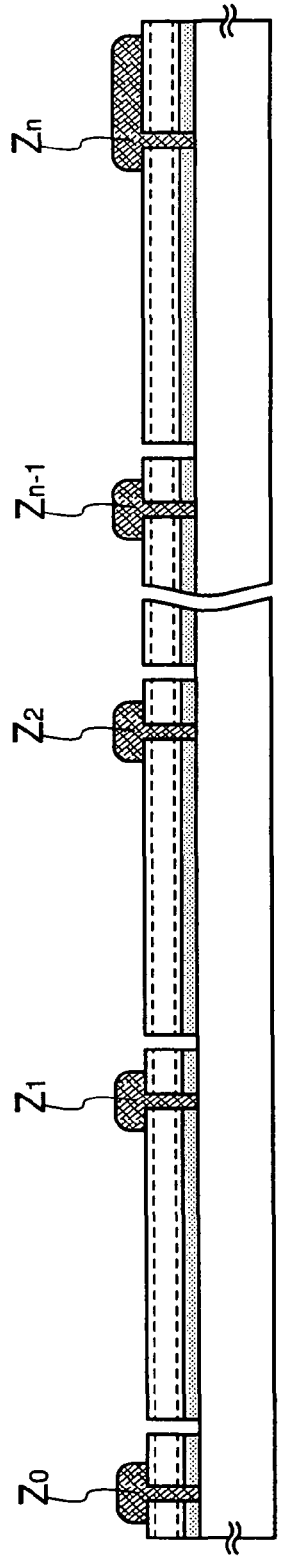

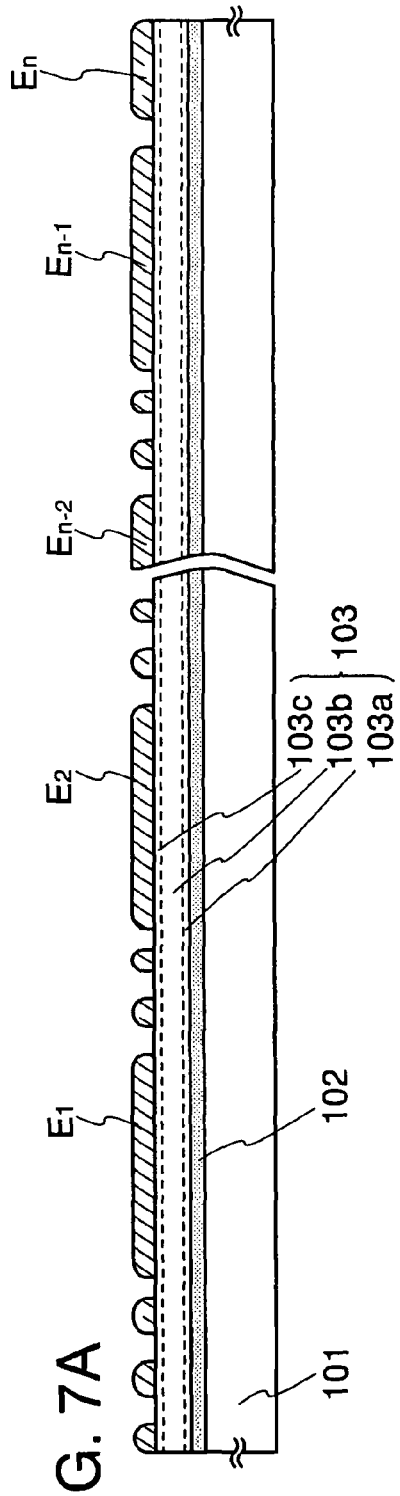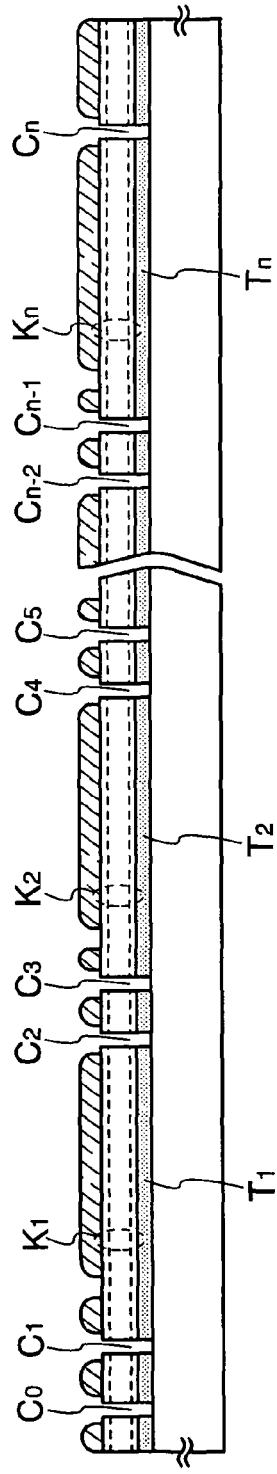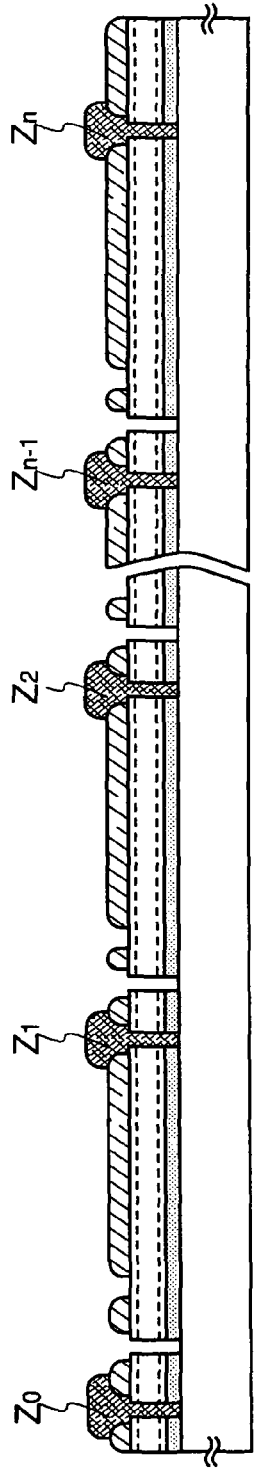

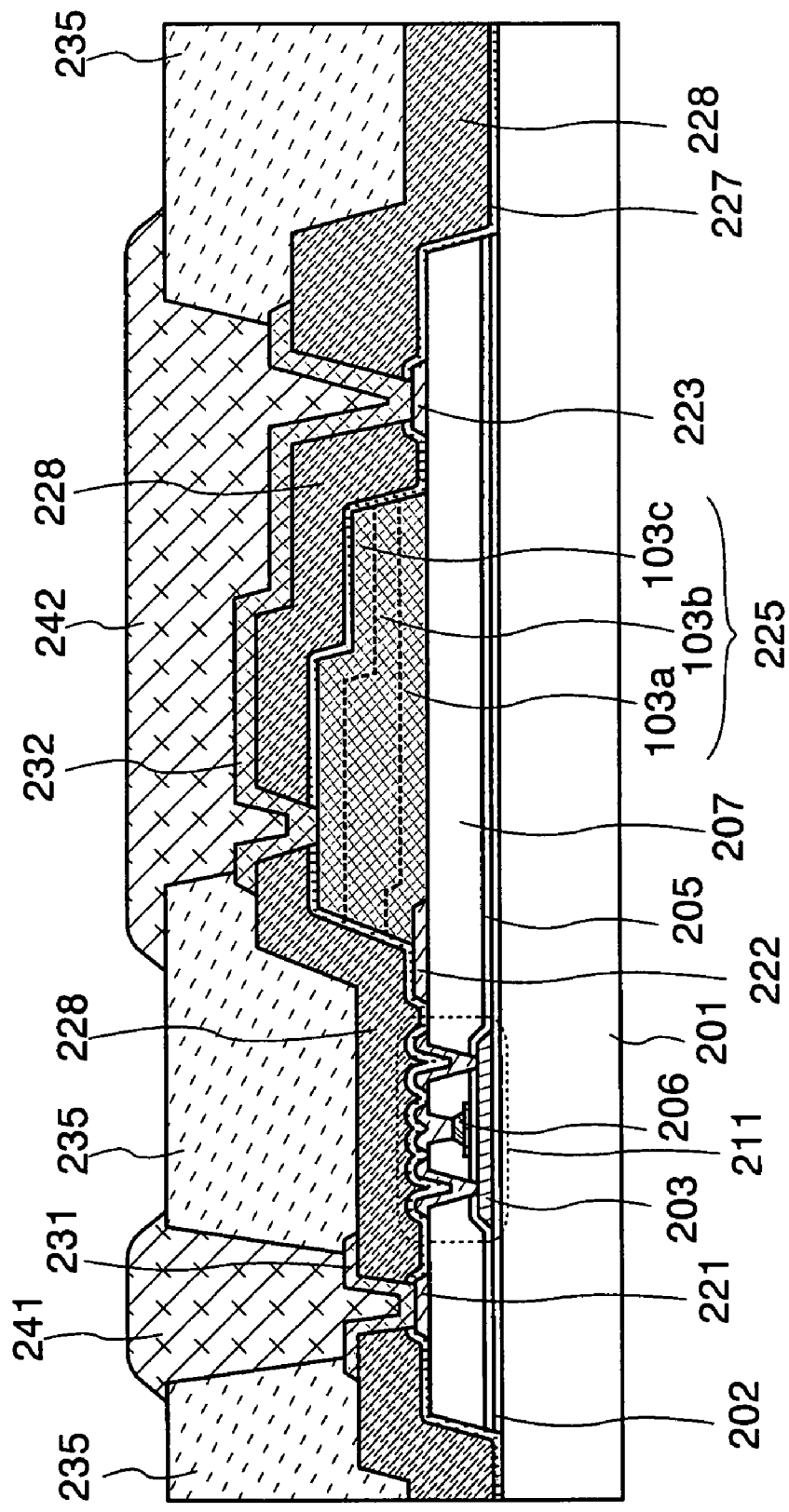

10  12  14  16  18  20

10  12  14  15  16  18  20

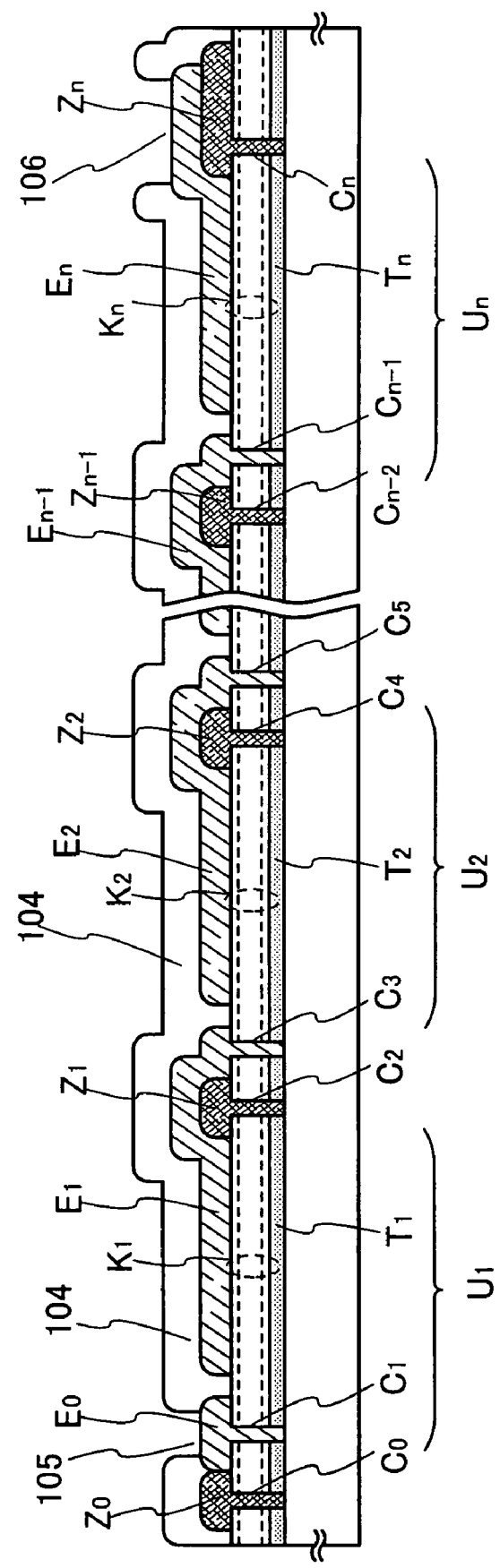

FIG. 22
Side View
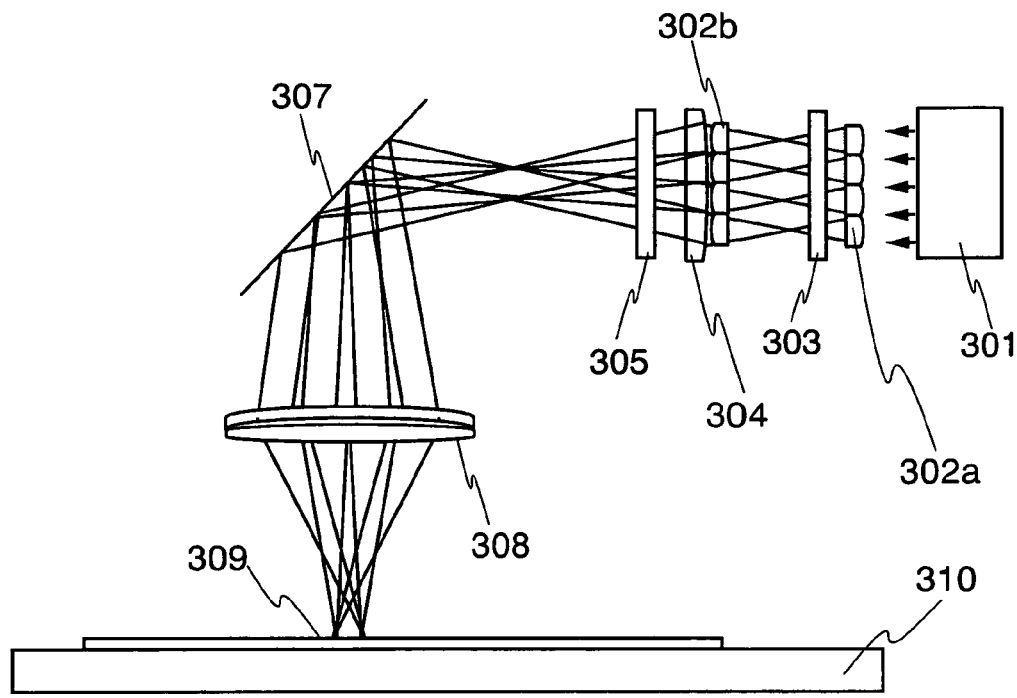
Top View
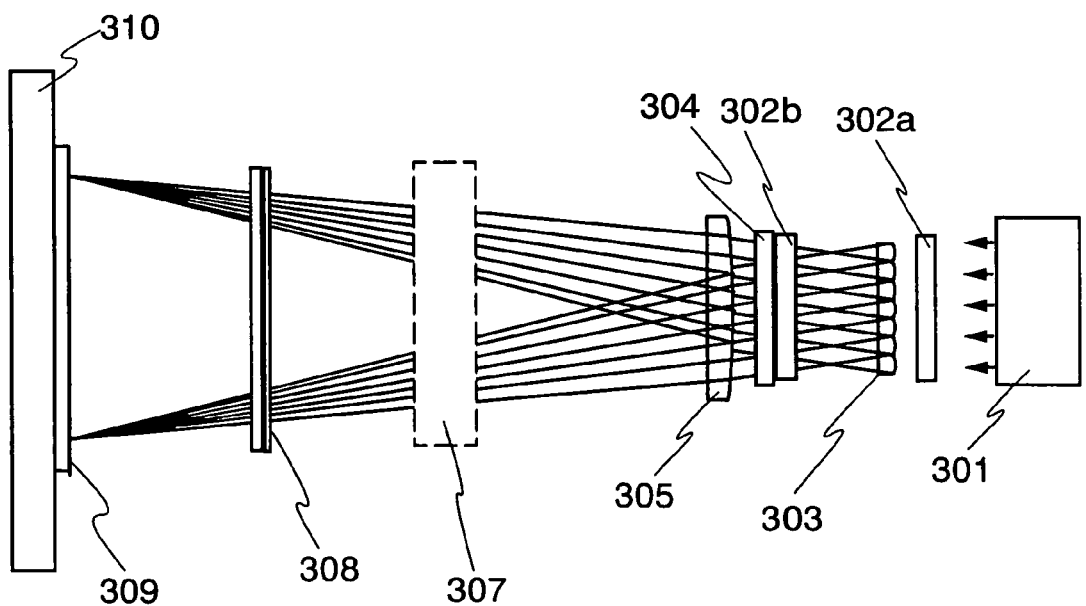

METHOD FOR MANUFACTURING PHOTOELECTRIC CONVERSION DEVICE

BACKGROUND OF THE INVENTION

1. Field of the Invention

The present invention relates to a method for manufacturing crystal-system silicon, and also relates to a photoelectric conversion device having a semiconductor junction using the crystal-system silicon and a method for manufacturing the photoelectric conversion device.

2. Description of the Related Art

In response to global environmental issues in recent years, the market for photoelectric conversion devices such as residential photovoltaic systems has expanded. As photoelectric conversion devices, devices using a high conversion efficiency single crystalline or polycrystalline silicon wafer have been used in practice. The photoelectric conversion devices using single crystalline or polycrystalline silicon are manufactured by being cut out of large silicon ingots. However, it takes a long time to manufacture large silicon ingots, which means productivity is low, and since supply of raw materials of silicon itself is limited, the supply of silicon ingots is insufficient and cannot respond to the expansion of the market.

Photoelectric conversion devices using amorphous silicon have been developed, and it has been considered that reduction of cost is possible therewith. However, light deterioration is not overcome, and thus the photoelectric conversion devices using amorphous silicon do not spread. By a high-frequency plasma CVD method that is a method for manufacturing amorphous silicon, an amorphous silicon film can be formed to have a large area at low temperature, and conversion efficiency of a photoelectric conversion device in which amorphous silicon is made to be a photoelectric conversion layer can be 10% or more. However, light deterioration called Staebler-Wronski effect can not be overcome. Therefore, development of photoelectric conversion devices has been proceeding, in which microcrystalline silicon as crystal-system silicon capable of being manufactured by a plasma CVD method is made to be a photoelectric conversion layer (for example, refer to Reference 1: Japanese Published Patent Application No. 2000-277439).

As a crystal-system silicon film formed by a plasma CVD method and a photoelectric conversion device using the crystal-system silicon film, a semi-amorphous semiconductor film and a photoelectric conversion device using the semi-amorphous semiconductor film are reported (for example, refer to References 2 and 3: Japanese Examined Patent Application Publication No. H2-53941 and Japanese Examined Patent Application Publication No. S62-62073). The semi-amorphous semiconductor has a semi-amorphous or semi-crystalline structure, which is different from an amorphous semiconductor or a crystalline semiconductor by the inventors of the present invention.

In order to form a photoelectric conversion layer using microcrystalline silicon, a thickness of the layer needs to be 1 μm or more, preferably, about 10 μm; however, the deposition rate of a microcrystalline silicon film by a high-frequency plasma CVD method is, for example, 0.1 nm/sec. or less, which is impractical. In other words, use of microcrystalline silicon for a photoelectric conversion layer causes problems in that productivity is low and cost competitiveness is lower than that of a photoelectric conversion device using another kind of crystal-system silicon.

SUMMARY OF THE INVENTION

In view of the foregoing problems, it is an object of the present invention to form a high-quality crystalline semiconductor layer directly over a large-sized substrate with high productivity without reducing the deposition rate, at 500° C. or lower. It is another object to provide a photoelectric conversion device in which the crystalline semiconductor layer is used as a photoelectric conversion layer.

An aspect of the present invention is that a reactive gas is introduced into a treatment chamber, a microwave is introduced in a parallel direction to a substrate to generate plasma, a semi-amorphous semiconductor film is formed over the substrate, and the semi-amorphous semiconductor film is used for at least one layer included in photoelectric conversion layers. The microwave is introduced in an approximately parallel direction to the substrate over which the semi-amorphous semiconductor film is deposited, and the microwave is introduced into the treatment chamber through a fine slit provided in a waveguide that propagates the microwave so that plasma is generated.

The semi-amorphous semiconductor film is a semiconductor film in which crystal grains exist to be dispersed in the semiconductor film. A semi-amorphous semiconductor film according to the present invention can be formed over a substrate directly in a state in which the semiconductor film includes minute crystalline structures or crystal grains, which is different from a polycrystalline semiconductor film. Specifically, $SiH_4$ is diluted with at least one of hydrogen, a rare gas (such as helium, argon, krypton, or neon), and a halogen gas such as fluorine or chlorine is used, the gas is diluted by 2 to 1000 times, preferably 10 to 100 times, at a flow ratio, the electromagnetic energy in a microwave band is supplied to excite the gas into a plasma state, and a semi-amorphous semiconductor is deposited over the substrate with the radical reaction induced. Such a manufactured semi-amorphous semiconductor film includes a microcrystalline semiconductor film that has an amorphous semiconductor containing crystal grains with a diameter of 0.5 to 20 nm. In the present invention, such a semiconductor may be used at least for a photoelectric conversion layer. Note that it is not necessary that the entire photoelectric conversion layer in the film thickness direction is formed of a semi-amorphous semiconductor or a semiconductor similar to the semi-amorphous semiconductor, and the photoelectric conversion layer may include such a semiconductor in at least a part in the film thickness direction.

Further, in the photoelectric conversion layer, an intrinsic semiconductor layer is provided between an impurity semiconductor layer to which an impurity of one conductivity type is added and an impurity semiconductor layer to which an impurity of conductivity type opposite to the one conductivity type is added. In the present invention, at least an intrinsic semiconductor layer is formed using a semi-amorphous semiconductor as a photoelectric conversion layer.

Here, an intrinsic semiconductor indicates a semiconductor in which an impurity imparting one conductivity-type (an impurity imparting p-type or n-type conductivity) included in the semiconductor has concentration of $1 \times 10^{20}$ $cm^{-3}$ or less, oxygen and nitrogen have concentration of $9 \times 10^{19}$ $cm^{-3}$ or less, and photoconductivity is 100 times or more than dark conductivity. This intrinsic semiconductor includes an impurity imparting p-type or n-type conductivity, that is, an impurity element belonging to Group 13 or 15 of the periodic table. This is because the semi-amorphous semiconductor has weak n-type electric conductivity when an impurity element for control of a valence electron is not added intentionally, and thus, an impurity element imparting p-type conductivity may be added in an intrinsic semiconductor layer intentionally or unintentionally at the same time of formation of a layer or after formation thereof. This semiconductor including an impurity imparting p-type or n-type conductivity is a substantial intrinsic semiconductor layer, which is included in an intrinsic semiconductor layer of the present invention, and these layers are collectively referred to as an intrinsic semiconductor layer (hereinafter, also referred to as "i-type semiconductor layer").

According to the present invention, a semi-amorphous semiconductor with high quality can be obtained without reducing the deposition rate. By forming a photoelectric conversion layer using such a semi-amorphous semiconductor, a rate of deterioration in characteristics by light deterioration is decreased from one-fifth to one-tenth, and thus, a photoelectric conversion device that has almost no problems for practical use can be obtained. Since a rate of deterioration in characteristics by light deterioration is lowered, the photoelectric conversion layer in a photoelectric conversion device of the present invention may have a thickness of 0.5 to 10 µm, preferably, 1 to 5 µm. Therefore, by the present invention, resources can be more saved as compared with a case using a photoelectric conversion device using a single crystalline or polycrystalline silicon wafer that needs an extremely thick thickness.

BRIEF DESCRIPTION OF THE DRAWINGS

FIGS. 5A to 5C are cross-sectional views showing steps of manufacturing a photoelectric conversion device using a semi-amorphous semiconductor in a photoelectric conversion layer.

FIGS. 7A to 7C are cross-sectional views showing steps of manufacturing a photoelectric conversion device using a semi-amorphous semiconductor in a photoelectric conversion layer.

FIG. 10 is a cross-sectional view showing an optical sensor device using a semi-amorphous semiconductor in a photoelectric conversion layer.

FIG. 21 is a cross-sectional view showing a step of manufacturing a photoelectric conversion device using a semi-amorphous semiconductor in a photoelectric conversion layer.

FIG. 22 shows a structure of a laser irradiation device processing a thin film.

DETAILED DESCRIPTION OF THE INVENTION

Figure 1:
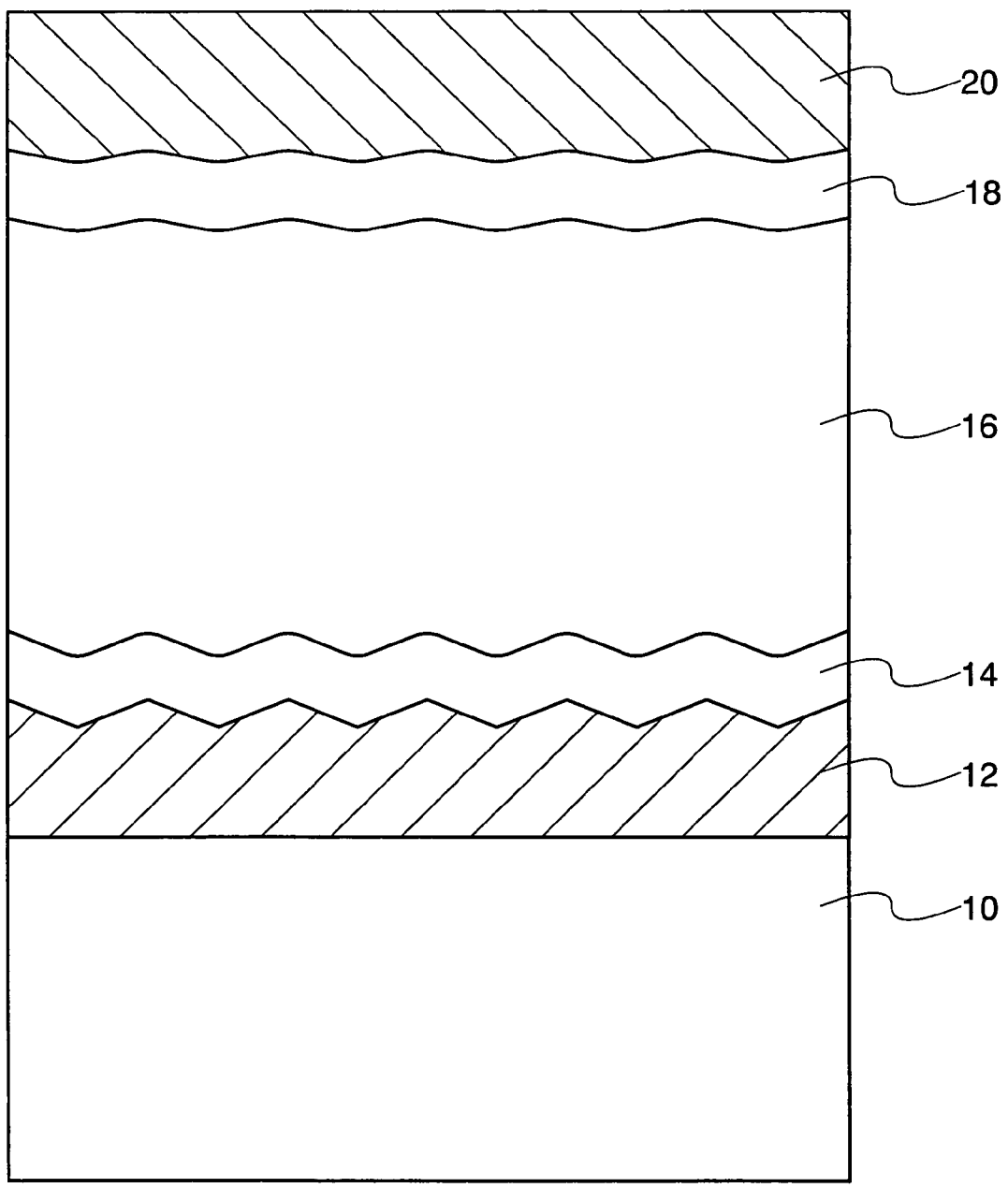
FIG. 1 is a diagram showing a photoelectric conversion device using a semi-amorphous semiconductor in a photoelectric conversion layer.

Embodiment modes of the present invention will be described below with reference to the accompanying drawings. Note that the present invention is not limited to the description below, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals in structures of the present invention.

EMBODIMENT MODE 1

FIG. 1 shows a structure of a photoelectric conversion device according to this embodiment mode. This photoelectric conversion device includes at least one semiconductor junction by providing an i-type semiconductor layer 16 interposed between a p-type semiconductor layer 14 and an n-type semiconductor layer 18. In this embodiment mode, a layer including the p-type semiconductor layer 14, the n-type semiconductor layer 18, and the i-type semiconductor layer 16, in other words, a photoelectric conversion layer, is formed using a semi-amorphous semiconductor layer.

A substrate 10 can be formed using various commercial glass plates such as soda-lime glass, lead glass, strengthened glass, and ceramic glass. Further, a non-alkali glass substrate such as an aluminoborosilicate glass substrate or a barium borosilicate glass substrate, a quartz substrate, or a metal substrate such as a stainless steel substrate can be used. In a case where light enters from the substrate 10 side, a first electrode 12 is formed of a transparent conductive-film material such as indium oxide, indium tin oxide, or zinc oxide. On the other hand, in a case where the first electrode 12 is a reflective electrode, the first electrode 12 is formed of a metal material such as aluminum, silver, titanium, or tantalum. In the case where the first electrode 12 is a reflective electrode, reflectivity is improved by providing depressions and projections on a surface of the electrode, which is preferable.

The p-type semiconductor layer 14 is formed of a semi-amorphous semiconductor or an amorphous semiconductor including boron as one conductivity-type impurity. In order to reduce light absorption loss, carbon may be included in the p-type semiconductor layer 14 so that the optical gap is extended.

The i-type semiconductor layer 16 is an intrinsic semiconductor, which is formed of a semi-amorphous semiconductor (typically, semi-amorphous silicon). Note that the i-type semiconductor is a semiconductor in which an impurity imparting p-type or n-type conductivity included in the semiconductor has concentration of $1 \times 10^{20}$ cm$^{-3}$ or less, oxygen and nitrogen have concentration of $9 \times 10^{19}$ cm$^{-3}$ or less, and photoconductivity is 100 times or more than dark conductivity. In this intrinsic semiconductor, 1 to 1000 ppm of boron may be added. In other words, the semi-amorphous semiconductor has weak n-type electric conductivity when an impurity element for control of a valence electron is not added intentionally. Thus, in a case where the semi-amorphous semiconductor is applied to the i-type semiconductor layer 16, an impurity element imparting p-type conductivity may be added at the same time as formation of the i-type semiconductor layer 16 or after formation thereof. The impurity element imparting p-type conductivity is typically boron, and an impurity gas such as $B_2H_6$ or $BF_3$ may be mixed into a semiconductor material gas at a ratio of 1 to 1000 ppm. Concentration of boron may be $1 \times 10^{14}$ to $6 \times 10^{16}$ atoms/cm$^3$.

The semi-amorphous semiconductor includes a semiconductor having an intermediate structure between an amorphous semiconductor and a crystalline structure (including single crystal and polycrystal). This semiconductor has a third state which is stable in terms of free energy, and is a crystalline substance having short-range order and lattice distortion, which can be dispersed in an amorphous crystalline semiconductor with its grain size of 0.5 to 20 nm. Further, 1 atom % or more of hydrogen or halogen is at least included for terminating dangling bonds. By further promotion of lattice distortion by inclusion of a noble gas element such as helium, argon, krypton, or neon, favorable semi-amorphous in which stability is increased can be obtained. Such semi-amorphous silicon has lattice distortion, and the optical characteristics are changed from the indirect transition of single crystalline silicon into the direct transition thereof by the lattice distortion. At least 10% of lattice distortion makes the optical characteristics change into the direct transition type. When distortion exits locally, the optical characteristics in which the direct transition and the indirect transition are mixed can be obtained.

This semi-amorphous semiconductor is formed by exciting a semiconductor material gas typified by silane into a plasma state by an electromagnetic energy in a microwave band to deposit a product. A typical semiconductor material gas is $SiH_4$, and $Si_2H_6$, $SiH_2Cl_2$, $SiHCl_3$, $SiCl_4$, $SiF_4$, or the like can also be used. This semiconductor material gas is diluted with the use of at least one of hydrogen, fluorine; or one or plural kinds of rare gas elements selected from helium, argon, krypton, and/or neon, whereby a semi-amorphous semiconductor can be easily formed. The semiconductor material gas is preferably diluted in a range of 10 to 1000 times as a dilution ratio. As a matter of course, the film is generated by a reaction caused by a method of producing plasma by an electromagnetic energy in a microwave band is performed under reduced pressure, and pressure may be in a range of 0.1 to 133 Pa. As electric power for producing plasma, 1 to 5 GHz, typically, 2.45 GHz of an electromagnetic wave may be supplied. The substrate heating temperature is preferably 300° C. or lower, and the substrate heating temperature of 100° C. to 200° C. is recommended. Further, a carbide gas such as $CH_4$ or $C_2H_6$ or a germanium gas such as $GeH_4$ or $GeF_4$ is mixed into the semiconductor material gas, and the energy band width may be adjusted to be 1.5 to 2.4 eV or 0.9 to 1.1 eV.

The n-type semiconductor layer 18 is formed of a semi-amorphous semiconductor or an amorphous semiconductor including phosphorus as a one conductivity-type impurity. A second electrode 20 over the n-type semiconductor layer 18 is formed using a metal material such as aluminum, silver, titanium, or tantalum. In a case where light is entered from the second electrode 20 side, the second electrode 20 is formed of a transparent conductive material.

Although FIG. 1 illustrates the structure of the photoelectric conversion layer including the p-type semiconductor layer 14, the i-type semiconductor layer 16, and the n-type semiconductor layer 18, a PI junction, IN junction, and a PN junction may be used as semiconductor junctions that form the photoelectric conversion layer, in addition to this PIN junction. In the semi-amorphous semiconductor, the diffusion length of minority carriers is longer than that of an amorphous semiconductor; therefore, a PP$^-$N junction and a PP$^-$IN junction can also be formed.

In such a photoelectric conversion device, each layer of the photoelectric conversion layer is preferably formed in succession without each interface being exposed to the atmospheric air. Further, a minute amount of impurity element is added to each layer for the purpose of control of valence electrons; therefore, it is preferable to apply a microwave plasma CVD apparatus having a multi-chamber structure provided with a plurality of deposition treatment chambers. In particular, it is preferable to use such plasma in which the electron density be greater than or equal to $1 \times 10^{11}$ cm$^{-3}$ and less than or equal to $1 \times 10^{13}$ cm$^{-3}$, and the electron temperature be approximately greater than or equal to 0.2 eV and less than or equal to 2.0 eV (more preferably, greater than or equal to 0.5 eV and less than or equal to 1.5 eV). When plasma with high electron density and low electron density is utilized, plasma damage is small and defects are reduced; therefore, a semi-amorphous semiconductor film with high quality can be formed. An example of an apparatus suitable for formation of a semi-amorphous semiconductor film is described below.

Figure 2:
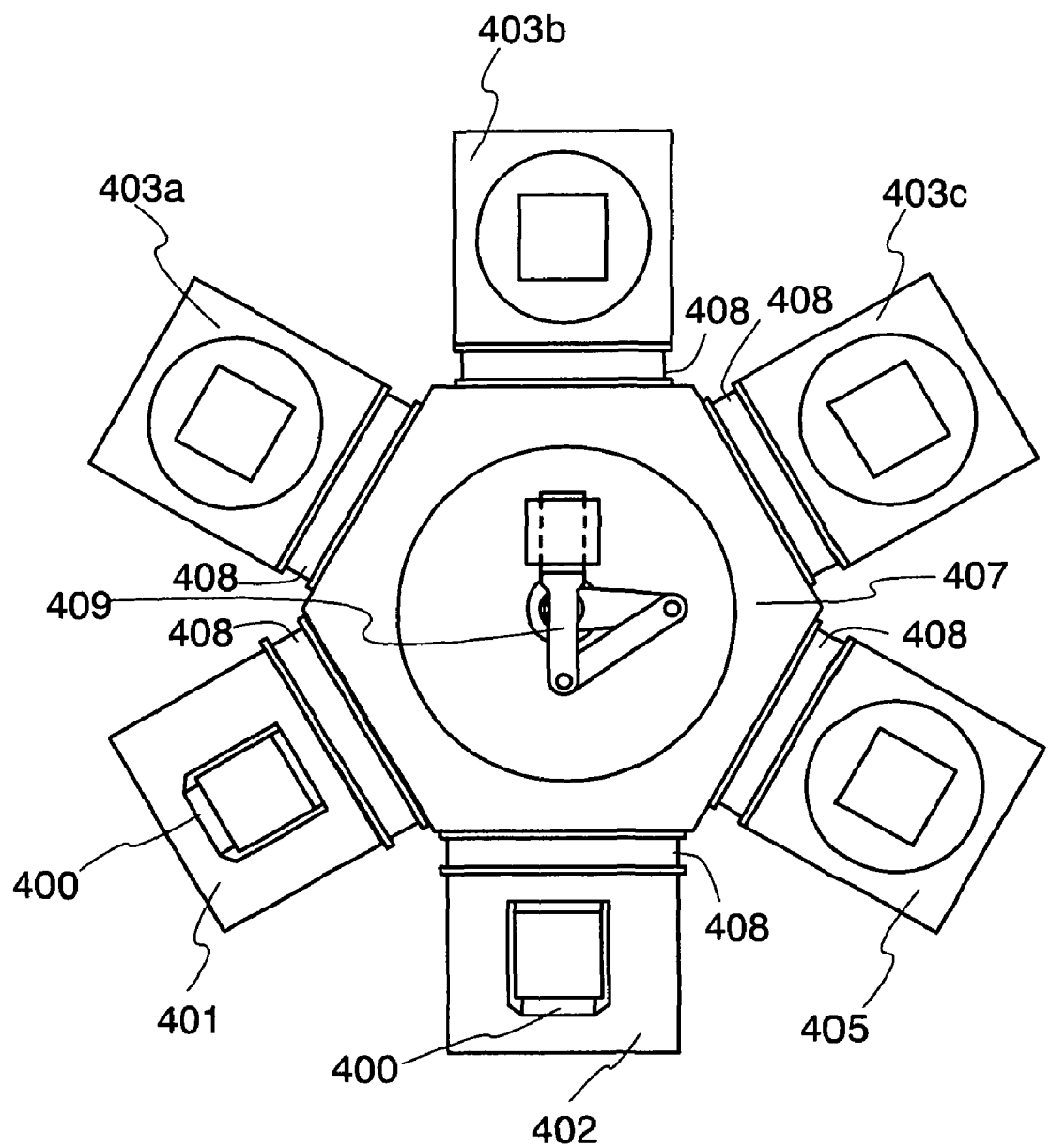
FIG. 2 is a diagram showing a structure of a microwave plasma CVD apparatus of a multi-chamber system provided with a plurality of treatment chambers.

FIG. 2 shows an example of a microwave plasma CVD apparatus of a multi-chamber system provided with a plurality of treatment chambers. This apparatus includes a load chamber 401, an unload chamber 402, a treatment chamber (1) 403*a*, a treatment chamber (2) 403*b*, a treatment chamber (3) 403*c*, and a spare chamber 405 around a common chamber 407. A p-type semiconductor layer is formed in the treatment chamber (1) 403*a*, an i-type semiconductor layer is formed in the treatment chamber (2) 403*b*, and an n-type semiconductor layer is formed in the treatment chamber (3) 403*c*. A substrate to be processed is transferred to each treatment chamber through the common chamber 407. Gate valves 408 are provided between the common chamber 407 and each chamber so that treatment conducted in each chamber does not interfere to each other. The substrate is equipped with a cassette 400 which is provided in the load chamber 401 and the unload chamber 402 and transferred to the treatment chamber (1) 403*a*, the treatment chamber (2) 403*b*, and the treatment chamber (3) 403*c* by a transfer unit 409 in the common chamber 407. In this apparatus, a treatment chamber can be provided for each kind of films to be deposited, and a plurality of different kinds of films can be formed in succession without being exposed to the atmospheric air.

Figure 3:
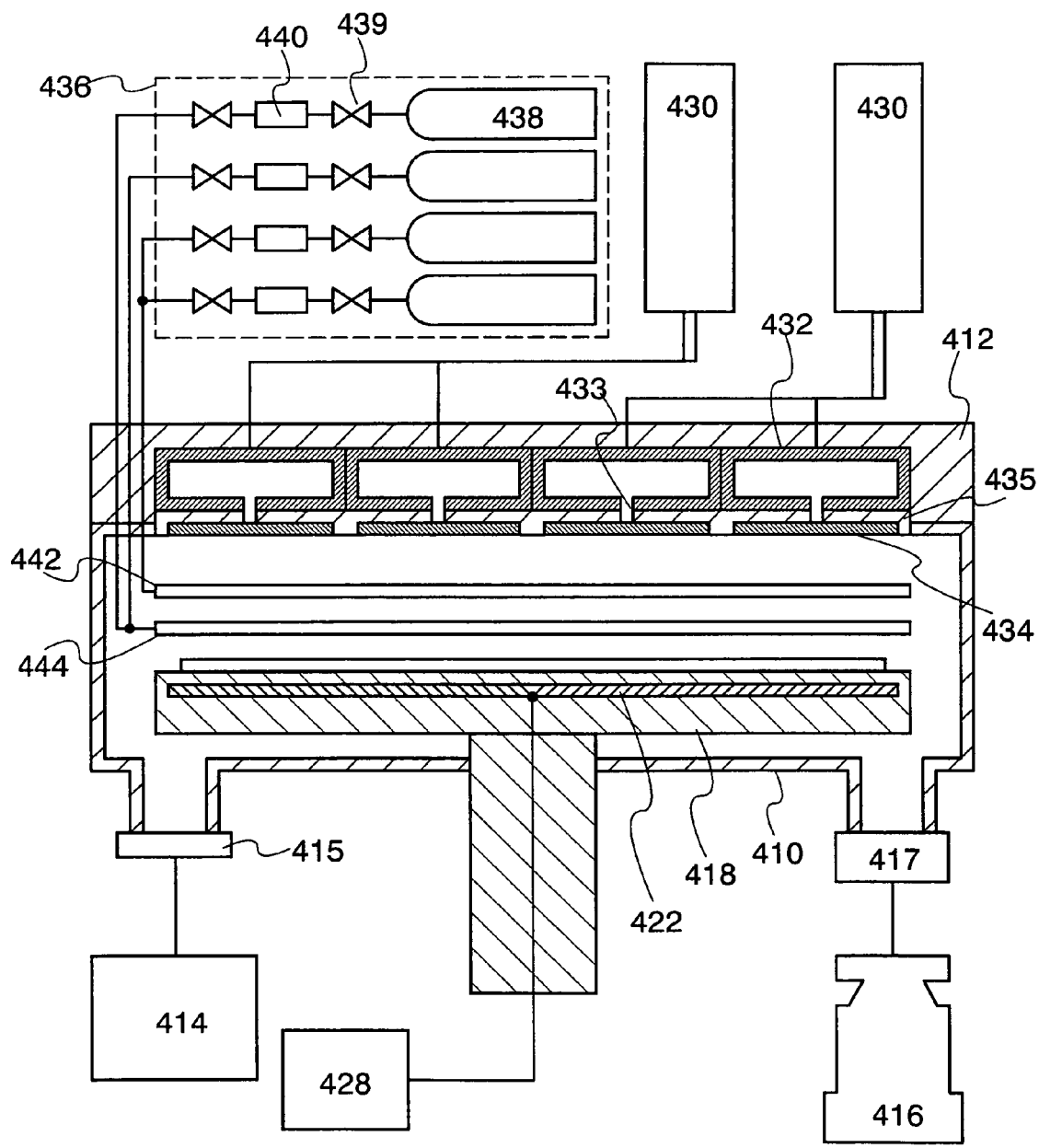
FIG. 3 is a diagram describing a structure of a treatment chamber in a microwave plasma CVD apparatus of a multi-chamber system provided with a plurality of treatment chambers.

FIG. 3 is a diagram for describing an example of a treatment chamber in detail. FIG. 3 shows a cross-sectional structure of a treatment chamber. The treatment chamber is constituted by a treatment container 410 and a cover 412 and has a sealed structure so that the inside can be kept in a reduced pressure. The treatment container 410 is, for example, formed of metal such as stainless steel or aluminum.

In order to keep the inside of the treatment chamber in a reduced pressure, a rotary pump 414 that is a low vacuum evacuation unit and a turbo molecular pump 416 that is a high vacuum evacuation unit are connected to the treatment container 410. The rotary pump 414 that is a low vacuum evacuation unit makes a switching valve 415 operate and performs vacuum evacuation so that the treatment container 410 has a degree of 0.1 Pa from the atmospheric air, approximately. For example, the rotary pump is constituted by a dry pump. The turbo molecular pump 416 that is a high vacuum evacuation unit performs high vacuum evacuation of 0.1 Pa or less. A pressure adjustment valve 417 that is connected to the turbo molecular pump 416 that is a high vacuum evacuation unit in series adjusts conductance of gas flow and operates to keep the pressure in the treatment chamber within a predetermined range by adjusting the exhaust velocity of a reaction gas supplied from a gas supply unit 436.

A susceptor 418 on which an object to be processed such as the substrate is placed is provided in the treatment container 410. The susceptor 418 is formed of a ceramic material such as aluminum nitride, silicon nitride, or silicon carbide. A heater 422 is provided inside the susceptor 418. The heater 422 is connected to a heater power supply 428. The heater 422 is embedded in the susceptor 418 and is heated by supply of power from the heater power supply 428. Such heater 422 keeps the substrate that is placed on the susceptor 418 at a predetermined temperature.

The cover 412 is provided to seal an upper part of the treatment container 410. In the cover 412, a waveguide 432 is arranged so as to be in contact with a top plate 435. The waveguide 432 is connected to a microwave power supply 430. A slit 433 is provided in the waveguide 432 and the top plate 435 so as to leak the microwave. The slit 433 is blocked using a dielectric plate 434, so that airtightness in the treatment container 410 is held. The microwave is introduced into the treatment container 410 through the dielectric plate 434, so that plasma is generated.

Figure 4:
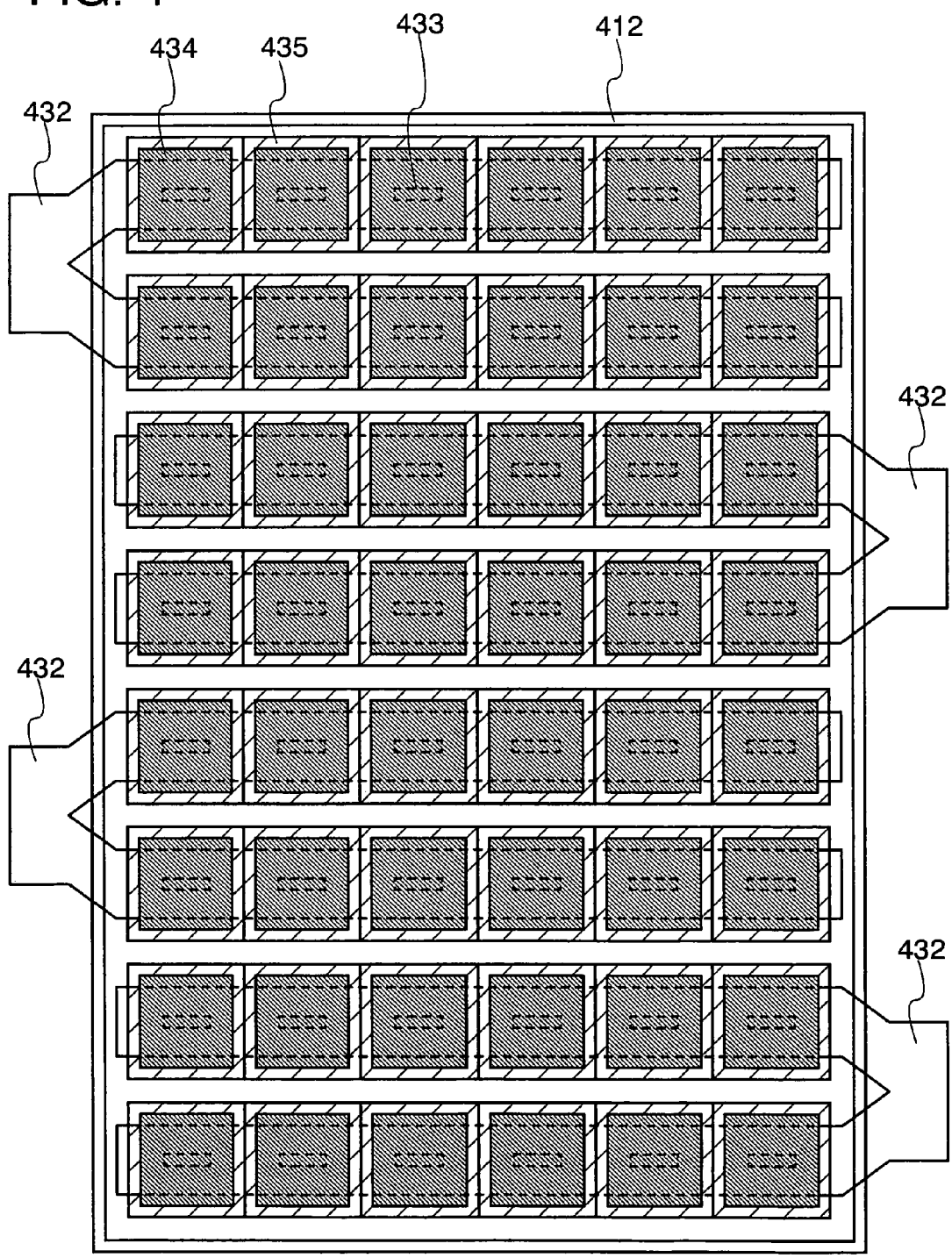
FIG. 4 is a plane view showing a structure of a treatment chamber in a microwave plasma CVD apparatus of a multi-chamber system provided with a plurality of treatment chambers.

FIG. 4 is a plain view showing a structure of a cover 412. The waveguide 432 is extended in parallel to the top plate 435, and a plurality of waveguides 432 are arranged in parallel to each other. The dielectric plates 434 are arranged in matrix on the top plate 435. The slit 433 provided for each waveguide 432 and each top plate 435 is provided corresponding to positions of each dielectric plate 434. When the substrate to be processed has a large area (e.g., a case of applying a glass substrate of 730 mm×920 mm or a glass substrate of a size which has one side exceeding 1 m), the waveguide 432 is preferably divided into a plurality and a microwave is supplied. FIG. 4 shows a structure in which branch waveguides are used at an end portion of each waveguide 432, and the microwaves divided into a plurality are supplied. The microwave power supply is connected to the tip of each branch waveguide. Use of a plurality of microwave power supplies makes it possible to keep uniformity of plasma even when the area of the substrate to be processed becomes large.

In FIG. 3, the gas supply unit 436 includes a cylinder 438 filled with a treatment gas which is a reactive gas, a valve 439, a mass flow controller 440, and the like. A treatment gas whose flow rate is adjusted by the mass flow controller 440 is introduced into the treatment container 410. The cylinder 438 is filled with a gas needed for formation of a semi-amorphous semiconductor. The treatment gas needed for formation which is a reactive gas includes a semiconductor material gas such as silane or disilane and at least one of hydrogen, fluorine, and a rare gas such as helium or argon, each of which dilutes the semiconductor material gas. In the treatment container 410, a gas supply nozzle (upper side) 442 and a gas supply nozzle (lower side) 444 are provided, and the treatment gas flows out into the treatment container 410 from the nozzles. For example, at least one of hydrogen, fluorine, and a rare gas such as helium or argon is supplied in the gas supply nozzle (upper side) 442, a high density radical is generated in the vicinity of the dielectric plate 434 in which the microwave is introduced, and a surface reaction is promoted on a surface where the semi-amorphous semiconductor is grown over the substrate to be processed. A semiconductor material gas for film deposition is supplied in the gas supply nozzle (lower side) 444. In such a manner, by separating a gas supply path, deposition of film to the dielectric plate 434 can be suppressed. In the step of film formation, hydrogen, fluorine, or a rare gas such as helium or argon may be continuously supplied from the gas supply nozzle (upper side) 442.

By the plasma CVD apparatus having such a structure, a reaction gas that is a treatment gas is introduced into the treatment chamber where the substrate is placed, and a microwave is introduced into the treatment chamber through a slit provided for the waveguide that is disposed in approximately parallel to and opposed to the substrate, thereby generating plasma, so that a photoelectric conversion layer formed of a semi-amorphous semiconductor can be formed over the substrate.

In a case where a PIN junction is formed as a structure of the photoelectric conversion layer, treatment chambers each corresponding to different semi-amorphous semiconductor layers are preferably provided in a microwave plasma CVD apparatus. In this case, first, a first reaction gas is introduced into the treatment chamber (1) in which a substrate (a substrate where a first electrode is formed) is placed, and a microwave is introduced into the treatment chamber (1) through a slit provided for the waveguide that is disposed in approximately parallel to and opposed to the substrate, thereby generating plasma, so that a first semi-amorphous semiconductor layer (a p-type semiconductor layer) is formed over the substrate. Next, the substrate is transferred from the treatment chamber (1) to the treatment chamber (2) without being exposed to the atmospheric air, a second reaction gas is introduced into the treatment chamber (2) in which the substrate is placed, and a microwave is similarly introduced to generate plasma, so that a second amorphous semiconductor layer (an i-type semiconductor layer) is formed over the first semi-amorphous semiconductor layer. Then, the substrate is transferred from the treatment chamber (2) to the treatment chamber (3) without being exposed to the atmospheric air, a third reaction gas is introduced into the treatment chamber (3) in which the substrate is placed, and a microwave is similarly introduced to generate plasma, so that a third semi-amorphous semiconductor layer (an n-type semiconductor layer) is formed over the second semi-amorphous semiconductor layer. Here, a case in which the number of the treatment chambers is three corresponding to the number of layers stacked is exemplified.

For example, when a PI junction, an IN junction, or a PN junction is formed as a photoelectric conversion layer, the number of treatment chambers for film formation may be two. Alternatively, when a structure of layers is applied in which concentration of impurities imparting one conductivity type is different from each other, as the case of a PP⁻N junction or a P⁺PP⁻N junction, four treatment chambers may be used. On the other hand, two treatment chambers may be sufficient in some cases as far as the concentration of impurity gases introduced into the treatment chambers is controlled.

By dividing the waveguide for generating plasma into a plurality as shown in FIG. 4, the above-described microwave plasma CVD apparatus can respond flexibly to large-sized substrates of liquid crystal glass, having sizes of 300 mm×400 mm of the first generation, 550 mm×650 mm of the third generation, 730 mm×920 mm of the fourth generation, 1000 mm×1200 mm of the fifth generation, 2450 mm×1850 of the sixth generation, 1870 mm×2200 mm of the seventh generation, and 200 mm×2400 mm of the eighth generation.

Figure 9:
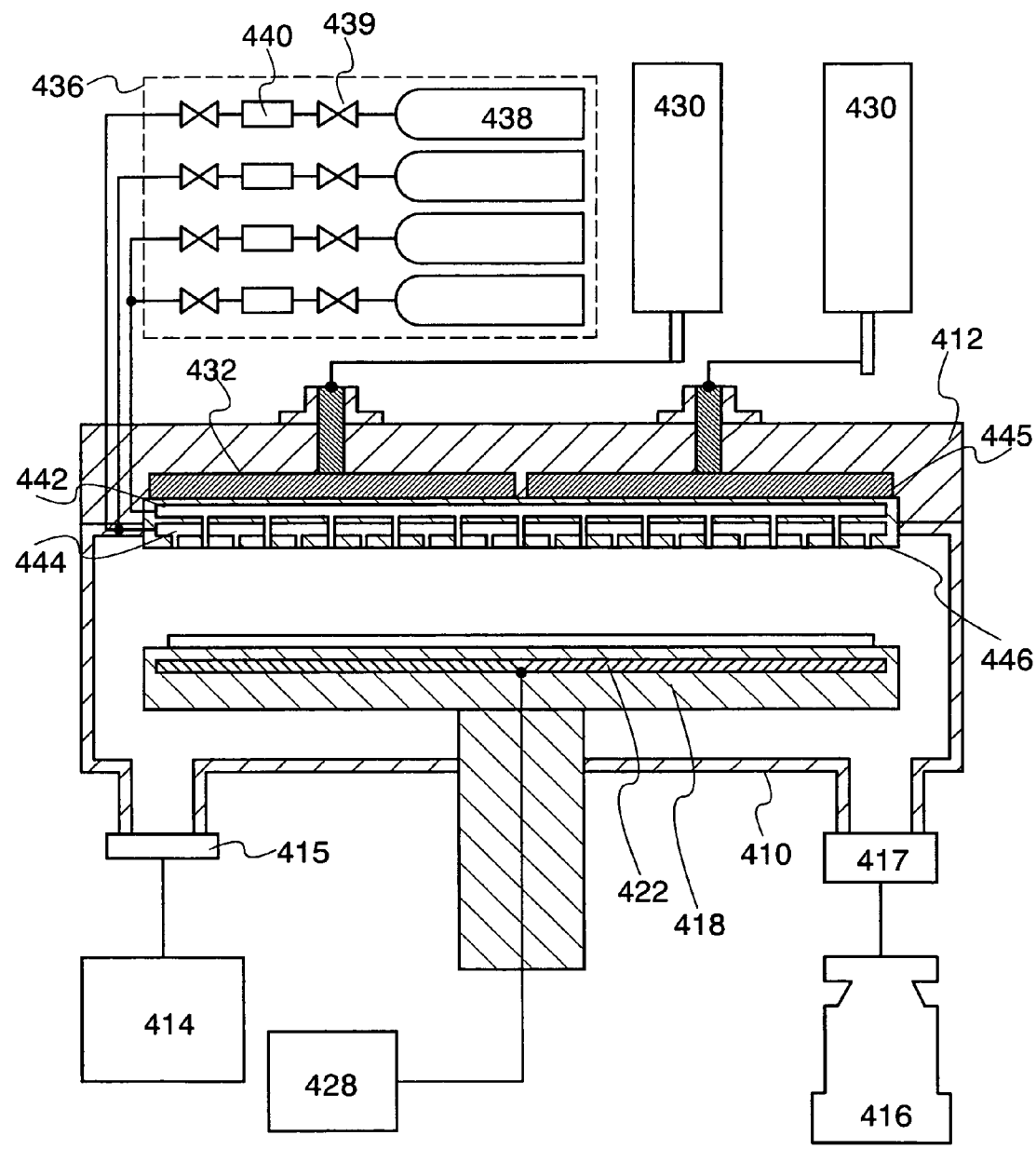
FIG. 9 is a diagram describing a structure of a treatment chamber in a microwave plasma CVD apparatus of a multi-chamber system provided with a plurality of treatment chambers.

FIG. 9 shows another structure of a treatment chamber in which a microwave antenna 445 emitting a microwave and a shower-type dielectric plate 446 transmitting the microwave are combined. The other parts of structure of the treatment chamber is similar to that of FIG. 3, and the treatment chamber is constituted by the treatment container 410 and the cover 412 and has a sealed structure in which the inside can be kept in the reduced pressure. The microwave antenna 445 is connected to the external microwave power supply 430 through the waveguide. The microwave antenna 445 is provided with a radiation plate formed using a conductor provided with a plurality of slots. A microwave with a frequency of several gigahertzes is introduced from the microwave antenna 445, whereby high density plasma is generated in the treatment container 410. Since plasma to be generated has low electron temperature (3 eV or less, preferably, 1.5 eV or less), a surface where a film is grown is hardly damaged, and growth of the film is promoted by the surface reaction of a high density radical due to the high electron density ($1\times10^{11}$ cm$^{-3}$ or more). The shower-type dielectric plate 446 is connected to the gas supply unit 436. The shower-type dielectric plate 446 is provided with the gas supply nozzle (upper side) 442 and the gas supply nozzle (low power) 444 and has a structure in which a treatment gas flows out into the treatment container 410 from the nozzles. For example, at least one of hydrogen, fluorine, and a rare gas such as helium or argon is supplied in the gas supply nozzle (upper side) 442, and a high density radical is generated in the vicinity of the dielectric plate 446 in which the microwave is introduced, so that the surface reaction is promoted on a surface where a semi-amorphous semiconductor is grown over a substrate to be processed. A semiconductor material gas for deposition of the film is supplied in the gas supply nozzle (lower side) 444. In the case of FIG. 9, the microwave antenna 445 is divided into a plurality, and a microwave power is supplied to each microwave antenna 445, whereby uniform plasma can be generated to a large-sized substrate, which makes it possible to form a photoelectric conversion layer over the large-sized substrate.

The semi-amorphous semiconductor film can be deposited uniformly over such a large-sized substrate, and an integrated photoelectric conversion device in which a plurality of unit cells are connected in series over a substrate can be formed. The outline of steps thereof is described below.

In FIG. 5A, a light-transmitting electrode layer 102 is provided over a substrate 101. Alternatively, a substrate provided with the light-transmitting electrode layer 102 is prepared. The light-transmitting electrode layer 102 is formed using an indium tin oxide alloy (ITO), zinc oxide (ZnO), tin oxide (SnO$_2$), an ITO-ZnO alloy, or the like to have a thickness of 40 to 200 nm (preferably, 50 to 100 nm). Sheet resistance of the light-transmitting electrode layer 102 may be about 20 to 200 Ω/square.

Further, the light-transmitting electrode layer 102 may be formed using a conductive composition including a conductive high molecule (also referred to as conductive polymer). In a case where a thin film is formed using a conductive composition as the light-transmitting electrode layer 102, it is preferable that sheet resistance in the thin film be 10000 Ω/square or less, light transmittance in the wavelength 550 nm be 70% or higher, and resistivity of the conductive high molecule included be 0.1 Ω·cm or less. As a conductive high molecule, so-called π electron conjugated conductive high-molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high-molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), or the like.

Any of the foregoing conductive high molecules may be used alone as a conductive composition for the light-transmitting electrode layer. Alternatively, any of the foregoing conductive high molecules can be used with an organic resin added thereto to adjust a property of the conductive composition.

As for an organic resin, as long as a resin is compatible to a conductive high molecule or a resin can be mixed and dispersed into a conductive high molecule, a thermosetting resin, a thermoplastic resin, or a photocurable resin may be used. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin; or a copolymer of any of those resins.

Further, a conductive composition may be doped with an acceptor dopant or a donor dopant so that oxidation-reduction potential of a conjugated electron in a conjugated conductive high-molecule may be changed in order to adjust conductivity of the conductive composition.

A halogen compound, a Lewis acid, a protonic acid, an organic cyano compound, an organic metal compound, or the like can be used as an acceptor dopant. Examples of a halogen compound are chlorine, bromine, iodine, iodine chloride, iodine bromide, iodine fluoride, and the like. Examples of a Lewis acid are phosphorus pentafluoride, arsenic pentafluoride, antimony pentafluoride, boron trifluoride, boron trichloride, boron tribromide, and the like. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the foregoing organic carboxylic acid compound and organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As a donor dopant, alkali metal, alkaline-earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, an aromatic-based solvent, or the like) and a thin film which serves as a light-transmitting electrode layer can be formed by a wet process. A solvent which dissolves a conductive composition is not particularly limited. A solvent which dissolves the foregoing conductive high molecules and high molecular resin compounds such as an organic resin may be used. For example, a conductive composition may be dissolved in any one of or mixture of water, methanol, ethanol, Propylene carbonate, N-methylpyrrolidone, dimethylformamide, dimethylacetamide, cyclohexanone, acetone, methyl ethyl ketone, methyl isobutyl ketone, or toluene.

After the conductive composition is dissolved in a solvent as described above, a film thereof can be formed by a wet process, such as an application method, a coating method, a droplet discharge method (also referred to as an inkjet method), or a printing method. The solvent may be dried with thermal treatment or may be dried under reduced pressure. In the case where the organic resin is a thermosetting resin, heat treatment may be further performed. In the case where the organic resin is a photocurable resin, light irradiation treatment may be performed.

Furthermore, the light-transmitting conductive layer 102 can be formed using a composite light-transmitting conductive material including a hole-transporting organic compound and a metal oxide which shows an electron accepting property with respect to the hole-transporting organic compound. In this composite light-transmitting conductive material, by mixing a hole-transporting organic compound and a metal oxide which shows an electron accepting property with respect to the hole-transporting organic compound, resistivity can be $1\times10^6$ Ω·cm or less. Note that "composition" does not simply mean a state in which two materials are mixed, but also a state in which charges can be transported among a plurality of materials by mixing the plurality of materials.

The composite light-transmitting conductive material is obtained by combining a first organic compound and an inorganic compound. As the first organic compound used in the composite light-transmitting conductive material, various compounds such as an aromatic amine compound, a carbazole derivative, aromatic hydrocarbon, and a high molecular compound (oligomer, dendrimer, polymer, or the like) can be used. The first organic compound used for the composite material is preferably an organic compound having high hole-transporting properties. Specifically, a substance having a hole mobility of $10^{-6}$ cm$^2$/Vsec or higher is preferably used. However, other substances than those may also be used as long as the hole transporting properties thereof are higher than the electron transporting properties thereof.

As the first organic compound that can be used for the composite material, the following compounds given below can be applied. The followings can be given, as the aromatic amine compound: 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 4,4',4"-tris(N,N)-diphenylamino)triphenylamine (abbreviation: TDATA); 4,4',4"-tris[N-(3-methylphenyl)-N-phenylamino]triphenylamine (abbreviation: MTDATA); and the like.

When the following organic compounds are used, a composite material that does not have a peak of an absorption spectrum in a wavelength region of 450 to 800 nm can be obtained. At the same time, resistivity can be $1\times10^6$ Ω·cm or less, typically, $5\times10^4$ to $1\times10^6$ Ω·cm or less.

As aromatic amine contained in a composite material that does not have a peak of an absorption spectrum in a wavelength region of 450 to 800 nm, the followings can be given: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivative that can be used for the composite material that does not have a peak of an absorption spectrum in a wavelength region of 450 to 800 nm, the followings can be given specifically: 3-[N-(9-phenylcarbazole-3-yl)-N-phenylamino]-9-phenylcarbazole (abbreviation: PCzPCA1); 3,6-bis[N-(9-phenylcarbazole-3-yl)-N-phenylamino]-9-phenylcarbazole (abbreviation: PCzPCA2); 3-[N-(1-naphtyl)-N-(9-phenylcarbazole-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; or the like can also be used.

As aromatic hydrocarbon that can be used for the composite material and does not have a peak of an absorption spectrum in a wavelength region of 450 to 800 nm, the followings can be given for example: 9,10-di(naphthalene-2-yl)-2-tert-butylanthracene (abbreviation: t-BuDNA); 9,10-di(naphthalene-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalene-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalene-1-yl)anthracene (abbreviation: DMNA); 2-tert-butyl-9,10-bis[2-(naphthalene-1-yl)phenyl]

anthracene; 9,10-bis[2-(naphthalene-1-yl)phenyl]anthracene; 2,3,6,7-tetramethyl-9,10-di(naphthalene-1-yl)anthracene; 2,3,6,7-tetramethyl-9,10-di(naphthalene-2-yl) anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, or the like can also be used. It is particularly preferable to use aromatic hydrocarbon that has a hole mobility of $1 \times 10^{-6}$ cm$^2$ Vsec or higher and that has 14 to 42 carbon atoms.

Aromatic hydrocarbon that can be used for the composite material that does not have a peak of an absorption spectrum in a wavelength region of 450 to 800 nm may have a vinyl skeleton. As aromatic hydrocarbon having a vinyl skeleton, the followings can be given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly{4-[N-(4-diphenylamniphenyl)-N-phenyl]aminostyrene} (abbreviation: PStDPA), poly{4-[N-(9-carbazole-3-yl)-N-phenylamino]styrene} (abbreviation: PStPCA), poly(N-vinylcarbazole) (abbreviation: PVK), and poly(4-vinyltriphenylamine) (abbreviation: PVTPA) can also be used.

As the inorganic compound used for the composite material, an oxide of a transition metal is preferably used. Moreover, an oxide of a metal belonging to any of Groups 4 to 8 of the periodic table is preferably used. Specifically, it is preferable to use vanadium oxide, niobium oxide, tantalum oxide, chromium oxide, molybdenum oxide, tungsten oxide, manganese oxide, and rhenium oxide because of their high electron accepting properties. Above all, molybdenum oxide is particularly preferable because it is stable in the atmospheric air, easily treated, and has low moisture absorption properties.

A method for manufacturing the layer containing the composite material may be either a wet method or a dry method, and any method may be used. For example, the layer containing the composite material can be manufactured by co-evaporation of the aforementioned organic compound and inorganic compound. Note that since molybdenum oxide is easily evaporated in vacuum, it is also preferably used from the aspect of a manufacturing process in the case of the layer containing the composite material by an evaporation method. Further, the layer containing the composite material can also be obtained in such a way that a solution containing the aforementioned organic compound and metal alkoxide is applied and baked. As a method for applying the solution, an ink-jet method, a spin coat method, or the like can be used.

By selecting the kind of the organic compound contained in the composite material, a composite material that does not have a peak of an absorption spectrum in a wavelength region of 450 to 800 nm can be obtained. Therefore, light emitted from a light emitting region is not absorbed but transmitted effectively, leading to improvement in light extraction efficiency in a case of light-emitting device. Further, light from a backlight is not absorbed but transmitted effectively, leading to improvement in light extraction efficiency. Furthermore, the layer containing the composite material has high resistance to bending. That is, the layer containing the composite material can be used favorably when a photoelectric conversion device is manufactured using a flexible substrate.

In terms of lowering resistance of the light-transmitting electrode layer 102, an ITO film is suitable. However, if an ITO film is exposed to a plasma atmosphere containing hydrogen in a case of forming a semi-amorphous semiconductor layer thereover by a conventional high-frequency plasma CVD method, a light-transmitting property of the ITO film is deteriorated because of reduction. On the contrary, by a microwave plasma CVD method according to this embodiment mode, deterioration of an electrode material can be suppressed because the electron temperature is low. Naturally, in order to prevent deterioration of the ITO film, it is effective that a SnO$_2$ film or a ZnO film be formed over the ITO film. The ZnO (ZnO:Ga) film containing gallium (Ga) of 1 to 10 wt % has high transmittance and is suitable to be stacked over the ITO film. As an example of a combination thereof, when the ITO film is formed to have a thickness of 50 to 60 nm and the ZnO:Ga film is formed thereover to have a thickness of 25 nm, it is possible to prevent a light-transmitting property from being deteriorated, and a favorable light-transmitting property can be obtained. In this stacked film, sheet resistance of 120 to 150 Ω/square can be obtained.

A photoelectric conversion layer 103 is formed using a semi-amorphous semiconductor manufactured by the aforementioned microwave plasma CVD method. A typical example of a semi-amorphous semiconductor is a semi-amorphous semiconductor manufactured by using a SiH$_4$ gas as a raw material, and in addition, a semi-amorphous silicon-germanium semiconductor or a semi-amorphous silicon-carbide semiconductor is applied. The photoelectric conversion layer 103 includes any semiconductor junction of a PIN junction, a PI junction, an IN junction, or a PN junction. By a microwave plasma CVD method according to this embodiment mode, damage in each junction interface is suppressed because the electron temperature is low, and a photoelectric conversion layer having a favorable semiconductor junction can be formed.

FIG. 5A shows an example of the photoelectric conversion layer 103 in which a p-type semiconductor layer 103a, an i-type semiconductor layer 103b, and an n-type semiconductor layer 103c are stacked from the light-transmitting electrode layer 102 side. The thickness of the photoelectric conversion layer is 0.5 to 10 μm, preferably, 1 to 5 μm. In particular, the thickness of the p-type semiconductor layer can be 10 to 20 nm, and the thickness of the n-type semiconductor layer can be 20 to 60 nm.

Treatment for improving crystallinity by irradiating the semi-amorphous semiconductor layers with laser light may be performed in a state where the p-type semiconductor layer 103a, the i-type semiconductor layer 103b, and the n-type semiconductor layer 103c are stacked, or a state where the p-type semiconductor layer 103a and the i-type semiconductor layer 103b are stacked. Laser light with which the semi-amorphous semiconductor layers are irradiated is ultraviolet light, visible light, or infrared light. As a laser oscillator capable of emitting ultraviolet light, visible light, or infrared light, an excimer laser oscillator using KrF, ArF, XeCl, Xe, or the like; a gas laser oscillator using He, He—Cd, Ar, He—Ne, HF, or the like; a solid-state laser oscillator in which a crystal of YAG, GdVO$_4$, YVO$_4$, YLF, YAlO$_3$, or the like is doped with Cr, Nd, Er, Ho, Ce, Co, Ti, or Tm; or a semiconductor laser oscillator using GaN, GaAs, GaAlAs, InGaAsP, or the like can be used. Typically, an excimer laser beam with a wavelength of 400 nm or less, or a second or third harmonic of a YAG laser is used as a laser beam. Further, for example, with the use of pulsed laser light having a repetition rate of approximately 10 to 1000 Hz, the laser light is converged to 100 to 500 J/cm$^2$ with an optical system, and a surface of a silicon film is irradiated with the laser with the overlap percentage of 90 to 95% and scanned. Furthermore, as a solid-state laser capable of continuous oscillation, second to fourth harmonics of the fundamental wave are preferably applied.

Typically the second harmonic (532 nm) or the third harmonic (355 nm) of a Nd:YVO$_4$ laser (the fundamental wave of 1064 nm) may be applied. In the case of using a continuous wave laser, laser light which is emitted from a continuous wave YVO$_4$ laser of 10 W output is converted into a harmonic by a non-linear optical element. Alternatively, there is a method by which YVO$_4$ crystal and a non-linear optical element are put in a resonator and a high harmonic is emitted. Then, the laser light having a rectangular shape or an elliptical shape on an irradiated surface is preferably formed by an optical system to be emitted to an object to be processed. At this time, an energy density of approximately 0.01 to 100 MW/cm$^2$ (preferably, 0.1 to 10 MW/cm$^2$) is necessary. Then, the semiconductor film may be moved relatively to the laser light at a rate of approximately 10 to 2000 cm/s so as to be irradiated.

When a PIN junction is formed using such a semi-amorphous semiconductor material, an open circuit voltage of about 0.4 to 1 V can be obtained. When a stacked structure in which a plurality of photoelectric conversion layers are stacked (also referred to as a tandem structure) is provided by using this PIN junction as one unit of the photoelectric conversion layer, the open circuit voltage can be increased.

As shown in FIG. 5B, in order to form a plurality of unit cells over the same substrate, openings $C_0$ to $C_n$ penetrating the photoelectric conversion layer 103 and the light-transmitting electrode layer 102 are formed by a laser processing method. The openings $C_0, C_2, C_4, \ldots, C_{n-2}$, and $C_n$ are openings for insulating separation and provided for forming unit cells, and the openings $C_1, C_3, C_5, \ldots, C_{n-1}$ are openings for forming connection between the light-transmitting electrode and a rear electrode. The kind of lasers used in a laser processing method is not limited, and a Nd-YAG laser, an excimer laser, or the like is used. In any case, by performing laser processing in a state where the light-transmitting electrode layer 102 and the photoelectric conversion layer 103 are stacked, separation of the light-transmitting electrode layer from the substrate in processing can be prevented.

Accordingly, the light-transmitting electrode layer 102 is divided into light-transmitting electrodes $T_1$ to $T_n$ and the photoelectric conversion layer 103 is divided into $K_1$ to $K_n$. Then, as shown in FIG. 5C, the openings $C_0, C_2, C_4, \ldots, C_{n-2}$, and $C_n$ are filled, and insulating resin layers $Z_0$ to $Z_n$ covering upper end portions of the openings $C_0, C_2, C_4, \ldots, C_{n-2}$, and $C_n$, respectively, are formed. The insulating resin layers $Z_0$ to $Z_n$ may be formed using a resin material having an insulating property such as an acrylic-based resin, a phenol-based resin, an epoxy-based resin, or a polyimide-based resin by a screen printing method. For example, insulating resin patterns are formed by a screen printing method so that the openings $C_0$, $C_2, C_4, \ldots, C_{n-2}$, and $C_n$ are filled using a resin composition in which cyclohexane, isophorone, high resistance carbon black, aerosil, a dispersing agent, a defoaming agent, and a leveling agent are mixed with a phenoxy resin. After the printing patterns are formed, thermal hardening is performed in an oven for 20 minutes at 160° C. to obtain the insulating resin layers $Z_0$ to $Z_n$.

Figure 6:
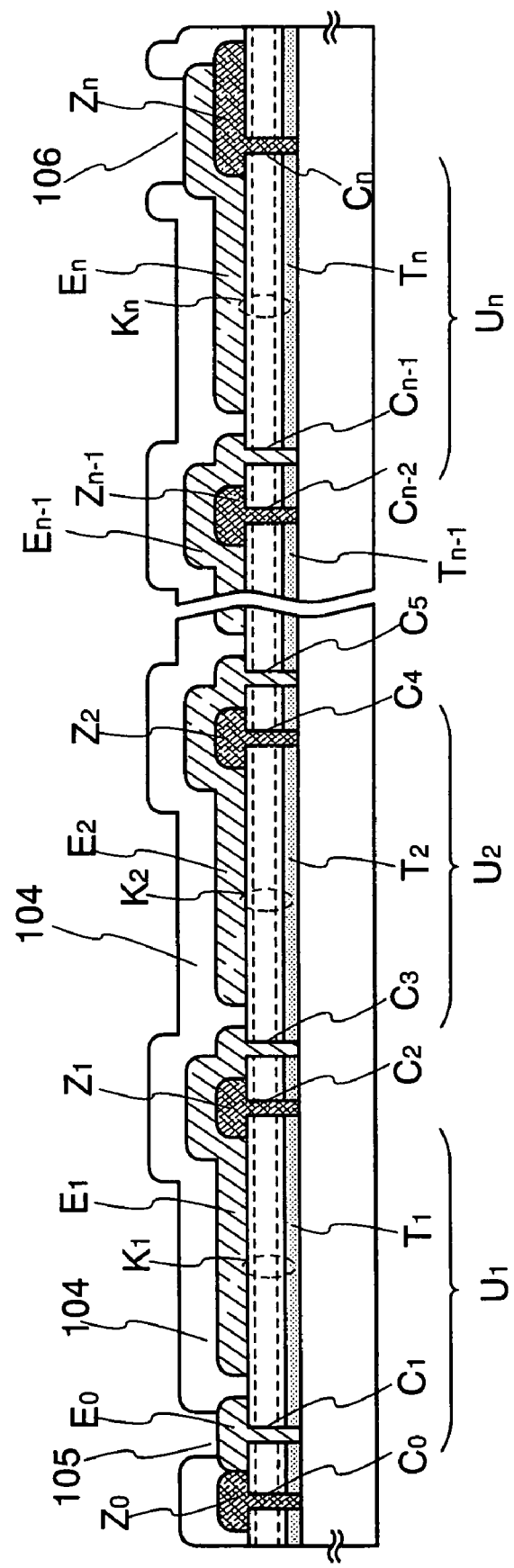
FIG. 6 is a cross-sectional view showing a step of manufacturing a photoelectric conversion device using a semi-amorphous semiconductor in a photoelectric conversion layer.

Next, rear electrodes $E_0$ to $E_n$ shown in FIG. 6 are formed. The rear electrodes $E_0$ to $E_n$ are formed of a conductive material. In this case, the rear electrodes $E_0$ to $E_n$ may be formed of aluminum, silver, molybdenum, titanium, chromium, or the like by a sputtering method or a vacuum evaporation method. Alternatively, the rear electrodes $E_0$ to $E_n$ can be formed using a conductive resin material. In a case where the rear electrodes $E_0$ to $E_n$ are formed using a conductive resin material, predetermined patterns may be directly formed by a screen printing method, an ink-jet method (droplet discharge method), a dispenser method, or the like. As a conductive composition, a composition containing a particle of metal as its main component, such as Ag (silver), Au (gold), Cu (copper), W (tungsten), or Al (aluminum), can be used. In a case where a photoelectric conversion device is manufactured using a large-sized substrate, it is preferable that resistance of the rear electrodes $E_0$ to $E_n$ be lowered. Thus, a composition in which a conductive particle of gold, silver, or copper, which has low resistance, is dissolved or dispersed in a solvent is preferably used as a main material of the conductive composition. Further preferably, silver or copper, which has low resistance, may be used. In order to fill the openings $C_1, C_3$, $C_5, \ldots, C_{n-1}$, which are subjected to laser processing, with a conductive material sufficiently, a nanopaste with a grain size of 5 to 10 nm which is an average size of a conductive particle may be used.

Alternatively, the rear electrodes $E_0$ to $E_n$ may be formed by forming a composition by being discharged. The composition contains a particle formed of a conductive material whose periphery is covered with another conductive material. For example, as a particle formed of Cu whose periphery is covered with Ag, a conductive particle provided with a buffer layer formed of Ni or NiB (nickel boron) between Cu and Ag may be used. A solvent corresponds to an organic solvent like esters such as butyl acetate, alcohols such as isopropyl alcohol, or acetone. The surface tension and its viscosity are appropriately adjusted by controlling concentration of a solution and adding a surface active agent or the like.

A diameter of a nozzle used for an ink-jet method is preferably set to be 0.02 to 100 μm (more preferably, 30 μm or less), and the amount of discharge of a composition discharged from the nozzle is preferably set to be 0.001 to 100 pl (more preferably, 10 pl or less). Although the ink-jet method has two types that are an on-demand type and a continuous type, both types may be used. Furthermore, a nozzle used for an ink-jet method has a piezoelectric method utilizing a property in which a piezoelectric substance is transformed by voltage application and a heating method by which a composition is boiled by a heater provided in the nozzle to be discharged, and both methods may be used. It is preferable that a distance between an object to be processed and a discharging opening of the nozzle be as short as possible in order to drop a droplet on a desired place. The distance is preferably set to be approximately 0.1 to 3 mm (more preferably 1 mm or less). One of the nozzle and the object to be processed moves while keeping the relative distance between the nozzle and the object to be processed to draw a desired pattern.

A step of discharging the conductive composition may be performed under a reduced pressure because the solvent of the composition is volatilized while the composition is discharged and reaches the object to be processed, and thus, subsequent steps of drying and baking can be omitted or shortened. In addition, by actively using a gas in which 10 to 30% of oxygen in a partial pressure ratio is mixed in a baking step of a composition containing a conductive material, resistivity of a conductive film forming the rear electrodes $E_0$ to $E_n$ can be reduced, and the conductive film can be thinned and planarized.

After the composition is discharged, one or both of drying step and baking step are performed under a normal pressure or a reduced pressure by laser light irradiation, rapid thermal annealing, heating using a heating furnace, or the like. For example, both of drying and baking are heat treatment steps, and drying is performed at 100° C. for 3 minutes and baking is performed at 200 to 350° C. for 15 to 120 minutes. Through this step, fusion and welding are accelerated by hardening and shrinking a peripheral resin, after the solvent in the composition is volatilized or the dispersant is chemically removed. This step is performed under an oxygen atmosphere, a nitrogen atmosphere, or the atmospheric air. However, an oxygen atmosphere in which a solvent in which a metal element is dissolved or dispersed is easily removed is preferable.

Nanopaste has a conductive particle having a grain diameter of 5 to 10 nm dispersed or dissolved in an organic solvent, and dispersant and a thermal curing resin which is referred to as a binder are also included. A binder has a function of preventing crack or uneven baking during baking. By a drying step or a baking step, evaporation of the organic solvent, decomposition removal of dispersant, and hardening shrinking by the binder are concurrently proceed; accordingly, nanoparticles are fused and/or welded to each other to be cured. In this case, the nanoparticles grow to be several tens nm to hundred and several tens nm. Adjacent growing particles are fused and/or welded to each other to be linked, thereby forming a metal hormogone. On the other hand, most of remaining organic constituents (about 80 to 90%) are pushed out of the metal hormogone; consequently, a conductive film containing the metal hormogone and a film including an organic constituent that covers an outer side thereof are formed. The film including organic constituent can be removed in baking a nanopaste under an atmosphere containing nitrogen and oxygen by reaction of oxygen contained in the atmospheric air and carbon, hydrogen or the like contained in a film formed of the organic constituent. In addition, in a case where oxygen is not contained in a baking atmosphere, the film including organic constituent can be removed by separately performing oxygen plasma treatment or the like. As described above, the organic constituent is removed by baking the nanopaste under an atmosphere containing nitrogen and oxygen or performing oxygen plasma treatment after drying; therefore, smoothing, thinning, and low resistance of a conductive film containing the remaining metal hormogone can be attempted. It is to be noted that, since a solvent in a composition is volatilized by discharging the composition containing a conductive material under a reduced pressure, time of subsequent heat treatment (drying or baking) can be shortened.

Such rear electrodes $E_0$ to $E_n$ are to be contacted with the n-type semiconductor layer $103c$ of the photoelectric conversion layer. This contact is ohmic contact. In addition, in order to further reduce contact resistance, the n-type semiconductor layer $103c$ may be formed using a semi-amorphous semiconductor, and the thickness thereof can be 30 to 80 nm.

The rear electrodes $E_0$ to $E_n$ are formed to be connected to the light-transmitting electrodes $T_1$ to $T_n$ in the openings $C_1$, $C_3$, $C_5$, ..., $C_{n-1}$, respectively. That is, the openings $C_1$, $C_3$, $C_5$, ..., $C_{n-1}$ are filled with the same material with that of the rear electrodes. In such a manner, the rear electrode $E_1$ is electrically connected to the light-transmitting electrode $T_2$, for example, and the rear electrode $E_{n-1}$ can be electrically connected to the light-transmitting electrode $T_n$. In other words, each of the rear electrodes can be electrically connected to the adjacent light-transmitting electrode to the rear electrode, and each of photoelectric conversion layers $K_1$ to $K_n$ can obtain electrical connection in series.

A sealing resin layer 104 is formed using an epoxy resin, an acrylic resin, or a silicone resin. In the sealing resin layer 104, openings 105 and 106 are formed over the rear electrodes $E_0$ and $E_n$, respectively, and the rear electrodes $E_0$ and $E_n$ can be connected to an external wiring in the openings 105 and 106.

Accordingly, a unit cell $U_n$ including the light-transmitting electrode $T_n$, the photoelectric conversion layer $K_n$, and the rear electrode $E_n$ is formed over the substrate 101, and the light-transmitting electrode $T_n$ is connected to the rear electrode $E_{n-1}$ adjacent to the light-transmitting electrode $T_n$ in the opening $C_{n-1}$, whereby n pieces of photoelectric conversion devices each of which has electrical connection in series can be manufactured. The rear electrode $E_0$ becomes an extraction electrode of the light-transmitting electrode $T_1$ in a unit cell $U_1$.

Figure 8:
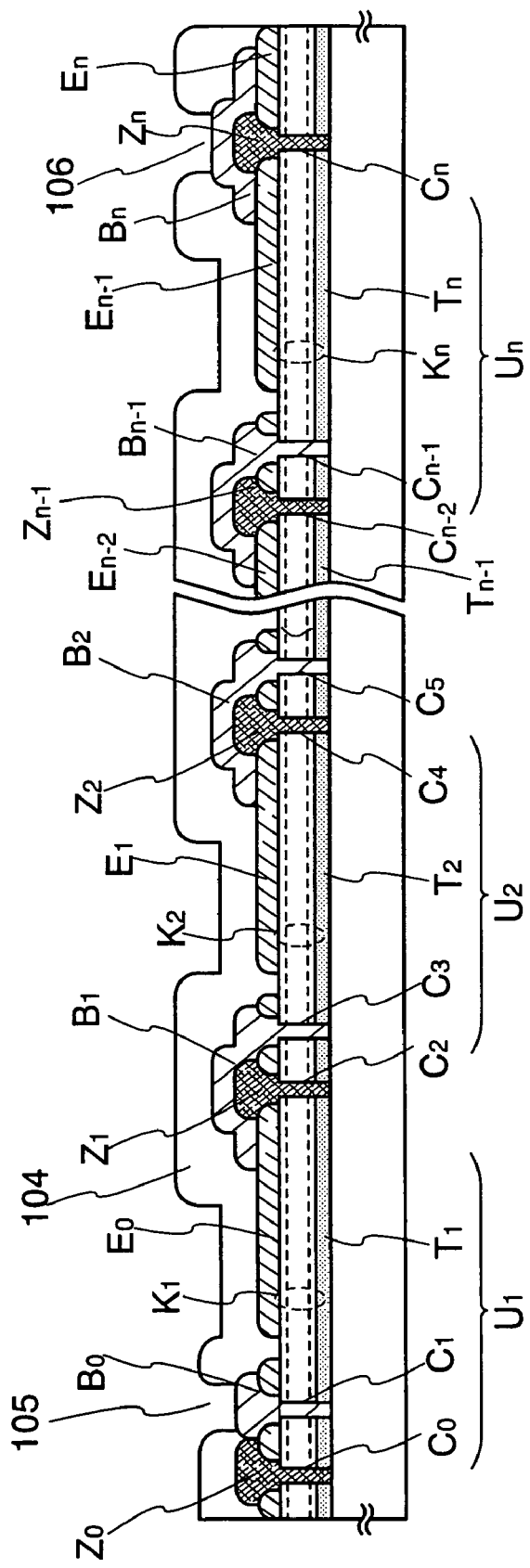
FIG. 8 is a cross-sectional view showing a step of manufacturing a photoelectric conversion device using a semi-amorphous semiconductor in a photoelectric conversion layer.

FIGS. 7A to 8 show another mode of a photoelectric conversion device. In FIG. 7A, a substrate 101, a light-transmitting electrode layer 102, and a photoelectric conversion layer 103 are formed similarly to the above-described thereof. Then, rear electrodes $E_1$ to $E_n$ are formed by a printing method over the photoelectric conversion layer 103.

As shown in FIG. 7B, openings $C_0$ to $C_n$ which penetrate the photoelectric conversion layer 103 and the light-transmitting electrode layer 102 are formed by a laser processing method. The openings $C_0$, $C_2$, $C_4$, ..., $C_{n-2}$, and $C_n$ are openings for insulating and separating unit cells, and the openings $C_1$, $C_3$, $C_5$, ..., $C_{n-1}$ are openings for forming connection between the light-transmitting electrode and the rear electrodes. In laser processing, residue may be left in the periphery of the openings. This residue is a spray of a processed material and undesirable because the spray heated up to a high temperature by laser light attaches to the surface of the photoelectric conversion layer 103 and damages the film. In order to prevent this, the rear electrodes are formed in accordance with patterns of the openings and then laser processing is performed; accordingly, at least damage to the photoelectric conversion layer 103 can be prevented.

The light-transmitting electrode layer 102 is divided into light-transmitting electrodes $T_1$ to $T_n$, and the photoelectric conversion layer 103 is divided into $K_1$ to $K_n$; thereafter, the openings $C_0$, $C_2$, $C_4$, ..., $C_{n-2}$, and $C_n$ are filled as shown in FIG. 7C. Then, insulating resin layers $Z_0$ to $Z_n$ with which end portions of the openings $C_0$, $C_2$, $C_4$, ..., $C_{n-2}$, and $C_n$, respectively are formed by a printing method such as a screen printing method.

Next, the openings $C_1$, $C_3$, $C_5$, ..., $C_{n-1}$ are filled as shown in FIG. 8, and wirings $B_0$ to $B_n$ which are connected to the light-transmitting electrodes $T_1$ to $T_n$, respectively, are formed by a screen printing method. The wirings $B_0$ to $B_n$ are formed of the same material with that of the rear electrodes, and here, a thermosetting carbon paste is used. Note that the wiring $B_n$ is formed over the insulating resin layer $Z_n$ and serves as an extraction wiring. In such a manner, the rear electrode $E_0$ has electrical connection with the light-transmitting electrode $T_2$, for example, and the rear electrode $E_{n-2}$ can obtain electrical connection with the light-transmitting electrode $T_n$. In other words, each of the rear electrodes can be electrically connected to the light-transmitting electrode adjacent thereto, and each of the photoelectric conversion layers $K_1$ to $K_n$ can obtain electrical connection in series.

Lastly, a sealing resin layer 104 is formed by a printing method. In the sealing resin layer 104, openings 105 and 106 are formed over the wirings $B_0$ and $B_n$, respectively, and the wirings are connected to an external wiring in these openings. Accordingly, a unit cell $U_n$ including the light-transmitting electrode $T_n$, the photoelectric conversion layer $K_n$, and the rear electrode $E_{n-1}$ is formed over the substrate 101, and the light-transmitting electrode $T_n$ is connected to the rear electrode $E_{n-2}$ adjacent thereto through the opening $C_{n-1}$, whereby n pieces of photoelectric conversion devices each of which has electrical connection in series can be manufactured. Note that the wiring $B_0$ is to be an extraction electrode of the light-transmitting electrode $T_1$ in a unit cell $U_1$.

In the photoelectric conversion device according to the present invention, the photoelectric conversion layer is formed of a semi-amorphous semiconductor. Therefore, a photoelectric conversion device in which a rate of deterioration in characteristics by light deterioration is hardly presence can be obtained.

FIG. 10 shows an optical sensor device as another mode of a photoelectric conversion device. This optical sensor device has a photoelectric conversion layer 225 in a light receiving portion and is provided with a function in which an output by the photoelectric conversion layer 225 is amplified by an amplifier circuit including a thin film transistor 211 and then outputted. The photoelectric conversion layer 225 and the thin film transistor 211 are provided over a substrate 201. As the substrate 201, a substrate having a light-transmitting property, such as a glass substrate, a quartz substrate, or a ceramic substrate can be used.

An insulating layer 202 including one or more of silicon oxide, silicon nitride oxide, silicon nitride, and silicon oxynitride is provided over the substrate 201 by a sputtering method or a plasma CVD method. The insulating layer 202 is provided for stress relaxation and preventing impurity contaminant. A crystalline semiconductor layer 203 constituting the thin film transistor 211 is provided over the insulating layer 202. A gate insulating layer 205 and a gate electrode 206 are provided over the crystalline semiconductor layer 203, which forms the thin film transistor 211.

An interlayer insulating layer 207 is provided over the thin film transistor 211. The interlayer insulating layer 207 may be formed of a single insulating film or a stacked of insulating layers of different materials. A wiring electrically connected to a source region and a drain region of the thin film transistor 211 is formed over the interlayer insulating layer 207. In addition, over the interlayer insulating layer 207, an electrode 221, an electrode 222, and an electrode 223, each of which is formed using the same material and the same steps with those of the wiring, are formed. The electrodes 221 to 223 are formed using a metal film, e.g., a low resistance metal film. Such a low resistance metal film can be an aluminum alloy, pure aluminum, or the like. Further, a three-layer structure as a stacked structure of such a low resistance metal film and a refractory metal film may be employed, in which a titanium film, an aluminum film, and a titanium film are sequentially stacked. In stead of a stacked structure of the refractory metal film and the low resistance film, the electrodes 221 to 223 can be formed of a single conductive film. Such a single conductive film may be formed of a single film of an element selected from titanium, tungsten, tantalum, molybdenum, neodymium, cobalt, zirconium, zinc, ruthenium, rhodium, palladium, osmium, iridium, or platinum; a single film using an alloy material or a compound material containing the aforementioned element as its main component; or a single film using nitride of the aforementioned element, e.g., titanium nitride, tungsten nitride, tantalum nitride, or molybdenum nitride.

The interlayer insulating layer 207, the gate electrode layer 205, and the insulating layer 202 are subjected to etching processing so as to have end portions in a tapered shape. By processing the interlayer insulating layer 207, the gate insulating layer 205, and the insulating layer 202 to have end portions into a tapered shape, coverage with a protective layer 227 formed over these insulating layers becomes improved, and effect that moisture, impurities, and the like hardly intrudes can be obtained.

A p-type semiconductor layer 103a, an i-type semiconductor layer 103b, and an n-type semiconductor layer 103c are formed over the interlayer insulating layer 207. Note that the p-type semiconductor layer 103a is at least partly contacted with the electrode 222. The p-type semiconductor layer 103a, the i-type semiconductor layer 103b, and the n-type semiconductor layer 103c are similar to those described in FIGS. 5A to 8. The protective layer 227 is formed of, for example, silicon nitride over the photoelectric conversion layer 225. The protective layer 227 can prevent moisture and impurities such as organic substances from being mixed into the thin film transistor 211 and the photoelectric conversion layer 225. An interlayer insulating layer 228 formed using an organic resin material such as polyimide or acryl is provided over the protective layer 227. An electrode 231 is provided over the interlayer insulating layer 228, which is electrically connected to the electrode 221. An electrode 232 is provided, which is electrically connected to an upper layer of the photoelectric conversion layer 225 (the n-type semiconductor layer 103c) and the electrode 223 through a contact hole in the interlayer insulating layer 228 and the protective layer 227. As the electrodes 231 and 232, tungsten, titanium, tantalum, silver, or the like can be used.

An interlayer insulating layer 235 is provided over the interlayer insulating layer 228 by a screen method or an ink-jet method, using an organic resin material such as an epoxy resin, polyimide, acryl, or a phenol resin. The interlayer insulating layer 235 is provided with openings over the electrode 231 and the electrode 232. Over the interlayer insulating layer 235, an electrode 241 that is electrically connected to the electrode 231 and an electrode 242 that is electrically connected to the electrode 232 are provided by a printing method, for example, using a nickel paste.

Such a photoelectric conversion device serving as an optical sensor has a photoelectric conversion layer formed of a semi-amorphous semiconductor. Therefore, the photoelectric conversion device, in which characteristics are hardly reduced by light deterioration, can be obtained. In FIG. 10, the optical sensor device is shown in which the photoelectric conversion layer 225 is provided in the light receiving portion and an output by the photoelectric conversion layer 225 is amplified by the amplifier circuit including the thin film transistor 211 and then outputted. However, if the structure according to the amplifier circuit is omitted, the device can be used as an optical sensor.

EMBODIMENT MODE 2

Figure 11A:
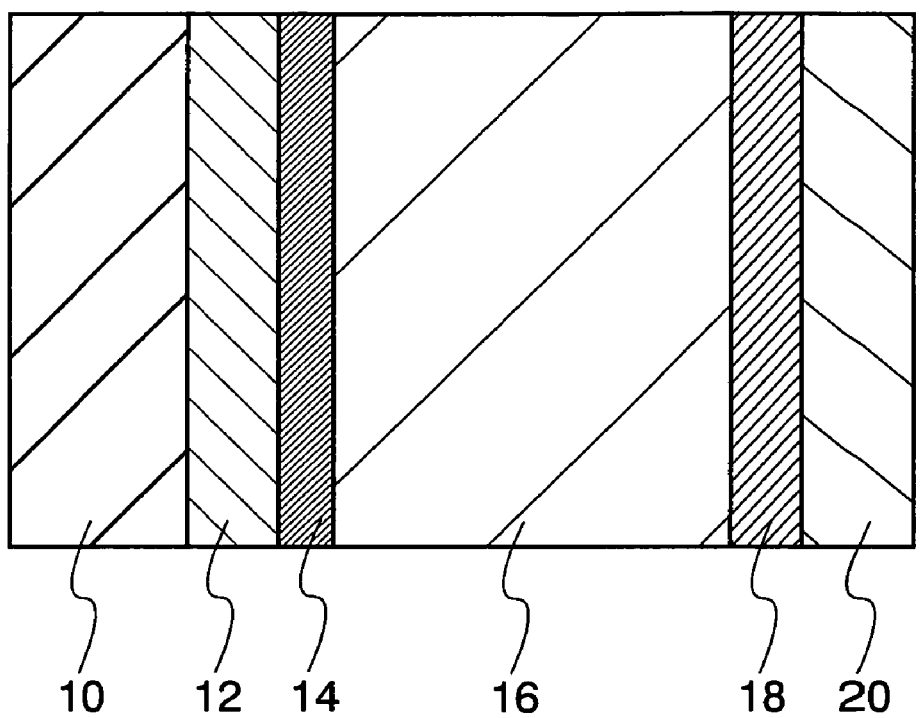
FIGS. 11A and 11B are diagrams each showing a photoelectric conversion device using a semi-amorphous semiconductor in a photoelectric conversion layer.

FIG. 11A shows a structure of a photoelectric conversion device according to this embodiment mode. In this photoelectric conversion device, an i-type semiconductor layer 16 is provided between a p-type semiconductor layer 14 and an n-type semiconductor layer 18, whereby at least one semiconductor junction is included. A layer including the p-type semiconductor layer 14, the n-type semiconductor layer 18, and the i-type semiconductor layer 16, that is, a photoelectric conversion layer, is formed of a semi-amorphous semiconductor layer.

A substrate 10 can be various glass substrates described in Embodiment Mode 1. In a case where light enters from the substrate 10 side, a first electrode 12 can be formed of a transparent conductive material such as indium oxide, indium tin oxide, or zinc oxide as described in Embodiment Mode 1. On the other hand, in a case where the first electrode 12 is a reflective electrode, the first electrode 12 can be formed of a metal material such as aluminum, silver, titanium, or tantalum described in Embodiment Mode 1. In such a case where the first electrode 12 is a reflective electrode, reflectivity can be improved by providing depressions and projections on a surface of the electrode, which is preferable.

Similarly to Embodiment Mode 1, the p-type semiconductor layer 14 is formed of a semi-amorphous semiconductor or an amorphous semiconductor including boron as an impurity imparting one conductivity type. In order to reduce light absorption loss, carbon may be included in the p-type semiconductor layer 14 so that the optical gap is extended.

Similarly to Embodiment Mode 1, the i-type semiconductor layer 16 is an intrinsic semiconductor, which is formed of a semi-amorphous semiconductor (typically, semi-amorphous silicon), to which an impurity imparting p-type conductivity may be added.

Similarly to Embodiment Mode 1, the semi-amorphous semiconductor is formed by exciting a semiconductor material gas typified by silane into a plasma state by an electromagnetic energy in a microwave band and depositing a product. In this embodiment mode, pressure for generating plasma may be in the range of $1\times10^{-1}$ to $1\times10^5$ Pa, preferably, $1\times10^2$ to $1\times10^4$ Pa, more preferably, $3\times10^2$ to $4\times10^3$ Pa, and furthermore preferably, $6\times10^2$ to $2\times10^3$ Pa. When plasma is generated in such a pressure range, the radical reaction proceeds in the vapor phase, and the deposition rate is improved with the reaction on a surface of the film. In this case, a microwave is discharged with pulse of 1 to 100 kHz, whereby the gas phase reaction is controlled, and the abnormal growth in the vapor phase can be suppressed. In this embodiment mode, the substrate heating temperature is preferably 500° C. or lower, and the substrate heating temperature of 100° C. to 400° C. is recommended.

Similarly to Embodiment Mode 1, the n-type semiconductor layer 18 is formed of a semi-amorphous semiconductor or an amorphous semiconductor including phosphorus as an impurity imparting one conductivity type. A second electrode 20 over the n-type semiconductor layer 18 is formed using a metal material similar to that in Embodiment Mode 1. In a case where light is entered from the second electrode 20 side, the second electrode 20 is formed of a transparent conductive film material.

Although FIG. 11A illustrates the structure of the photoelectric conversion layer including the p-type semiconductor layer 14, the i-type semiconductor layer 16, and the n-type semiconductor layer 18, another structure of a semiconductor junction constituting the photoelectric conversion layer can be employed, similarly to Embodiment Mode, in addition to this PIN junction of FIG. 11A.

Figure 11B:
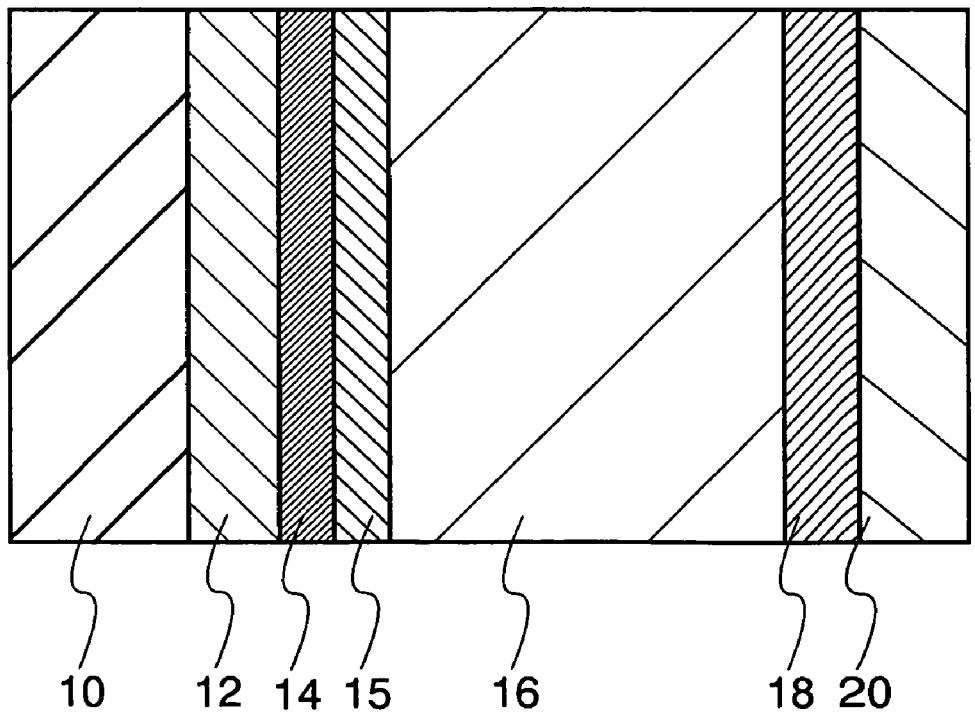

FIG. 11B shows a structure in which a $p^-$-type semiconductor layer 15 is provided between the p-type semiconductor layer 14 and the i-type semiconductor layer 16. The $p^-$-type semiconductor layer 15 has lower concentration of an impurity imparting p-type conductivity than that of the p-type semiconductor layer 14. The $p^-$-type semiconductor layer 15 is provided between the p-type semiconductor layer 14 and the i-type semiconductor layer 16, whereby a carrier-transporting property in an interface of a semiconductor junction is improved. The p-type impurities in the $p^-$-type semiconductor layer 15 is distributed so that concentration thereof is decreased in stepwise or continuously from the p-type semiconductor layer 14 to the i-type semiconductor layer 16, whereby a carrier-transporting property is further improved. Further, an interface level density is reduced and the diffusion potential is improved by this structure, whereby an open circuit voltage of the photoelectric conversion device is increased. The $p^-$-type semiconductor layer 15 in such a junction structure can be formed of a semi-amorphous semiconductor or an amorphous semiconductor. The semi-amorphous semiconductor is preferably used because a diffusion length of minority carriers is longer than that in an amorphous semiconductor.

Figure 12A:
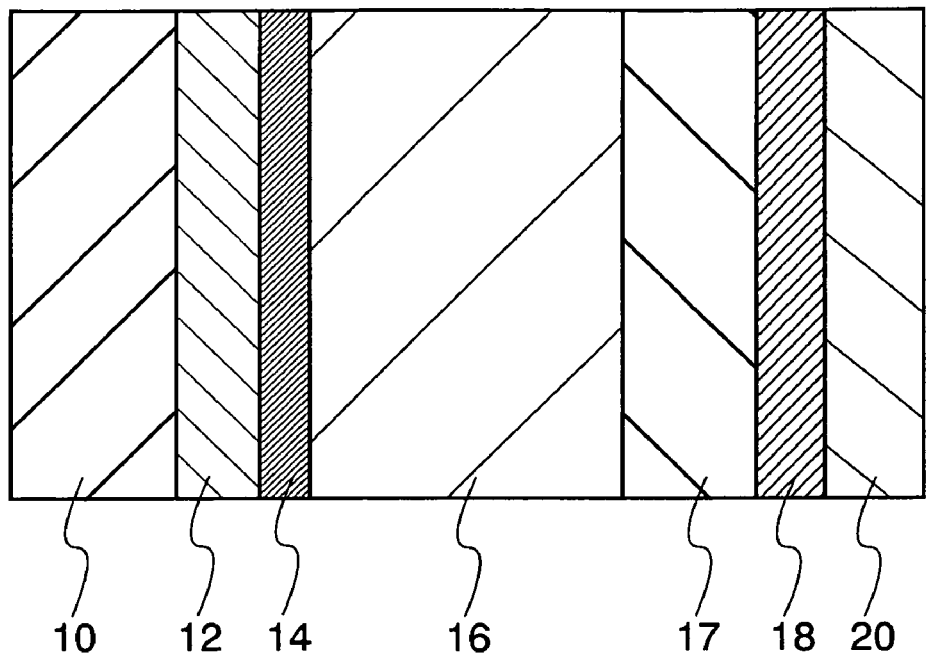
FIGS. 12A and 12B are diagrams each showing a photoelectric conversion device using a semi-amorphous semiconductor in a photoelectric conversion layer.

FIG. 12A shows a structure in which an i'-type semiconductor layer 17 formed of an amorphous semiconductor is provided between the i-type semiconductor layer 16 and the n-type semiconductor layer 18. Although the i'-type semiconductor layer 17 is an intrinsic semiconductor layer similar to the i-type semiconductor layer 16, it is different from the i-type semiconductor layer 16 in that the i'-type semiconductor layer 17 does not have crystallinity. The i'-type semiconductor layer 17 is a layer for absorbing light that has not been absorbed by the i-type semiconductor layer 16 (in a case where external light enters from the substrate 10 side). Although an optical gap of the i-type semiconductor layer 16 is about 1.4 eV whereas an optical gap of the i'-type semiconductor layer 17 is 1.6 to 1.8 eV, an absorption coefficient in a visible light region of the i'-type semiconductor layer 17 is higher than that of the i-type semiconductor layer 16. Therefore, it is possible that the i'-type semiconductor layer 17 absorbs light that has not been absorbed by the i-type semiconductor layer 16. The thickness of the i'-type semiconductor layer 17 may be one tenth to half of the thickness of the i-type semiconductor layer 16. Among photogenerated carriers of the i'-type semiconductor layer 17, holes flow to the p-type semiconductor layer 14 side. At this time, the holes pass through the i-type semiconductor layer 16 having a high carrier-transporting property, whereby loss of recombination can be reduced. In other words, according to this embodiment mode, photoelectric current can be increased.

Figure 12B:
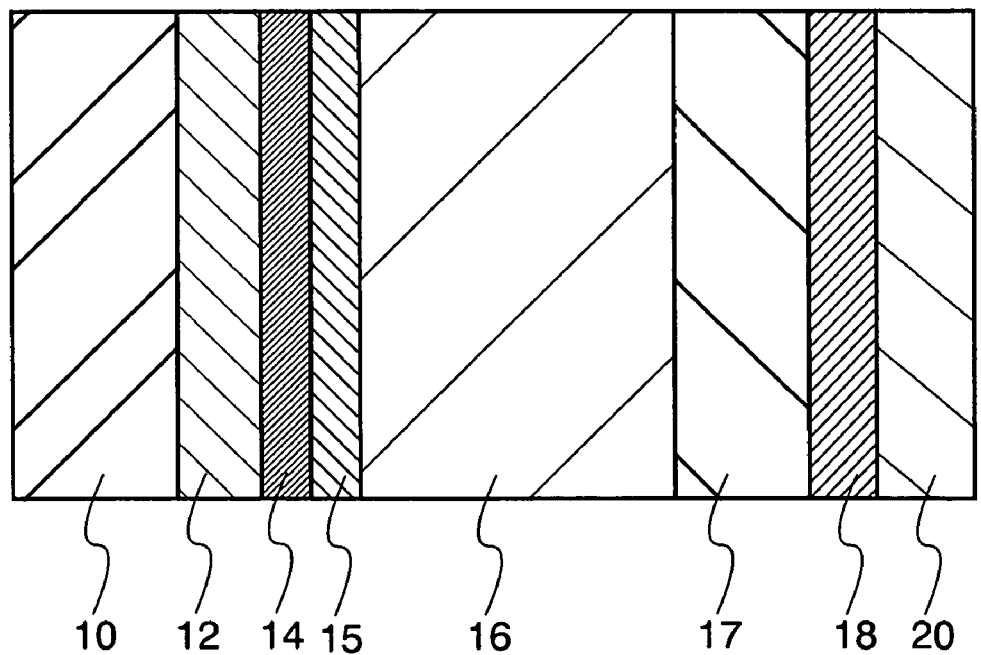

FIG. 12B shows a structure in which a $p^-$-type semiconductor layer 15 is provided between the p-type semiconductor layer 14 and the i-type semiconductor layer 16 and an i'-type semiconductor layer 17 formed of an amorphous semiconductor is provided between the i-type semiconductor layer 16 and the n-type semiconductor layer 18. An interface level density is reduced and the diffusion potential is improved by this structure, whereby an open circuit voltage of the photoelectric conversion device can be increased, and photoelectric current can be increased. A semi-amorphous semiconductor or an amorphous semiconductor can be used for the $p^-$-type semiconductor layer 15, which is similar to FIG. 11B.

In such a photoelectric conversion device similarly to Embodiment Mode 1, it is preferable that each layer of the photoelectric conversion layer be formed in succession without making each interface to be exposed to the atmospheric air. An apparatus that is suitable for forming a semi-amorphous semiconductor film but different from the apparatus of Embodiment Mode 1 is exemplified below. As a matter of course, a photoelectric conversion layer of this embodiment mode can be formed using the similar apparatus to that of Embodiment Mode 1.

Figure 13:
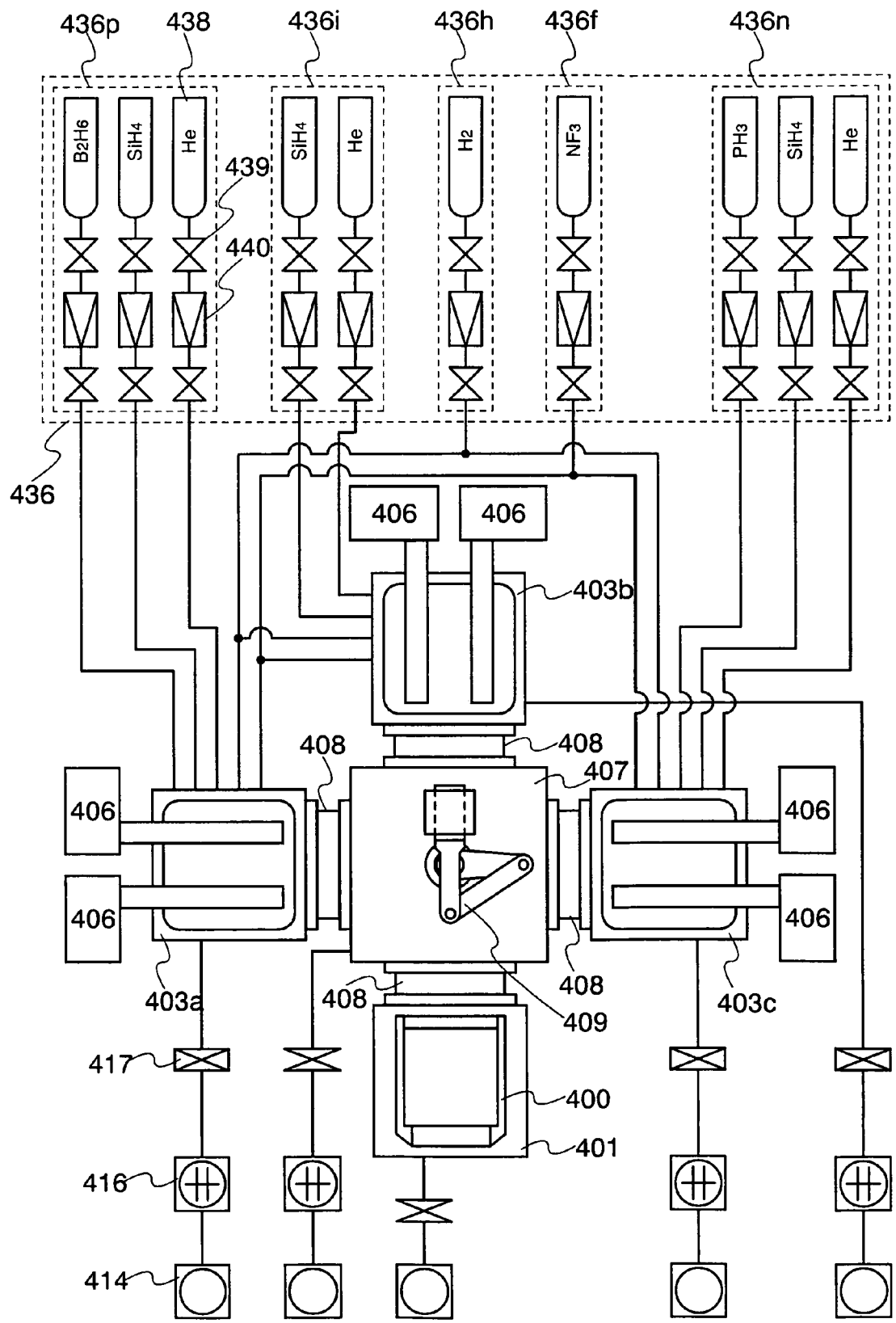
FIG. 13 is a diagram showing a structure of a microwave plasma CVD apparatus of a multi-chamber system provided with a plurality of treatment chambers.

FIG. 13 shows an example of a microwave plasma CVD apparatus of a multi-chamber system provided with a plurality of treatment chambers. This apparatus includes a load/unload chamber 401, a treatment chamber (1) 403a, a treatment chamber (2) 403b, and a treatment chamber (3) 403c around a common chamber 407. A p-type semiconductor layer is formed in the treatment chamber (1) 403a, an i-type semiconductor layer is formed in the treatment chamber (2) 403b, and an n-type semiconductor layer is formed in the treatment chamber (3) 403c. Note that treatment chambers for forming the $p^-$-type semiconductor layer and the i'-type semiconductor layer shown in FIGS. 11A to 12B may also be provided.

A substrate to be processed is transferred to each treatment chamber through the common chamber 407. Gate valves 408 are provided between the common chamber 407 and each chamber so that treatment conducted in each chamber does not interfere with each other. The substrate is placed in the load/unload chamber 401 and a cassette 400 which is provided in the load/unload chamber 401 and transferred to the treatment chamber (1) 403a, the treatment chamber (2) 403b, and the treatment chamber (3) 403c by a transfer unit 409 of the common chamber 407. In this apparatus, a treatment chamber can be provided for each kind of films to be deposited, and a plurality of different kinds of films can be formed in succession without being exposed to the atmospheric air. A rotary pump 414 and a turbo molecular pump 416 are connected to each treatment chamber as evacuation units.

Each treatment chamber is provided with a plasma generation unit 406, and the plasma generation unit 406 includes an oscillator that generates plasma in the treatment chamber. For example, the plasma generation unit is constituted by a microwave power supply and a waveguide that leads a microwave to the treatment chamber. Each of gas supply units 436 connected to the treatment chambers includes a cylinder 438 filled with a process gas such as a semiconductor material gas or a rare gas, a valve 439, a mass flow controller 440, and the like. The gas supply unit 436 is provided for each treatment chamber. In addition, a gas supply unit 436p is connected to the treatment chamber (1) 403a to supply a gas for the p-type semiconductor layer. A gas supply unit 436i is connected to the treatment chamber (2) 403b to supply a gas for the i-type semiconductor layer. A gas supply unit 436n is connected to the treatment chamber (3) 403c to supply a gas for the n-type semiconductor layer. A gas supply unit 436h supplies hydrogen, and a gas supply unit 436f supplies an etching gas used for cleaning the inside of the treatment chambers. Thus, the gas supply units 436h and 436f are provided in common for each treatment chamber.

Figure 14:
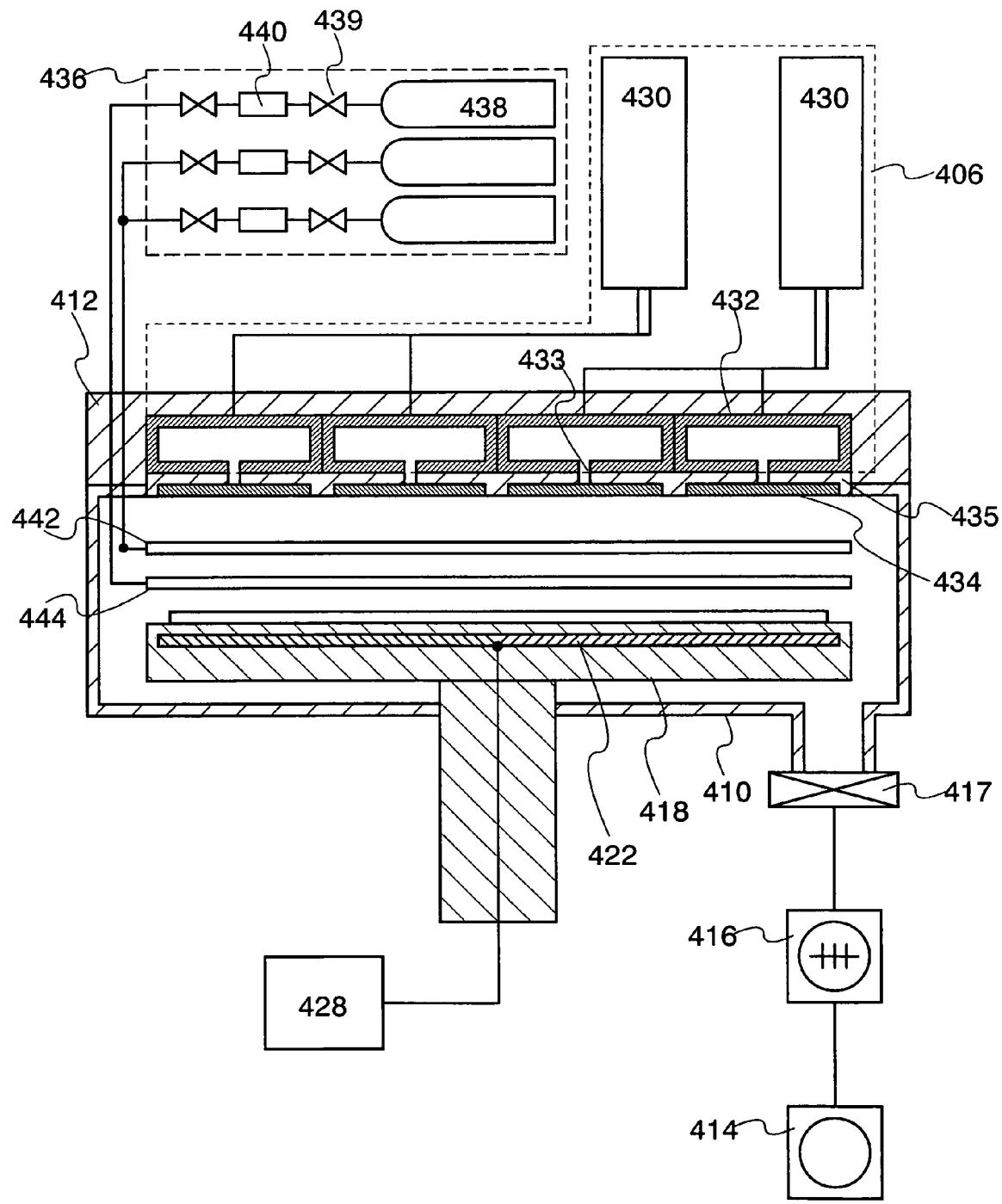
FIG. 14 is a diagram describing a structure of a treatment chamber in a microwave plasma CVD apparatus of a multi-chamber system provided with a plurality of treatment chambers.

FIG. 14 is a diagram for describing an example of a treatment chamber in detail. FIG. 14 shows a cross-sectional structure of a treatment chamber. The treatment chamber is constituted by a treatment container 410 and a cover 412 and has a sealed structure so that the inside can be kept in a reduced pressure. The treatment container 410 is, for example, formed of metal such as stainless steel or aluminum.

In order to keep the inside of the treatment chamber in a reduced pressure, the rotary pump 414 that is a low vacuum evacuation unit and the turbo molecular pump 416 that is a high vacuum evacuation unit are connected to the treatment container 410. The rotary pump 414 performs vacuum evacuation to have a degree of 0.1 Pa from the atmospheric air, approximately. For example, the rotary pump is constituted by a dry pump. The turbo molecular pump 416 performs high vacuum evacuation to be 0.1 Pa or less. A pressure adjustment valve 417 that is connected to the turbo molecular pump 416 in series adjusts conductance of gas flow and operates to keep the pressure in the treatment chamber within a predetermined range by adjusting the exhaust velocity of a reaction gas supplied from a gas supply unit 436.

A susceptor 418 in which an object to be processed such as the substrate is placed is provided in the treatment chamber 410. The susceptor 418 is formed of a ceramic material such as aluminum nitride, silicon nitride, or silicon carbide. A heater 422 is provided inside the susceptor 418. The heater 422 is connected to a heater power supply 428. The heater 422 is embedded in the susceptor 418 and is heated by supplying power from the heater power supply 428. Such heater 422 keeps the substrate that is placed on the susceptor 418 at a predetermined temperature.

Figure 15:
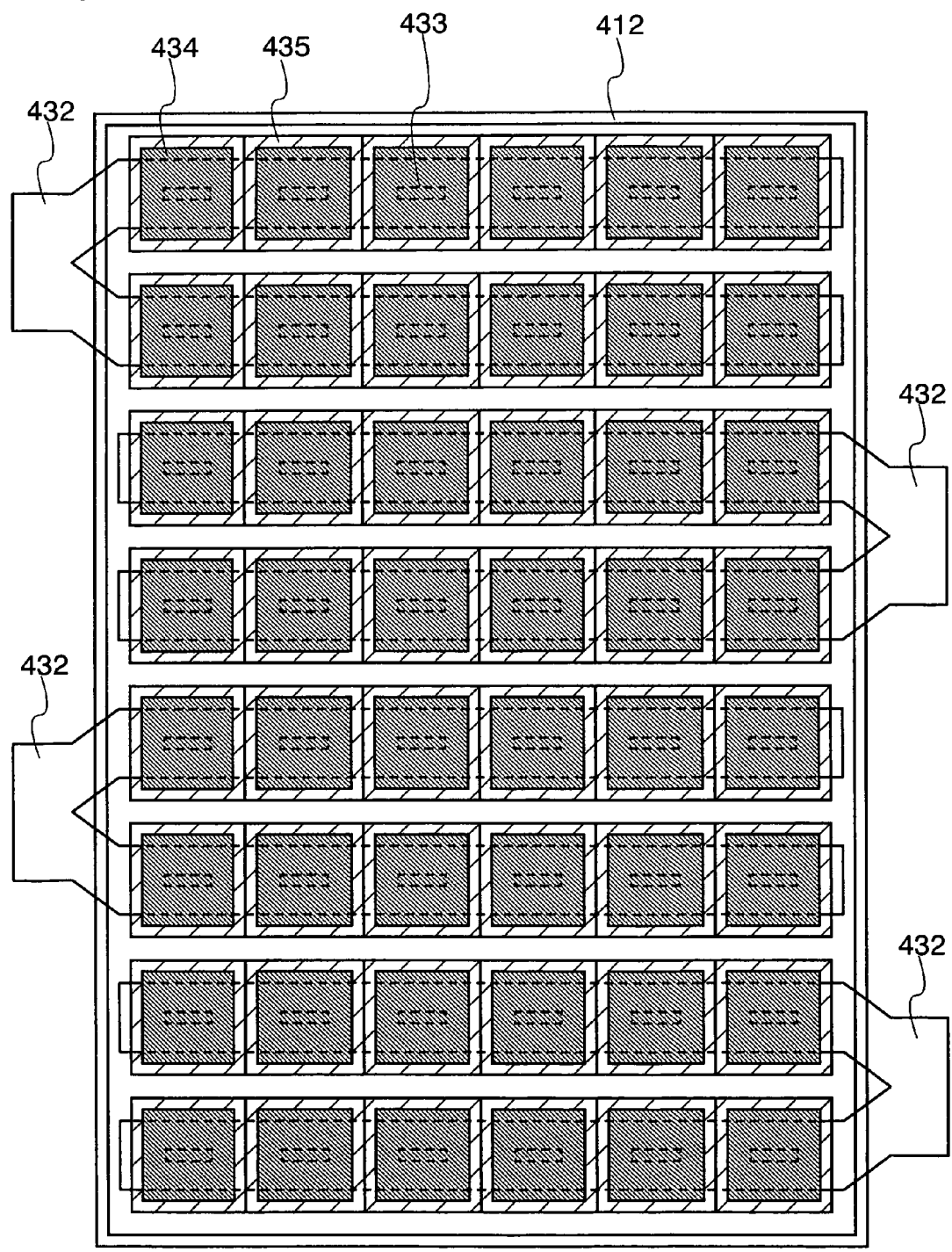
FIG. 15 is a plane view showing a structure of a treatment chamber in a microwave plasma CVD apparatus of a multi-chamber system provided with a plurality of treatment chambers.

The cover 412 is provided to seal an upper part of the treatment container 410. In the cover 412, a waveguide 432 is arranged so as to be in contact with a top plate 435. The waveguide 432 is connected to a microwave power supply 430. A slit 433 is provided in the waveguide 432 and the top plate 435 so as to leak the microwave. The slit 433 is blocked using a dielectric plate 434, and thus, airtightness in the treatment container 410 is held. The microwave is introduced into the treatment container 410 through the dielectric plate 434, so that plasma is generated FIG. 15 is a plain view showing a structure of a cover 412 plurality of waveguides 432 are arranged in parallel to the top plate 435. The dielectric plates 434 are arranged in matrix with respect to the top plate 435. The slit 433 provided for each waveguide 432 and each top plate 435 is provided corresponding to positions of each dielectric plate 434. When the substrate to be processed has a large area (e.g., a case of applying a glass substrate of 730 mm×920 mm or a glass substrate of a size which has one side exceeds 1 m), the waveguide 432 is preferably divided into a plurality and a microwave is supplied. FIG. 15 shows a structure in which branch waveguides are used at an end portion of each waveguide 432, and the microwaves divided into a plurality are supplied. The microwave power supply is connected to the tip of each branch waveguide. Use of a plurality of microwave power supplies makes it possible to keep uniformity of plasma even when the area of the substrate to be processed becomes large.

In FIG. 14, the gas supply unit 436 includes a cylinder 438 filled with a treatment gas, a valve 439, a mass flow controller 440, and the like. A treatment gas whose flow rate is adjusted by the mass flow controller 440 is introduced into the treatment container 410. The cylinder 438 is filled with a gas needed for formation of a semi-amorphous semiconductor. The treatment gas needed for formation includes a semiconductor material gas such as silane or disilane; and at least one of hydrogen, fluorine, and a rare gas such as helium or argon, each of which dilutes the semiconductor material gas. In the treatment container 410, a gas supply nozzle (upper side) 442 and a gas supply nozzle (lower side) 444 are provided, and the treatment gas flows out into the treatment container 410 from the nozzles. For example, at least one of hydrogen, fluorine, and a rare gas such as helium or argon is supplied in the gas supply nozzle (upper side) 442, a high density radical is generated in the vicinity of the dielectric plate 434 in which the microwave is introduced, and a surface reaction is promoted on a surface where the semi-amorphous semiconductor is grown over the substrate to be processed. A semiconductor material gas for film deposition is supplied in the gas supply nozzle (lower side) 444. In such a manner, by separating a gas supply path, deposition of film to the dielectric plate 434 can be suppressed. In the step of film formation, hydrogen, fluorine, or a rare gas such as helium or argon may be continuously supplied from the gas supply nozzle (upper side) 442.

Figure 16:
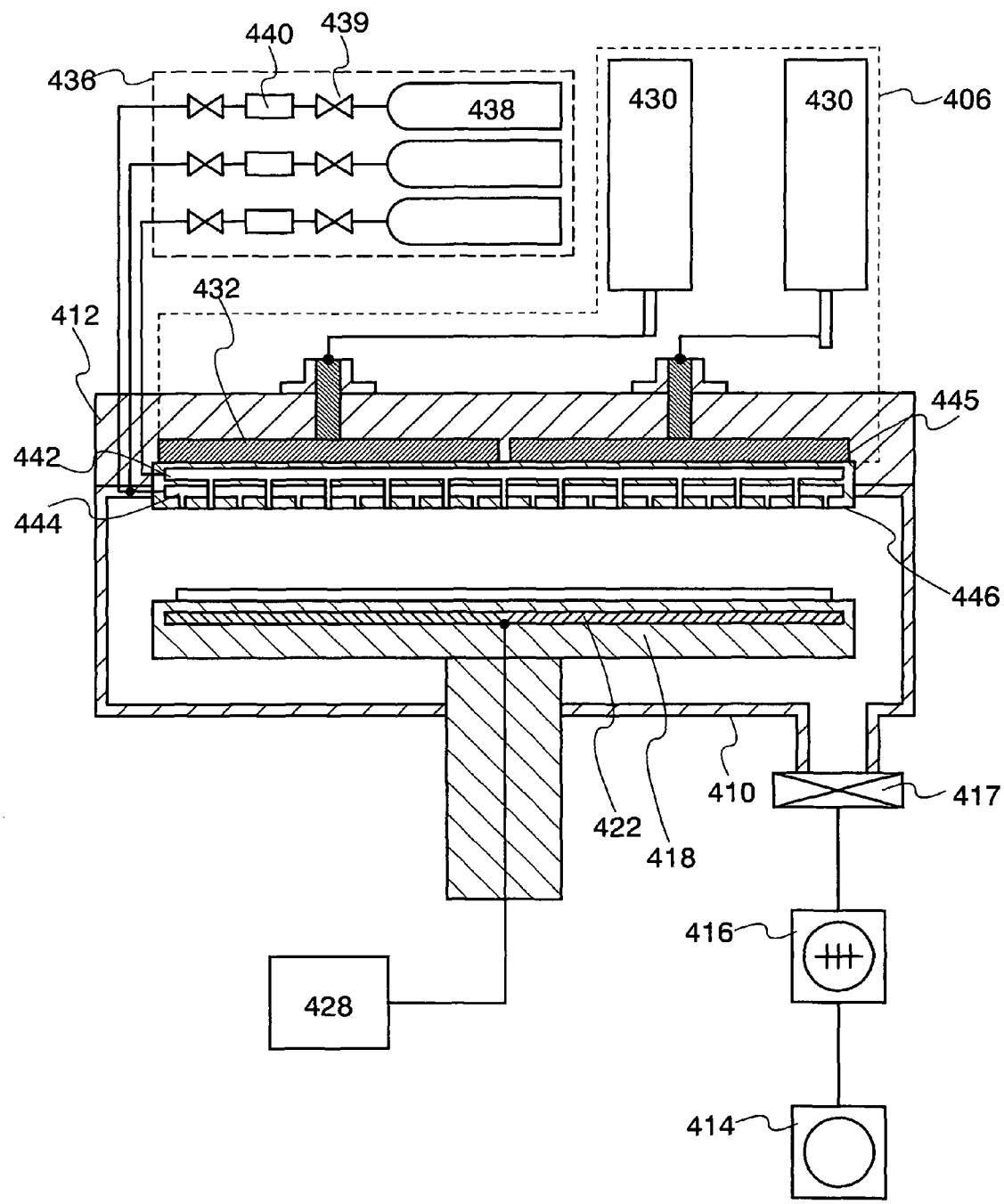
FIG. 16 is a diagram describing a structure of a treatment chamber in a microwave plasma CVD apparatus of a multi-chamber system provided with a plurality of treatment chambers.

FIG. 16 shows another structure of a treatment chamber in which a microwave antenna 445 emitting a microwave and a shower-type dielectric plate 446 transmitting the microwave are combined. The other parts of structure of the treatment chamber is similar to that of FIG. 14, and the treatment chamber is constituted by the treatment container 410 and the cover 412 and has a sealed structure in which the inside can be kept in the reduced pressure. The microwave antenna 445 is connected to the external microwave power supply 430 through the waveguide. The microwave antenna 445 is provided with a radiation plate formed using a conductor provided with a plurality of slots. A microwave with a frequency of several gigahertzes is introduced from the microwave antenna 445, whereby high density plasma is generated in the treatment container 410. Since plasma to be generated has low electron temperature (3 eV or less, preferably, 1.5 eV or less), a surface where a film is grown is hardly damaged, and growth of the film is promoted by the surface reaction of a high density radical due to the high electron density ($1\times10^{11}$ $cm^{-3}$ or more). The shower-type dielectric plate 446 is connected to the gas supply unit 436. The shower-type dielectric plate 446 is provided with the gas supply nozzle (upper side) 442 and the gas supply nozzle (low power) 444 and has a structure in which a treatment gas flows out into the treatment container 410 from the nozzles. For example, at least one of a hydrogen, fluorine, and a rare gas such as helium or argon is supplied in the gas supply nozzle (upper side) 442, and a high density radical is generated in the vicinity of the dielectric plate 446 in which the microwave is introduced, so that the surface reaction is promoted on a surface where a semi-amorphous semiconductor is grown over a substrate to be processed. A semiconductor material gas for deposition of the film is supplied in the gas supply nozzle (lower side) 444. In the case of FIG. 16, the microwave antenna 445 is divided into a plurality, and a microwave power supply is supplied to each microwave antenna 445, whereby uniform plasma can be generated to a large-sized substrate, which makes it possible to form a photoelectric conversion layer over the large-sized substrate.

By the plasma CVD apparatus having such a structure, a reaction gas that is a treatment gas is introduced into the treatment chamber where the substrate is placed, and a microwave is introduced into the treatment chamber through a slit provided for the waveguide that is disposed in approximately parallel to and opposed to the substrate, thereby generating plasma, so that a photoelectric conversion layer formed of a semi-amorphous semiconductor can be formed over the substrate.

In a case where a semi-amorphous semiconductor is formed using the plasma CVD apparatus having the above-described structure, it is preferable to use helium when plasma is generated in the treatment chamber. Helium has an ionization energy of 24.5 eV which is the highest ionization energy in all gases, but helium has a metastable state in a level of about 20 eV which is a little lower than the level of the ionization energy. Thus, only about 4 eV that is a difference of level between the ionization energy and the metastable state is needed for ionization while maintaining discharge. Therefore, a discharge starting voltage of helium shows the lowest value in all gases. In accordance with such characteristics, helium can hold discharge stably. Further, uniform discharge can be obtained; therefore, a uniform film can be deposited even when an area of a substrate over which the semi-amorphous semiconductor layer is deposited is increased.

In a case where a PIN junction is formed as a structure of the photoelectric conversion layer, treatment chambers each corresponding to different semi-amorphous semiconductor layers are preferably provided in a microwave plasma CVD apparatus. In this case, first, a first reaction gas is introduced into the treatment chamber (1) 403a in which a substrate (a substrate where a first electrode is formed) is placed, and a microwave is introduced into the treatment chamber (1) 403a through a slit provided for the waveguide that is disposed in approximately parallel to and opposed to the substrate, thereby generating plasma, so that a first semi-amorphous semiconductor layer (a p-type semiconductor layer) is formed over the substrate. Next, the substrate is transferred from the treatment chamber (1) 403a to the treatment chamber (2) 403b without being exposed to the atmospheric air, a second reaction gas is introduced into the treatment chamber (2) 403b in which the substrate is placed, and a microwave is similarly introduced to generate plasma, so that a second amorphous semiconductor layer (an i-type semiconductor layer) is formed over the first semi-amorphous semiconductor layer. Then, the substrate is transferred from the treatment chamber (2) 403b to the treatment chamber (3) 403c without being exposed to the atmospheric air, a third reaction gas is introduced into the treatment chamber (3) 403c in which the substrate is placed, and a microwave is similarly introduced to generate plasma, so that a third semi-amorphous semiconductor layer (an n-type semiconductor layer) is formed over the second semi-amorphous semiconductor layer. Here, a case in which the number of the treatment chambers is three corresponding to the number of layers stacked is exemplified.

The treatment chambers for forming the photoelectric conversion layer can be subjected to plasma cleaning treatment by introducing an etching gas. As an etching gas, nitrogen trifluoride ($NF_3$), sulfur hexafluoride ($SF_6$), or the like is used. After the plasma cleaning treatment, in order to reduce influence of a remaining component such as fluorine remaining in the treatment chamber, each treatment chamber is preferably covered with a silicon film. The silicon film is formed by generating plasma by introducing a silane gas into the treatment chamber. Note that the inner wall of the treatment chamber for forming an impurity semiconductor layer may be covered with an impurity semiconductor film. For example, the inner wall of the treatment chamber in which a p-type semiconductor layer is formed may be covered with a p-type semiconductor film. The inner wall of the treatment chambers are each covered with a silicon film after the plasma cleaning treatment in such a manner, whereby degassing from the inner wall can be reduced. By generating plasma by introduction of a silane gas, oxygen, moisture, and the like remaining in the treatment chambers are reacted with the silane gas and evacuated toward the outside of the treatment chambers to make a vacuum state. Thus, clean level in the treatment chambers can be improved. Before formation of each layer of the photoelectric conversion layer is started not after plasma cleaning treatment, clean level in the treatment chambers can be similarly improved by making a silane gas flow in the treatment chambers.

Note that the number of treatment chambers may be set according to the number of layers to be stacked. For example, in a case of providing the $p^-$-type semiconductor layer 15 between the p-type semiconductor layer 14 and the i-type semiconductor layer 16 as shown in FIG. 11B, a treatment chamber may be newly added. In the case of providing the $p^-$-type semiconductor layer 15, concentration of a diborane gas supplied with a silane gas as a semiconductor material gas may be controlled at about less than 1 ppm, and self doping may be utilized as another method. This is a method in which the inside of the treatment chamber is covered with a p-type impurity semiconductor, and thus a minute amount of p-type impurity (such as boron) is taken during film formation, so that the $p^-$-type semiconductor layer 15 can be formed.

Figure 17:
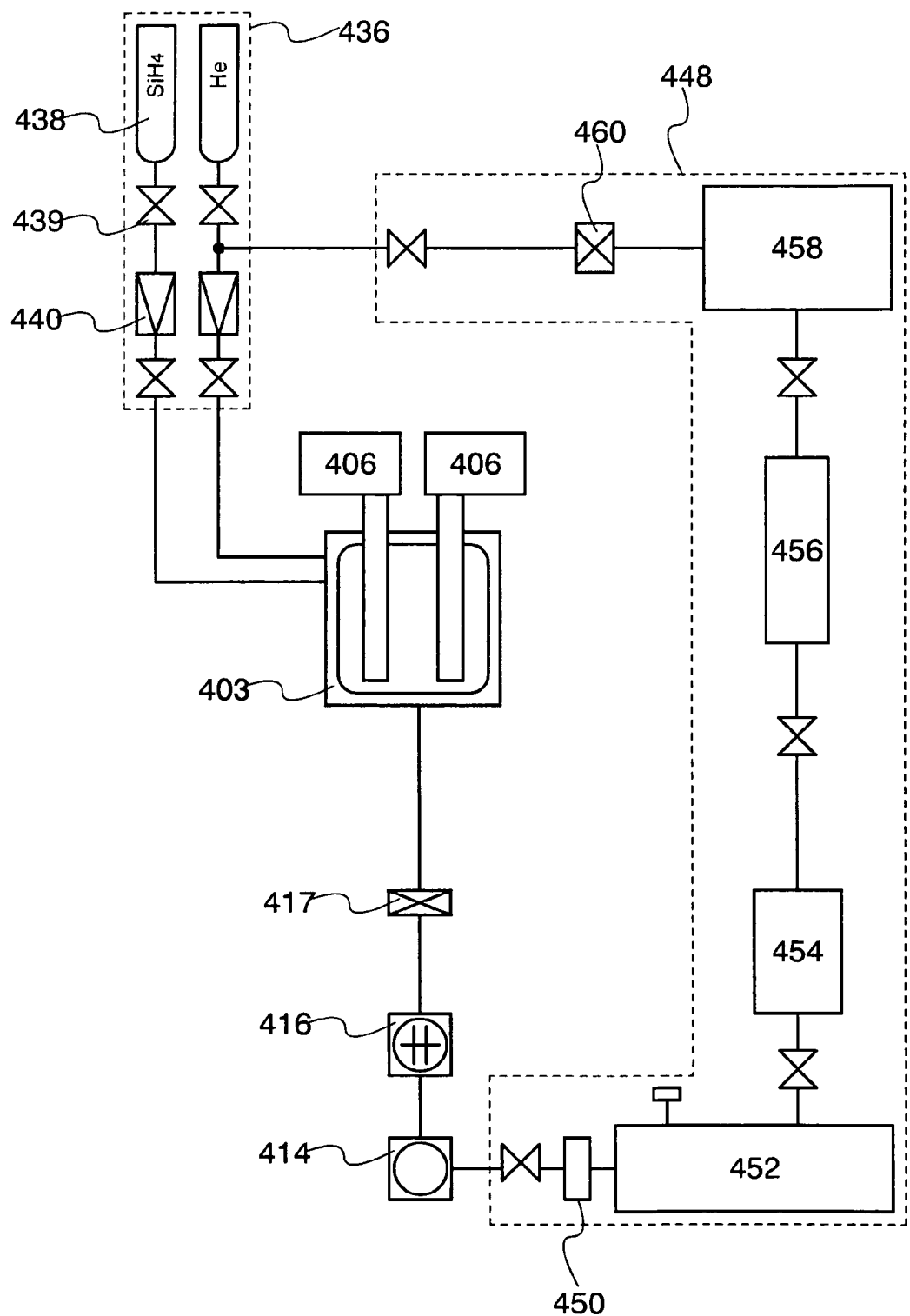
FIG. 17 is a diagram showing a structure of a gas purification circulator in a plasma CVD apparatus.

The semi-amorphous semiconductor layer is formed by high-density plasma, using a mixture of silane (in the case of forming an impurity semiconductor, a doping gas is added in addition to silane) and a dilution gas (a gas including hydrogen, or a rare gas, or a combination thereof and hereinafter, referred to as a hydrogen and/or a rare gas). Silane is diluted using hydrogen and/or a rare gas to be 10 to 2000 times thinner. Therefore, a large amount of hydrogen and/or a rare gas is needed. The gas supplied in formation of the semi-amorphous semiconductor can be reused by being collected. FIG. 17 shows an example of a gas purification circulator 448 that is applied for a plasma CVD apparatus. The gas purification circulator 448 collects and purifies a semiconductor material gas such as silane or a rare gas such as helium. The used gas which is exhausted from the rotary pump 414 is stored in a collected gas container 452 after fine particles included in the used gas are removed by a filter 450. After the used gas is stored in the recovery gas container 452, the gas is boosted by a boosting unit 454, and only a rare gas such as helium in the gas is separated by a separator 456. As a system of the separator 456, film separation, suction separation, absorption separation, low-temperature separation, or the like can be applied. The gas that is separated and purified is stored in a filling container 458. The pressure of the gas stored in the filling container 458 is adjusted to be a predetermined pressure by a pressure controller 460 and then, supplied to an upper stream side in the mass flow controller 440 of the gas supply unit 436. Reusing the gas in such a manner can make it possible to reduce the consumption of a gas needed for the semi-amorphous semiconductor. In other words, by reusing a rare gas such as helium, consumption of all energy for manufacture of the photoelectric conversion device can be reduced, and the amount of carbon dioxide to be discharged can be reduced.

By dividing the waveguide for generating plasma into a plurality as shown in FIG. 15, the above-described microwave plasma CVD apparatus can respond flexibly to large-sized substrates of liquid crystal glass, having sizes of 300 mm×400 mm of the first generation, 550 mm×650 mm of the third generation, 730 mm×920 mm of the fourth generation, 1000 mm×1200 mm of the fifth generation, 2450 mm×1850 of the sixth generation, 1870 mm×2200 mm of the seventh generation, and 2000 mm×2400 mm of the eighth generation.

The semi-amorphous semiconductor film can be deposited uniformly over such a large-sized substrate, and an integrated photoelectric conversion device in which a plurality of unit cells are connected in series over a substrate can be formed. The outline of steps thereof is described below.

Figure 18A:
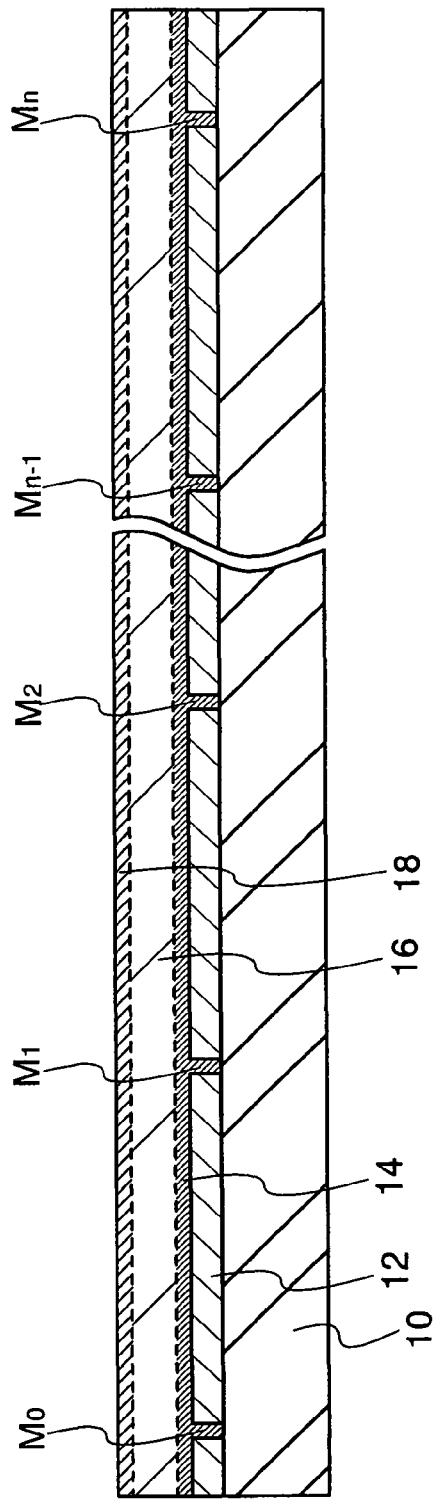
FIGS. 18A and 18B are cross-sectional views showing steps of manufacturing a photoelectric conversion device using a semi-amorphous semiconductor in a photoelectric conversion layer.

FIGS. 18A to 19B show steps of manufacturing a photoelectric conversion device in which a plurality of unit cells are provided over a substrate with an insulating surface and the unit cells are connected in series over the substrate. In FIG. 18A, a first electrode 12 is formed over a substrate 10. The first electrode 12 is separated into a plurality of insulated regions by openings $M_0$ to $M_n$. For formation of the openings $M_0$ to $M_n$, a conductive film is formed over an entire surface of the substrate 10, and the conductive film is directly processed, corresponding to opening patterns, by etching or using an energy beam such as laser light.

In a case where the conductive film, a semiconductor film, and an insulating film, which are formed over the substrate 10, are processed by laser processing, the processing is preferably performed by converging light by an optical system. This is because minute processing is made to be possible. In order to process a large-sized substrate efficiently as described above, long opening patterns are formed by converging laser light in a linear shape and performing irradiation with pulsed laser light at one or plural times.

FIG. 22 shows a structure of a laser irradiation device that processes such a thin film. As a laser oscillator to be a light source, an excimer laser (various excimer lasers such as XeCl, KrF, ArF, and the like) or a solid-state laser (various solid-state lasers such as YAG, $YVO_4$, YLF, and the like) can be used. In a case where a plurality of layers are stacked as in the photoelectric conversion device, an excimer layer for irradiation with an ultra-violet ray is preferably used. In order to control the processing depth, a femtosecond laser may be used. The processing depth can be controlled by setting an irradiation energy and a pulsed interval as appropriate.

The laser irradiation device shown in FIG. 22 has an optical system for processing a cross-sectional shape of a laser beam to have a linear shape on an irradiation surface. This optical system is designed so as to homogenize an energy of the laser beam on an irradiation surface as well as converting the cross-sectional shape of the laser beam into a linear shape.

FIG. 22 illustrates a side view and a top view, respectively, for describing a structure of the optical system. First, a side view of FIG. 22 is described.

A laser beam emitted from a laser oscillator 301 is divided in a direction orthogonal to the traveling direction of the laser beam (hereinafter, referred to as a vertical direction) by a cylindrical lens array 302a and a cylindrical lens array 302b. In FIG. 22, a structure in which the laser beam is divided into four beams is illustrated. The divided laser beams are converged by a cylindrical lens 304. The laser beams are unified by a cylindrical lens 305 on a substrate to be processed 309. Then, the traveling direction of the laser beam is bent by a mirror 307, and the laser beam is converged to have a linear shape on the substrate to be processed 309 on a stage 310 by a doublet cylindrical lens 308. The doublet cylindrical lens means a lens including two cylindrical lenses. Accordingly, energy homogenization in a width direction of the linear laser beam is achieved, and the length in the width direction is determined.

Next, the top view is illustrated. The laser beam emitted from the laser oscillator 301 is divided in a direction orthogonal to the traveling direction of the laser beam and in a direction orthogonal to the vertical direction (hereinafter, referred to as a horizontal direction) by the cylindrical lens array 303. FIG. 22 shows a structure in which the laser beam is divided into seven beams. Then, the laser beams are synthesized by the cylindrical lens 304. Accordingly, energy homogenization in a longitudinal direction of a linear laser beam is achieved, and a length thereof is determined. The linear laser beam processed in the above structure is moved into a width direction of the laser beam, whereby an entire substrate can be processed. In the case of forming an opening, operation of an output pulse of the laser and the stage 310 may be combined. In order to form one opening, a position to be irradiated with pulsed laser light may be irradiated with pulsed laser light at plural times.

In FIG. 18A, a photoelectric conversion layer is formed after the openings $M_0$ to $M_n$ are formed in the first electrode 12. FIG. 18A shows a case in which a p-type semiconductor layer 14, an i-type semiconductor layer 16, and an n-type semiconductor layer 18 are sequentially formed from the first electrode 12 side. As a structure of the photoelectric conversion layer, a structure shown in FIGS. 11A to 12B can also be employed instead of this structure. The photoelectric conversion layer is preferably formed with the use of a microwave plasma CVD apparatus of a multi-chamber system provided with a plurality of treatment chambers shown in FIG. 13. Use of this plasma CVD apparatus having such a structure can make it possible to form the photoelectric conversion layer in succession without being exposed to the atmospheric air.

Figure 18B:
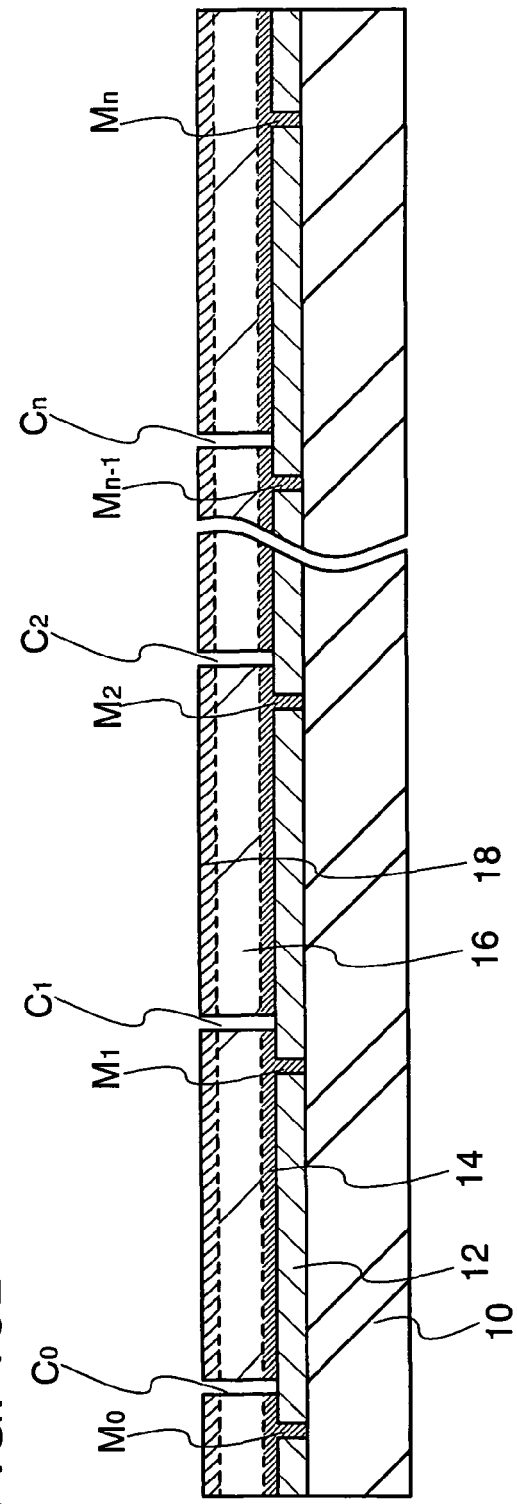

In FIG. 18B, openings $C_0$ to $C_n$ are formed in the photoelectric conversion layer. The openings $C_0$ to $C_n$ penetrate the p-type semiconductor layer 14, the i-type semiconductor layer 16, and the n-type semiconductor layer 18, and are formed so that a surface or a side face of the first electrode 12 is exposed. The openings $C_0$ to $C_n$ are formed so as to be adjacent to the openings $M_0$ to $M_n$, respectively, with a predetermined interval therebetween. This step can also be performed by laser processing.

Figure 19A:
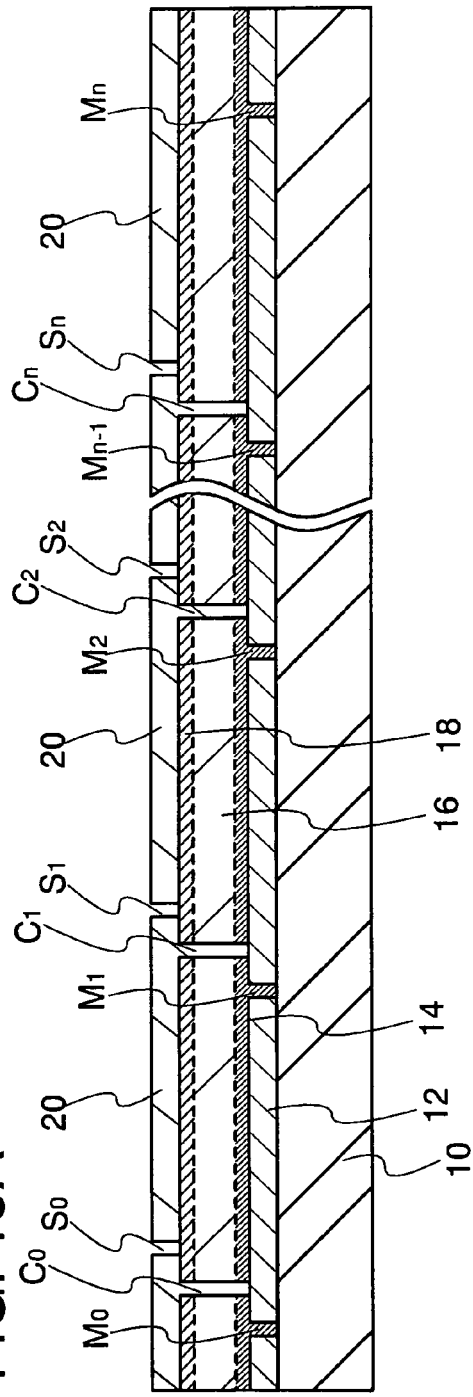
FIGS. 19A and 19B are cross-sectional views showing steps of manufacturing a photoelectric conversion device using a semi-amorphous semiconductor in a photoelectric conversion layer.

In FIG. 19A, a second electrode 20 is formed. The second electrode 20 is separated into a plurality of regions by openings $S_0$ to $S_n$. The second electrode 20 is electrically connected to the first electrode 12 through the openings $C_0$ to $C_n$. The openings $S_0$ to $S_n$ are formed to be adjacent to the openings $C_0$ to $C_n$, respectively, with a predetermined interval therebetween. This step can also be performed by laser processing. In the case of performing laser processing, selective processing becomes easy when chromium having a sublimation property is used for the second electrode 20.

Accordingly, a plurality of unit cells can be formed, each having the photoelectric conversion layer between the first electrode 12 and the second electrode 20. Each unit cell has an integrated structure in which the first electrode 12, the photoelectric conversion layer, and the second electrode 20, which are adjacent to each other, are connected in series.

Figure 19B:
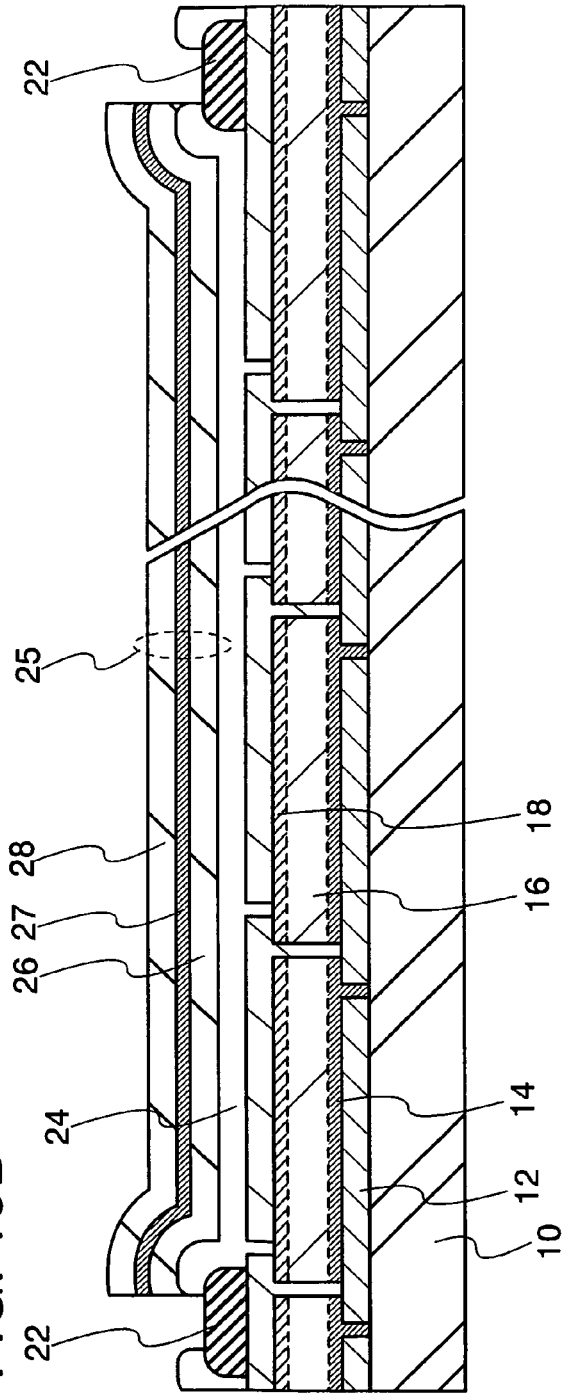

FIG. 19B shows a structure in which an extraction electrode 22 is provided over the second electrode 20 which is covered with a sealing resin layer 24, and a protective film 25 is provided thereover. The protective film 25 has a three-layer structure. An EVA (ethylene vinyl acetate) 26 is an adhesive layer that is melted by being heated. An aluminum foil 27 is a layer for moisture proof which prevents moisture vapor from entering from outside. An outer surface film 28 is formed using polyethylene terephtalate (PET) or the like. Accordingly, a photoelectric conversion device in which the plurality of unit cells are connected to each other over the substrate 10 can be obtained.

Figure 20A:
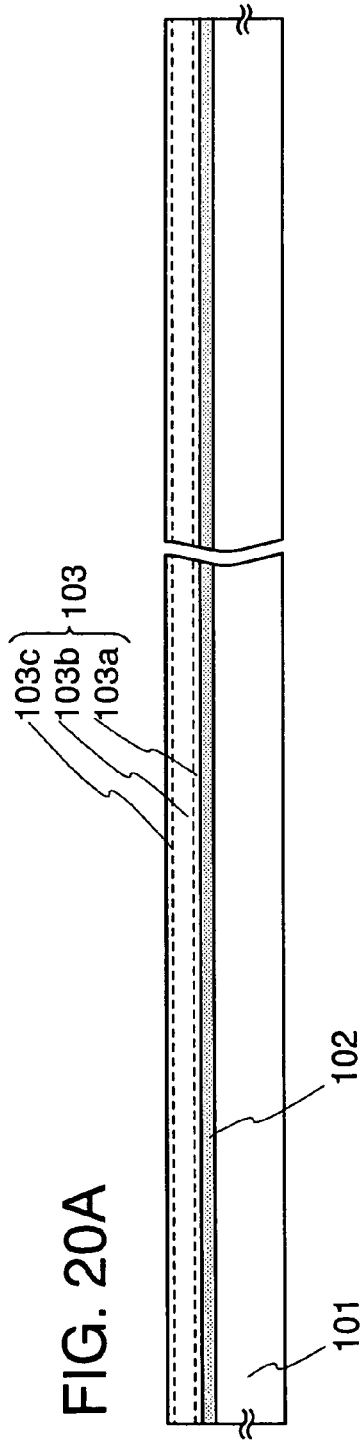
FIGS. 20A to 20C are cross-sectional views showing steps of manufacturing a photoelectric conversion device using a semi-amorphous semiconductor in a photoelectric conversion layer.

FIGS. 20A to 21 show steps for manufacturing another photoelectric conversion device. In FIG. 20A, a light-transmitting electrode layer 102 is provided over a substrate 101. Alternatively, a substrate provided with a light-transmitting electrode layer 102 is prepared. The light-transmitting electrode layer 102 is formed using an indium tin oxide alloy (ITO), zinc oxide (ZnO), tin oxide ($SnO_2$), an ITO-ZnO alloy, or the like, similarly to that of Embodiment Mode 1.

Further, the light-transmitting electrode layer 102 can be formed using a conductive composition including a conductive high molecule (also referred to as conductive polymer), similarly to Embodiment Mode 1.

Further, similarly to Embodiment Mode 1, a conductive composition used in the light-transmitting electrode layer 102 is dissolved in water or an organic solvent (e.g., an alcohol-based solvent, a ketone-based solvent, an ester-based solvent, a hydrocarbon-based solvent, an aromatic-based solvent), whereby a thin film which serves as a light-transmitting electrode layer can be formed by a wet process.

Further, similarly to Embodiment Mode 1, the light-transmitting electrode layer 102 can be formed using a composite light-transmitting electrode material including a hole-transporting organic compound and a metal oxide which shows an electron accepting property with respect to the hole-transporting organic compound.

Similarly to Embodiment Mode 1, in terms of lowering resistance of the light-transmitting electrode layer 102, an ITO film is suitable. However, if an ITO film is exposed to a plasma atmosphere containing hydrogen in a case of forming a semi-amorphous semiconductor layer thereover by a conventional high-frequency plasma CVD method, a light-transmitting property of the ITO film is deteriorated because of reduction. On the contrary, by a microwave plasma CVD method according to this embodiment mode, deterioration of an electrode material can be suppressed because the electrode temperature is low.

A photoelectric conversion layer 103 is formed using a semi-amorphous semiconductor manufactured by the aforementioned microwave plasma CVD method. A typical example of a semi-amorphous semiconductor is a semi-amorphous semiconductor manufactured by using a $SiH_4$ gas as a raw material, and in addition, a semi-amorphous silicon-germanium semiconductor or a semi-amorphous silicon-carbide semiconductor is applied. The photoelectric conversion layer 103 includes a semiconductor junction. By a microwave plasma CVD method according to this embodiment mode, damage in each junction interface is suppressed because the electrode temperature is low, and a photoelectric conversion layer having a favorable semiconductor junction can be formed.

FIG. 20A shows an example of the photoelectric conversion layer 103 in which a p-type semiconductor layer 103a, an i-type semiconductor layer 103b, and an n-type semiconductor layer 103c are stacked from the light-transmitting electrode layer 102 side. The thickness of the photoelectric conversion layer is 0.5 to 10 µm, preferably, 1 to 5 µm. In particular, the thickness of the p-type semiconductor layer 103a can be 10 to 20 nm, and the thickness of the n-type semiconductor layer 103c can be 20 to 60 nm.

Treatment for improving crystallinity by irradiating the semi-amorphous semiconductor layers with laser light may be performed, similarly to Embodiment Mode 1, in a state where the p-type semiconductor layer 103a, the i-type semiconductor layer 103b, and the n-type semiconductor layer 103c are stacked, or a state where the p-type semiconductor layer 103a and the i-type semiconductor layer 103b are stacked.

When a PIN junction is formed using such a semi-amorphous semiconductor material, an open circuit voltage of about 0.4 to 1 V can be obtained. When a stacked structure in which a plurality of photoelectric conversion layers are stacked (also referred to as a tandem structure) is provided by using this PIN junction as one unit of the photoelectric conversion layer, the open circuit voltage can be increased.

Figure 20B:
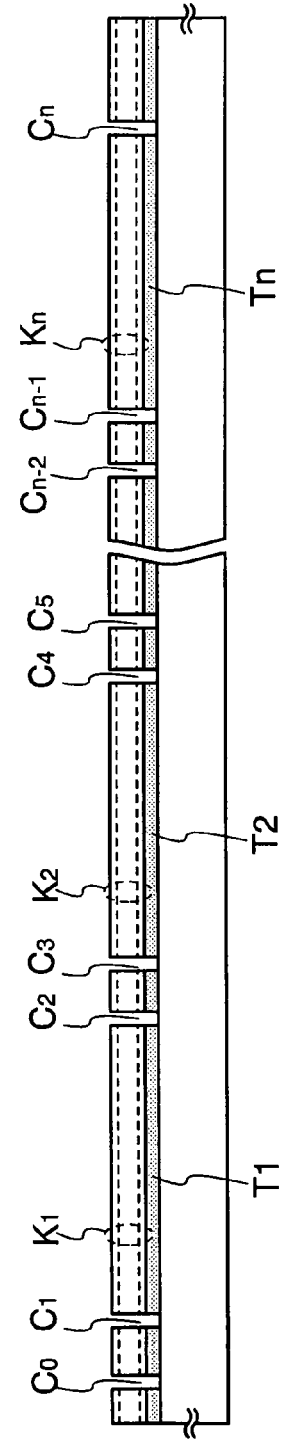

As shown in FIG. 20B, in order to form a plurality of unit cells over the same substrate, openings $C_0$ to $C_n$ penetrating the photoelectric conversion layer 103 and the light-transmitting electrode layer 102 are formed by a laser processing method. The openings $C_0, C_2, C_4, \ldots, C_{n-2}$, and $C_n$ are openings for insulating separation and provided for forming unit cells, and the openings $C_1, C_3, C_5, \ldots, C_{n-1}$ are openings for forming connection between the light-transmitting electrode and a rear electrode. By performing laser processing in a state where the light-transmitting electrode layer 102 and the photoelectric conversion layer 103 are stacked, separation of the light-transmitting electrode layer from the substrate in processing can be prevented.

Figure 20C:
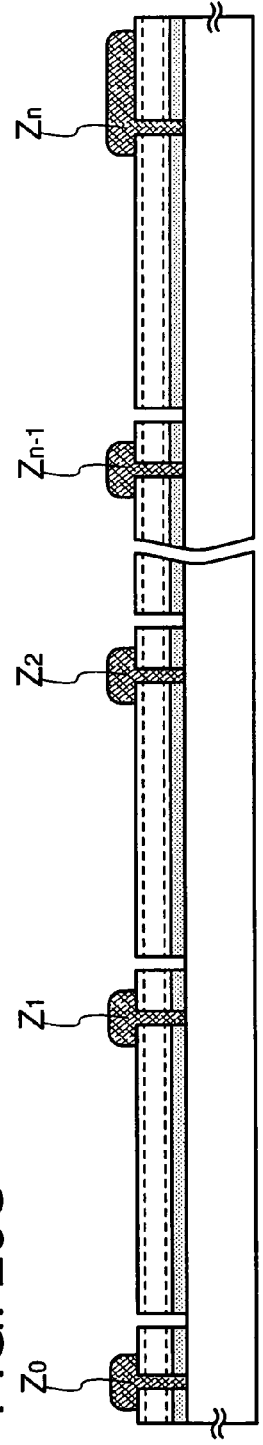

Accordingly, the light-transmitting electrode layer 102 is divided into light-transmitting electrodes $T_1$ to $T_n$ and the photoelectric conversion layer 103 is divided into $K_1$ to $K_n$. Then, as shown in FIG. 20C, the openings $C_0, C_2, C_4, \ldots, C_{n-2}$, and $C_n$ are filled, and insulating resin layers $Z_0$ to $Z_n$ covering upper end portions of the openings $C_0, C_2, C_4, \ldots, C_{n-2}$, and $C_n$, respectively, are formed. The insulating resin layers $Z_0$ to $Z_n$ may be formed using a resin material having an insulating property such as an acrylic-based resin, a phenol-based resin, an epoxy-based resin, or a polyimide-based resin by a screen printing method. For example, insulating resin patterns are formed by a screen printing method so that the openings $C_0, C_2, C_4, \ldots, C_{n-2}$, and $C_n$ are filled using a resin composition in which cyclohexane, isophorone, high resistance carbon black, aerosil, a dispersing agent, a defoaming agent, and a leveling agent are mixed with a phenoxy resin. After the printing patterns are formed, thermal hardening is performed in an oven for 20 minutes at 160° C. to obtain the insulating resin layers $Z_0$ to $Z_n$.

Next, rear electrodes $E_0$ to $E_n$ shown in FIG. 21 are formed. The rear electrodes $E_0$ to $E_n$ are formed of a conductive material. In this case, the rear electrodes $E_0$ to $E_n$ may be formed of aluminum, silver, molybdenum, titanium, chromium, or the like by a sputtering method or a vacuum evaporation method. Alternatively, the rear electrodes $E_0$ to $E_n$ can be formed using a conductive resin material. In a case where the rear electrodes $E_0$ to $E_n$ are formed using a conductive resin material, predetermined patterns may be directly formed by a screen printing method, an ink-jet method (droplet discharge method), a dispenser method, or the like. As a conductive composition, a composition containing a particle of metal as its main component, such as Ag (silver), Au (gold), Cu (copper), W (tungsten), or Al (aluminum), can be used. In a case where a photoelectric conversion device is manufactured using a large-sized substrate, it is preferable that resistance of the rear electrodes $E_0$ to $E_n$ be lowered. Thus, a composition in which a conductive particle of gold, silver, or copper, which has low resistance, is dissolved or dispersed in a solvent is preferably used as a main material of the conductive composition. Further preferably, silver or copper, which has low resistance, may be used. In order to fill the openings $C_1$, $C_3$, $C_5, \ldots, C_{n-1}$, which are subjected to laser processing, with a conductive material sufficiently, a nanopaste with a grain size of 5 to 10 nm which is an average size of a conductive particle may be used.

Alternatively, the rear electrodes $E_0$ to $E_n$ may be formed by forming a composition by being discharged. The composition contains a particle formed of a conductive material whose periphery is covered with another conductive material. For example, as a particle formed of Cu whose periphery is covered with Ag, a conductive particle provided with a buffer layer formed of Ni or NiB (nickel boron) between Cu and Ag may be used. A solvent corresponds to an organic solvent like esters such as butyl acetate, alcohols such as isopropyl alcohol, or acetone. The surface tension and its viscosity are appropriately adjusted by controlling concentration of a solution and adding a surface active agent or the like.

A diameter of a nozzle used for an ink-jet method is preferably set to be 0.02 to 100 μm (more preferably, 30 μm or less), and the amount of discharge of a composition discharged from the nozzle is preferably set to be 0.001 to 100 pl (more preferably, 10 pl or less). Although the ink-jet method has two types that are an on-demand type and a continuous type, both types may be used. Furthermore, a nozzle used for an ink-jet method has a piezoelectric method utilizing a property in which a piezoelectric substance is transformed by voltage application and a heating method by which a composition is boiled by a heater provided in the nozzle to be discharged, and both methods may be used. It is preferable that a distance between an object to be processed and a discharging opening of the nozzle be as short as possible in order to drop a droplet on a desired place. The distance is preferably set to be approximately 0.1 to 3 mm (more preferably 1 mm or less). One of the nozzle and the object to be processed moves while keeping the relative distance between the nozzle and the object to be processed to draw a desired pattern.

A step of discharging the conductive composition may be performed under a reduced pressure because the solvent of the composition is volatilized while the composition is discharged and reaches the object to be processed, and thus, subsequent steps of drying and baking can be omitted or shortened. In addition, by actively using a gas in which 10 to 30% of oxygen in a partial pressure ratio is mixed in a baking step of a composition containing a conductive material, resistivity of a conductive film forming the rear electrodes $E_0$ to $E_n$ can be reduced, and the conductive film can be thinned and planarized.

After the composition is discharged, one or both of drying step and baking step are performed under a normal pressure or a reduced pressure by laser light irradiation, rapid thermal annealing, heating using a heating furnace, or the like. For example, both of drying and baking are heat treatment steps, and drying is performed at 100° C. for 3 minutes and baking is performed at 200 to 350° C. for 15 to 120 minutes. Through this step, fusion and welding are accelerated by hardening and shrinking a peripheral resin, after the solvent in the composition is volatilized or the dispersant is chemically removed. This step is performed under an oxygen atmosphere, a nitrogen atmosphere, or the atmospheric air. However, an oxygen atmosphere in which a solvent in which a metal element is dissolved or dispersed is easily removed is preferable.

Nanopaste has a conductive particle having a grain diameter of 5 to 10 nm dispersed or dissolved in an organic solvent, and dispersant and a thermal curing resin which is referred to as a binder are also included. A binder has a function of preventing crack or uneven baking during baking. By a drying step or a baking step, evaporation of the organic solvent, decomposition removal of dispersant, and hardening shrinking by the binder are concurrently proceed; accordingly, nanoparticles are fused and/or welded to each other to be cured. In this case, the nanoparticles grow to be several tens nm to hundred and several tens nm. Adjacent growing particles are fused and/or welded to each other to be linked, thereby forming a metal hormogone. On the other hand, most of remaining organic constituents (about 80 to 90%) are pushed out of the metal hormogone; consequently, a conductive film containing the metal hormogone and a film including an organic constituent that covers an outer side thereof are formed. The film including organic constituent can be removed in baking a nanopaste under an atmosphere containing nitrogen and oxygen by reaction of oxygen contained in the atmospheric air and carbon, hydrogen or the like contained in a film formed of the organic constituent. In addition, in a case where oxygen is not contained in a baking atmosphere, the film including organic constituent can be removed by separately performing oxygen plasma treatment or the like. As described above, the organic constituent is removed by baking the nanopaste under an atmosphere containing nitrogen and oxygen or performing oxygen plasma treatment after drying; therefore, smoothing, thinning, and low resistance of a conductive film containing the remaining metal hormogone can be attempted. It is to be noted that, since a solvent in a composition is volatilized by discharging the composition containing a conductive material under a reduced pressure, time of subsequent heat treatment (drying or baking) can be shortened.

Accordingly, the rear electrodes $E_0$ to $E_n$ are to be contacted with the n-type semiconductor layer 103c of the photoelectric conversion layer. This contact is ohmic contact, and in order to further reduce contact resistance, the n-type semiconductor layer 103c may be formed using a semi-amorphous semiconductor, and the thickness thereof can be 30 to 80 nm.

The rear electrodes $E_0$ to $E_n$ are formed to be connected to the light-transmitting electrodes $T_1$ to $T_n$ in the openings $C_1$, $C_3$, $C_5, \ldots, C_{n-1}$, respectively. That is, the openings $C_1$, $C_3$, $C_5, \ldots, C_{n-1}$ are filled with the same material with that of the rear electrodes. In such a manner, the rear electrode $E_1$ is electrically connected to the light-transmitting electrode $T_2$, for example, and the rear electrode $E_{n-1}$ can be electrically connected to the light-transmitting electrode $T_n$. In other words, each of the rear electrodes can be electrically connected to the light-transmitting electrode adjacent to the rear electrode, and each of photoelectric conversion layers $K_1$ to $K_n$ can obtain electrical connection in series.

A sealing resin layer 104 is formed using an epoxy resin, an acrylic resin, or a silicone resin. In the sealing resin layer 104, openings 105 and 106 are formed over the rear electrodes $E_0$ and $E_n$, respectively, and the rear electrodes $E_0$ and $E_n$ can be connected to an external wiring in the openings 105 and 106.

Accordingly, a unit cell $U_n$ including the light-transmitting electrode $T_n$, the photoelectric conversion layer $K_n$, and the rear electrode $E_n$ is formed over the substrate 101, and the light-transmitting electrode $T_n$ is connected to the rear electrode $E_{n-1}$ adjacent to the light-transmitting electrode $T_n$ in the opening $C_{n-1}$, whereby n pieces of photoelectric conversion devices each of which has electrical connection in series can be manufactured. The rear electrode $E_0$ becomes an extraction electrode of the light-transmitting electrode $T_1$ in a unit cell $U_1$.

Figure 23A:
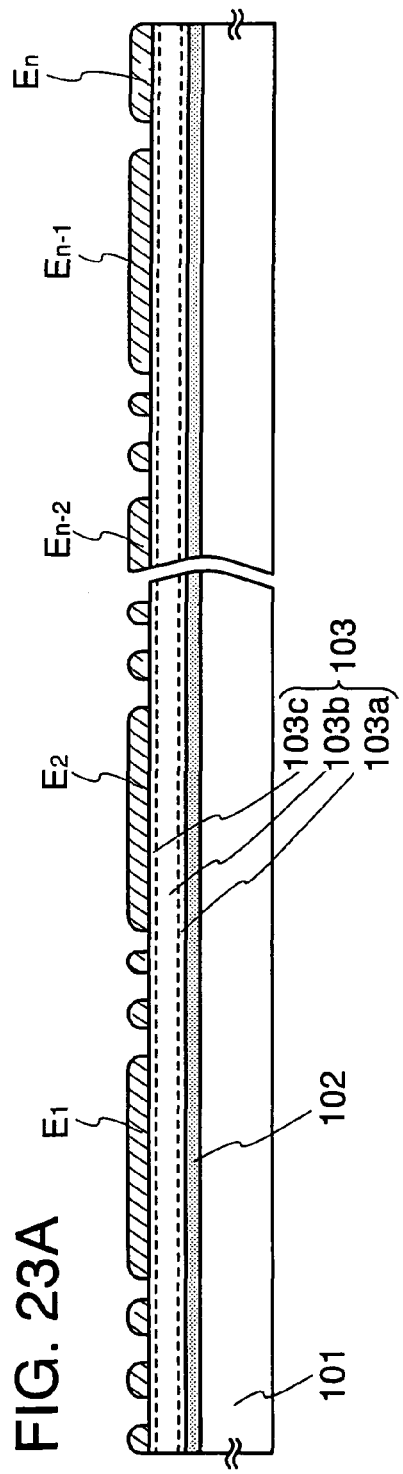
FIGS. 23A to 23C are cross-sectional views showing steps of manufacturing a photoelectric conversion device using a semi-amorphous semiconductor in a photoelectric conversion layer.
Figure 23B:
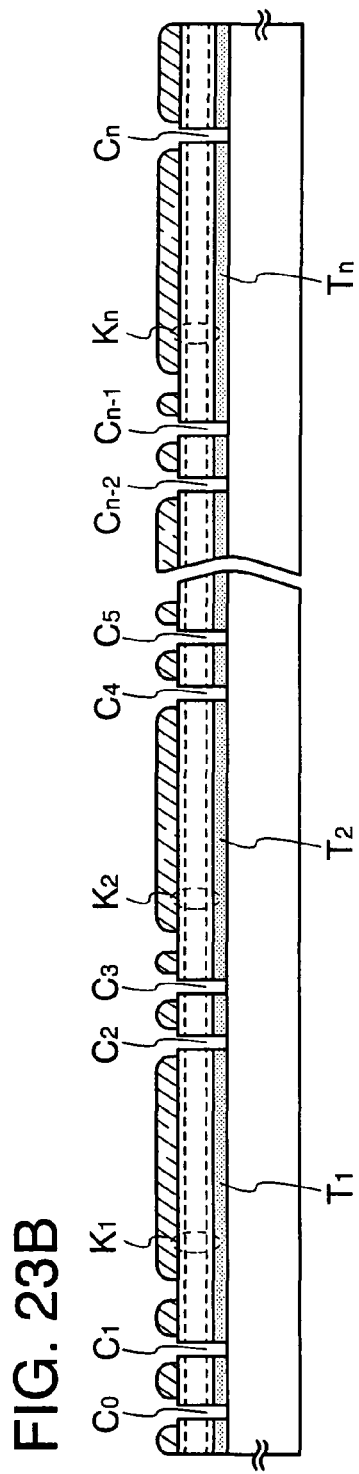
Figure 23C:
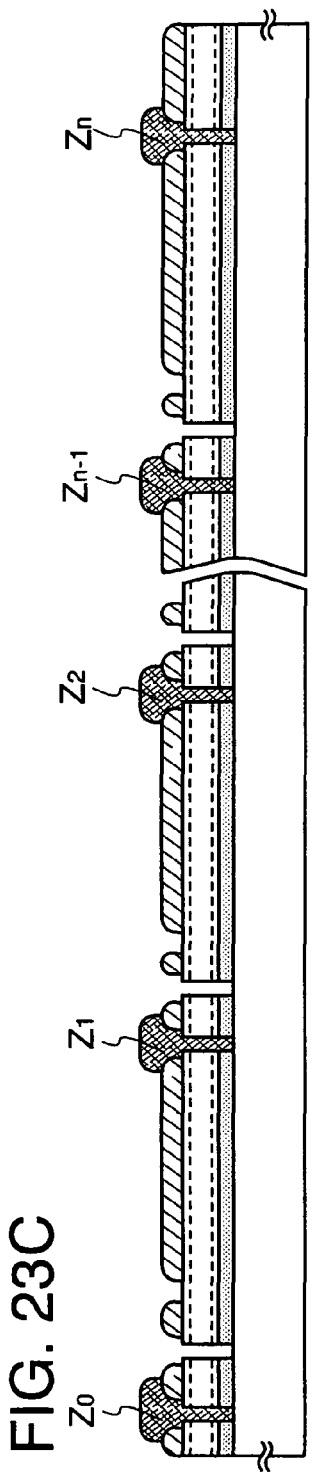
Figure 24:
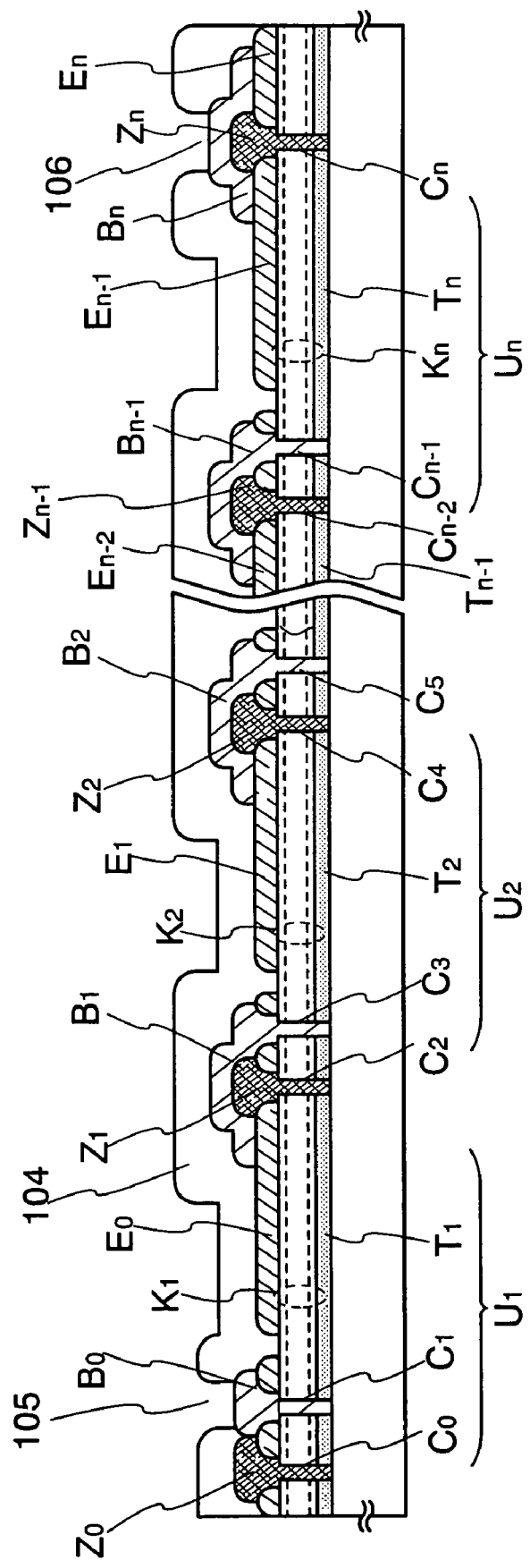
FIG. 24 is a cross-sectional view showing a step of manufacturing a photoelectric conversion device using a semi-amorphous semiconductor in a photoelectric conversion layer.

FIGS. 23A to 24 show another mode of a photoelectric conversion device. In FIG. 7A, a substrate 101, a light-transmitting electrode layer 102, and a photoelectric conversion layer 103 are formed similarly to the above-described thereof. Then, rear electrodes $E_1$ to $E_n$ are formed by a printing method over the photoelectric conversion layer 103.

As shown in FIG. 23B, openings $C_0$ to $C_n$ which penetrate the photoelectric conversion layer 103 and the light-transmitting electrode layer 102 are formed by a laser processing method. The openings $C_0$, $C_2$, $C_4$, . . . , $C_{n-2}$, and $C_n$ are openings for insulating and separating unit cells, and the openings $C_1$, $C_3$, $C_5$, . . . , $C_{n-1}$ are openings for forming connection between the light-transmitting electrode and the rear electrodes. In laser processing, residue may be left in the periphery of the openings. This residue is a spray of a processed material and undesirable because the spray heated up to a high temperature by laser light attaches to the surface of the photoelectric conversion layer 103 and damages the film. In order to prevent this, the rear electrodes are formed in accordance with patterns of the openings, and laser processing is performed; accordingly, at least damage to the photoelectric conversion layer 103 can be prevented.

The light-transmitting electrode layer 102 is divided into light-transmitting electrodes $T_1$ to $T_n$, and the photoelectric conversion layer 103 is divided into $K_1$ to $K_n$; thereafter, the openings $C_0$, $C_2$, $C_4$, . . . , $C_{n-2}$, and $C_n$ are filled as shown in FIG. 23C. Then, insulating resin layers $Z_0$ to $Z_n$ with which end portions of the openings $C_0$, $C_2$, $C_4$, . . . , $C_{n-2}$, and $C_n$, respectively are formed by a printing method such as a screen printing method.

Next, the openings $C_1$, $C_3$, $C_5$, . . . , $C_{n-1}$ are filled as shown in FIG. 24, and wirings $B_0$ to $B_n$ which are connected to the light-transmitting electrodes $T_1$ to $T_n$, respectively, are formed by a screen printing method. The wirings $B_0$ to $B_n$ are formed of the same material with that of the rear electrodes, and here, a thermosetting carbon paste is used. Note that the wiring $B_n$ is formed over the insulating resin layer $Z_n$ and serves as an extraction wiring. In such a manner, the rear electrode $E_0$ has electrical connection with the light-transmitting electrode $T_2$, for example, and the rear electrode $E_{n-2}$ can obtain electrical connection with the light-transmitting electrode $T_n$. In other words, each of the rear electrodes can be electrically connected to the light-transmitting electrode adjacent thereto, and each of the photoelectric conversion layers $K_1$ to $K_n$ can obtain electrical connection in series.

Lastly, a sealing resin layer 104 is formed by a printing method. In the sealing resin layer 104, openings 105 and 106 are formed over the wirings $B_0$ and $B_n$, respectively, and the wirings are connected to an external wiring in these openings. Accordingly, a unit cell $U_n$ including the light-transmitting electrode $T_n$, the photoelectric conversion layer $K_n$, and the rear electrode $E_{n-1}$ is formed over the substrate 101, and the light-transmitting electrode $T_n$ is connected to the rear electrode $E_{n-2}$ adjacent thereto through the opening $C_{n-1}$, whereby n pieces of photoelectric conversion devices each of which has electrical connection in series can be manufactured. Note that the wiring $B_0$ is to be an extraction electrode of the light-transmitting electrode $T_1$ in a unit cell $U_1$.

In the photoelectric conversion device according to the present invention, the photoelectric conversion layer is formed of a semi-amorphous semiconductor. Therefore, a photoelectric conversion device in which a rate of deterioration in characteristics by light deterioration is hardly presence can be obtained.

Figure 25:
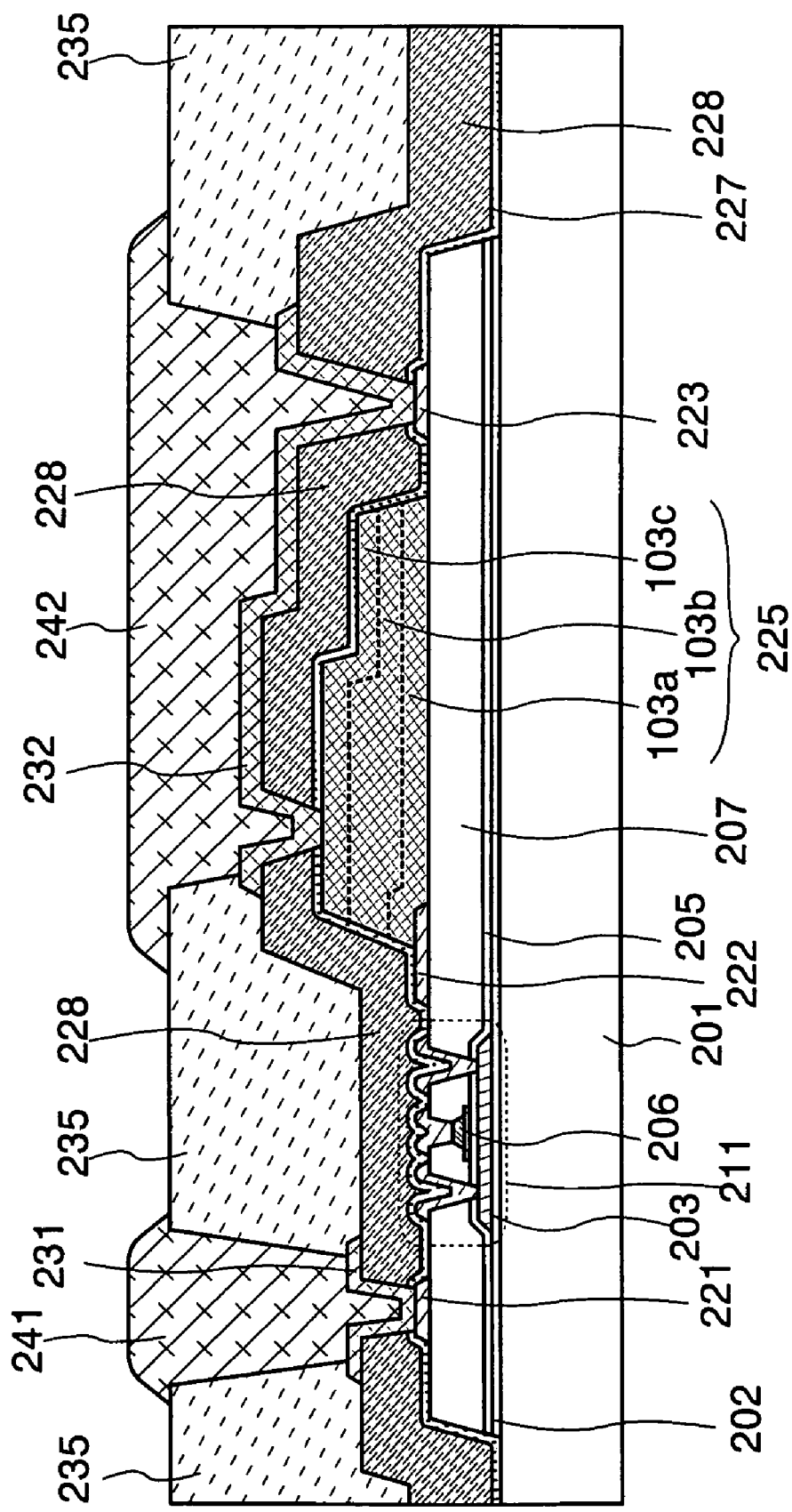
FIG. 25 is a cross-sectional view showing a light sensor device using a semi-amorphous semiconductor in a photoelectric conversion layer.

FIG. 25 shows an optical sensor device as another mode of a photoelectric conversion device. This optical sensor device has a photoelectric conversion layer 225 in a light receiving portion and is provided with a function in which an output by the photoelectric conversion layer 225 is amplified by an amplifier circuit including a thin film transistor 211 and then outputted. The photoelectric conversion layer 225 and the thin film transistor 211 are provided over a substrate 201. As the substrate 201, a substrate having a light-transmitting property, such as a glass substrate, a quartz substrate, or a ceramic substrate can be used.

An insulating layer 202 including one or more of silicon oxide, silicon nitride oxide, silicon nitride, and silicon oxynitride is provided over the substrate 201 by a sputtering method or a plasma CVD method. The insulating layer 202 is provided for stress relaxation and preventing impurity contaminant. A crystalline semiconductor layer 203 constituting the thin film transistor 211 is provided over the insulating layer 202. A gate insulating layer 205 and a gate electrode 206 are provided over the crystalline semiconductor layer 203, which forms the thin film transistor 211.

An interlayer insulating layer 207 is provided over the thin film transistor 211. The interlayer insulating layer 207 may be formed of a single insulating film or a stacked of insulating layers of different materials. A wiring electrically connected to a source region and a drain region of the thin film transistor 211 is formed over the interlayer insulating layer 207. In addition, over the interlayer insulating layer 207, an electrode 221, an electrode 222, and an electrode 223, each of which is formed using the same material and the same steps with those of the wiring, are formed. The electrodes 221 to 223 are formed using a metal film, e.g., a low resistance metal film. Such a low resistance metal film can be an aluminum alloy, pure aluminum, or the like. Further, a three-layer structure as a stacked structure of such a low resistance metal film and a refractory metal film may be employed, in which a titanium film, an aluminum film, and a titanium film are sequentially stacked. In stead of a stacked structure of the refractory metal film and the low resistance film, the electrodes 221 to 223 can be formed of a single conductive film. Such a single conductive film may be formed of a single film of an element selected from titanium, tungsten, tantalum, molybdenum, neodymium, cobalt, zirconium, zinc, ruthenium, rhodium, palladium, osmium, iridium, or platinum; a single film using an alloy material or a compound material containing the aforementioned element as its main component; or a single film using nitride of the aforementioned element, e.g., titanium nitride, tungsten nitride, tantalum nitride, or molybdenum nitride.

The interlayer insulating layer 207, the gate electrode layer 205, and the insulating layer 202 are subjected to etching processing so as to have end portions in a tapered shape. By processing the interlayer insulating layer 207, the gate insulating layer 205, and the insulating layer 202 to have end portions into a tapered shape, coverage with a protective layer 227 formed over these insulating layers becomes improved, and effect that moisture, impurities, and the like hardly intrude can be obtained.

A p-type semiconductor layer 103a, an i-type semiconductor layer 103b, and an n-type semiconductor layer 103c are formed over the interlayer insulating layer 207. Note that the p-type semiconductor layer 103a is at least partly contacted with the electrode 222. The p-type semiconductor layer 103a, the i-type semiconductor layer 103b, and the n-type semiconductor layer 103c are similar to those described in FIGS. 20A to 24. The protective layer 227 is formed of, for example, silicon nitride over the photoelectric conversion layer 225. The protective layer 227 can prevent moisture and impurities such as organic substances from being mixed into the thin film transistor 211 and the photoelectric conversion layer 225. An interlayer insulating layer 228 formed using an organic resin material such as polyimide or acryl is provided over the protective layer 227. An electrode 231 is provided over the interlayer insulating layer 228, which is electrically connected to the electrode 221. An electrode 232 is provided, which is electrically connected to an upper layer of the photoelectric conversion layer 225 (the n-type semiconductor layer 103c) and the electrode 223 through a contact hole in the interlayer insulating layer 228 and the protective layer 227. As the electrodes 231 and 232, tungsten, titanium, tantalum, silver, or the like can be used.

An interlayer insulating layer 235 is provided over the interlayer insulating layer 228 by a screen method or an ink-jet method, using an organic resin material such as an epoxy resin, polyimide, acryl, or a phenol resin. The interlayer insulating layer 235 is provided with the openings over the electrode 231 and the electrode 232. Over the interlayer insulating layer 235, an electrode 241 that is electrically connected to the electrode 231 and an electrode 242 that is electrically connected to the electrode 232 are provided by a printing method, for example, using a nickel paste.

Such a photoelectric conversion device serving as an optical sensor has a photoelectric conversion layer formed of a semi-amorphous semiconductor. Therefore, the photoelectric conversion device, in which characteristics are hardly reduced by light deterioration, can be obtained. In FIG. 25, the optical sensor device is shown in which the photoelectric conversion layer 225 is provided in the light receiving portion and an output by the photoelectric conversion layer is amplified by the amplifier circuit including the thin film transistor 211 and then outputted. However, if the structure according to the amplifier circuit is omitted, the device can be used as an optical sensor.

This application is based on Japanese Patent Application serial no. 2007-149795 filed in Japan Patent Office on Jun. 5, 2007 and Japanese Patent Application serial no. 2007-159570 filed in Japan Patent Office on Jun. 15, 2007 the entire contents of which are hereby incorporated by reference.

What is claimed is:

1. A method for manufacturing a photoelectric conversion device, comprising the steps of:
    providing a first susceptor, a first gas supply nozzle, and a second gas supply nozzle in a first treatment chamber, wherein the first gas supply nozzle is located closer to the first susceptor than the second gas supply nozzle is;
    providing a second susceptor, a third gas supply nozzle, and a fourth gas supply nozzle in a second treatment chamber wherein the third gas supply nozzle is located closer to the second susceptor than the fourth gas supply nozzle is;
    providing a first rotary pump connected to the first treatment chamber;
    providing a second rotary pump connected to the second treatment chamber;
    providing a gas purification circulator including a pressure controller and a separator, the gas purification circulator being connected to the first rotary pump;
    forming a first semi-amorphous semiconductor layer over a substrate by introducing a first gas and a second gas into the first treatment chamber in which the substrate is placed over the first susceptor and by introducing a microwave into the first treatment chamber through a slit provided for a first waveguide to generate plasma;
    transferring the substrate from the first treatment chamber to the second treatment chamber without exposing the substrate to an atmospheric air; and
    forming a second semi-amorphous semiconductor layer over the first semi-amorphous semiconductor layer by introducing a third gas and a fourth gas into the second treatment chamber in which the substrate is placed over the second susceptor, and by introducing a microwave into the second treatment chamber through a second slit provided for a second waveguide to generate plasma, whereby forming a photoelectric conversion layer including the first semi-amorphous semiconductor layer and the second semi-amorphous semiconductor layer,
    wherein the photoelectric conversion layer includes any one of a PI junction, an IN junction, and a PN junction,
    wherein the first gas is made to flow from the first gas supply nozzle, the second gas is made to flow from the second gas supply nozzle, the third gas is made to flow from the third gas supply nozzle, and the fourth gas is made to flow from the fourth gas supply nozzle,
    wherein each of the first gas and the third gas comprises a semiconductor material gas and each of the second gas and the fourth gas comprises a helium, and
    wherein the gas purification circulator is configured to collect and purify the helium exhausted from the first rotary pump so as to reuse the helium.

2. The method for manufacturing a photoelectric conversion device according to claim 1, wherein the first waveguide is disposed in approximately parallel to and opposed to the substrate.

3. The method for manufacturing a photoelectric conversion device according to claim 1, wherein the plasma has an electron density of greater than or equal to $1\times10^{11}$ cm$^{-3}$ and less than or equal to $1\times10^{13}$ cm$^{-3}$ and an electron temperature of greater than or equal to 0.2 eV and less than or equal to 2.0 eV.

4. The method for manufacturing a photoelectric conversion device according to claim 1,
    wherein the second gas further comprises hydrogen and/or a rare gas.

5. The method for a manufacturing a photoelectric conversion device according to claim 1,
    wherein a pressure for generating the plasma is in the range of $3\times10^2$ Pa to $1\times10^5$ Pa, and
    wherein the microwave is discharged with pulse of 1 to 100 kHz and an electromagnetic wave with frequency between 1 GHz and 5 GHz.

6. The method for manufacturing a photoelectric conversion device according to claim 1,
    wherein the gas purification circulator is further connected to the second treatment chamber and is configured to collect and purify the helium exhausted from the second rotary pump so as to reuse the helium.

7. The method for manufacturing a photoelectric conversion device according to claim 1,
    wherein the separator is configured to separate the semiconductor material gas and the helium which are exhausted from the first rotary pump, and
    wherein the pressure controller is configured to adjust the separated helium to a predetermined pressure.

8. A method for manufacturing a photoelectric conversion device comprising the steps of:
providing a susceptor, a first gas supply nozzle, and a second gas supply nozzle in a first treatment chamber, wherein the first gas supply nozzle is located closer to the susceptor than the second gas supply nozzle is;
providing a first rotary pump connected to the first treatment chamber;
providing a second rotary pump connected to a second treatment chamber;
providing a gas purification circulator including a pressure controller and a separator, the gas purification circulator being connected to the first rotary pump;
forming a first semi-amorphous semiconductor layer over a substrate by introducing a first gas and a second gas into the first treatment chamber in which the substrate is placed over the susceptor, and by introducing a microwave into the first treatment chamber through a first slit provided for a first waveguide to generate plasma;
transferring the substrate from the first treatment chamber to the second treatment chamber without exposing the substrate to an atmospheric air;
forming a second semi-amorphous semiconductor layer over the first semi-amorphous semiconductor layer by introducing a first reaction gas into the second treatment chamber in which the substrate is placed, and by introducing a microwave into the second treatment chamber through a second slit provided for a second waveguide to generate the plasma;
transferring the substrate from the second treatment chamber to a third treatment chamber without exposing the substrate to an atmospheric air; and
forming a third semi-amorphous semiconductor layer over the second semi-amorphous semiconductor layer by introducing a second reaction gas into the third treatment chamber in which the substrate is placed, and by introducing a microwave into the third treatment chamber through a third slit provided for a third waveguide to generate the plasma, whereby forming a photoelectric conversion layer including the first semi-amorphous semiconductor layer, the second semi-amorphous semiconductor layer, and the third semi-amorphous semiconductor layer,
wherein the photoelectric conversion layer includes any one of a PIN junction, a PI junction, an IN junction, and a PN junction,
wherein the first gas is made to flow from the first gas supply nozzle, and the second gas is made to flow from the second gas supply nozzle,
wherein the first gas comprises a semiconductor material gas and the second gas comprises a helium, and
wherein the gas purification circulator is configured to collect and purify the helium exhausted from the first rotary pump so as to reuse the helium.

9. The method for manufacturing a photoelectric conversion device according to claim 8, wherein each of the first waveguide, the second waveguide, and the third waveguide is disposed in approximately parallel to and opposed to the substrate.

10. The method for manufacturing a photoelectric conversion device according to claim 8, wherein the plasma has an electron density of greater than or equal to $1\times10^{11}$ cm$^{-3}$ and less than or equal to $1\times10^{13}$ cm$^{-3}$ and an electron temperature of greater than or equal to 0.2 eV and less than or equal to 2.0 eV.

11. The method for manufacturing a photoelectric conversion device according to claim 8, wherein each of the first reaction gas and the second reaction gas comprises helium.

12. The method for manufacturing a photoelectric conversion device according to claim 8,
wherein each of the first reaction gas and the second reaction gas comprises hydrogen and/or a rare gas and a semiconductor material gas.

13. The method for a manufacturing a photoelectric conversion device according to claim 8,
wherein a pressure for generating the plasma is in the range of $3\times10^2$ Pa to $1\times10^5$ Pa, and
wherein the microwave is discharged with pulse of 1 to 100 kHz and an electromagnetic wave with frequency between 1 GHz and 5 GHz.

14. The method for a manufacturing a photoelectric conversion device according to claim 8,
wherein the gas purification circulator is further connected to the second treatment chamber and is configured to collect and purify the helium exhausted from the second rotary pump so as to reuse the helium.

15. The method for a manufacturing a photoelectric conversion device according to claim 8,
wherein the separator is configured to separate the semiconductor material gas and the helium which are exhausted from the first rotary pump, and
wherein the pressure controller is configured to adjust the separated helium to a predetermined pressure.

16. A method for manufacturing a photoelectric conversion device comprising the steps of:
providing a first susceptor, a first gas supply nozzle, and a second gas supply nozzle in a first treatment chamber wherein the first gas supply nozzle is located closer to the first susceptor than the second gas supply nozzle is;
providing a second susceptor, a third gas supply nozzle, and a fourth gas supply nozzle in a second treatment chamber wherein the third gas supply nozzle is located closer to the second susceptor than the fourth gas supply nozzle is;
providing a third susceptor, a fifth gas supply nozzle, and a sixth gas supply nozzle in a third treatment chamber wherein the fifth gas supply nozzle is located closer to the third susceptor than the sixth gas supply nozzle is;
providing a first rotary pump connected to the first treatment chamber;
providing a second rotary pump connected to the second treatment chamber;
providing a third rotary pump connected to the third treatment chamber;
providing a gas purification circulator including a pressure controller and a separator, the gas purification circulator being connected to the first rotary pump;
forming a first semi-amorphous semiconductor layer over a substrate by introducing a first gas and a second gas into the first treatment chamber in which the substrate is placed over the first susceptor, and by introducing a microwave into the first treatment chamber through a first slit provided for a first waveguide to generate plasma;
transferring the substrate from the first treatment chamber to the second treatment chamber without exposing the substrate to an atmospheric air;
forming a second semi-amorphous semiconductor layer over the first semi-amorphous semiconductor layer by introducing a third gas and a fourth gas into the second treatment chamber in which the substrate is placed over the second susceptor, and by introducing a microwave into the second treatment chamber through a second slit provided for a second waveguide to generate the plasma;

transferring the substrate from the second treatment chamber to the third treatment chamber without exposing the substrate to an atmospheric air; and forming a third semi-amorphous semiconductor layer over the second semi-amorphous semiconductor layer by introducing a fifth gas and a sixth gas into the third treatment chamber in which the substrate is placed over the third susceptor, and by introducing a microwave into the third treatment chamber through a third slit provided for a third waveguide to generate the plasma, whereby forming a photoelectric conversion layer including the first semi-amorphous semiconductor layer, the second semi-amorphous semiconductor layer, and the third semi-amorphous semiconductor layer, wherein the photoelectric conversion layer includes any one of a PIN junction, a PI junction, an IN junction, and a PN junction, wherein the first gas is made to flow from the first gas supply nozzle, the second gas is made to flow from the second gas supply nozzle, the third gas is made to flow from the third gas supply nozzle, the fourth gas is made to flow from the fourth gas supply nozzle, the fifth gas is made to flow from the fifth gas supply nozzle, the sixth gas is made to flow from the sixth gas supply nozzle, wherein each of the first gas, the third gas, and the fifth gas comprises a semiconductor material gas, wherein each of the second gas, the fourth gas, and the sixth gas comprises a helium, and wherein the gas purification circulator is configured to collect and purify the helium exhausted from the first rotary pump so as to reuse the helium.

17. The method for manufacturing a photoelectric conversion device according to claim 16, wherein each of the first waveguide, the second waveguide, and the third waveguide is disposed in approximately parallel to and opposed to the substrate.

18. The method for manufacturing a photoelectric conversion device according to claim 16, wherein the plasma has an electron density of greater than or equal to $1\times10^{11}$ cm$^{-3}$ and less than or equal to $1\times10^{13}$ cm$^{-3}$ and an electron temperature of greater than or equal to 0.2 eV and less than or equal to 2.0 eV.

19. The method for a manufacturing a photoelectric conversion device according to claim 16, wherein a pressure for generating the plasma is in the range of $3\times10^2$ Pa to $1\times10^5$ Pa, and wherein the microwave is discharged with pulse of 1 to 100 kHz and an electromagnetic wave with frequency between 1 GHz and 5 GHz.

20. The method for a manufacturing a photoelectric conversion device according to claim 16, wherein the gas purification circulator is further connected to the second treatment chamber and the third treatment chamber, and is configured to collect and purify the helium exhausted from the second rotary pump and the third rotary pump so as to reuse the helium.

21. The method for a manufacturing a photoelectric conversion device according to claim 16, wherein the separator is configured to separate the semiconductor material gas and the helium which are exhausted from the first rotary pump, and wherein the pressure controller is configured to adjust the separated helium to a predetermined pressure.

* * * * *